(12) United States Patent
Masuoka et al.

(10) Patent No.: US 10,651,180 B2
(45) Date of Patent: May 12, 2020

(54) METHOD FOR PRODUCING PILLAR-SHAPED SEMICONDUCTOR DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/203,982

(22) Filed: Nov. 29, 2018

(65) Prior Publication Data
US 2019/0109140 A1  Apr. 11, 2019

Related U.S. Application Data

(63) Continuation-in-part of application No. PCT/JP2016/089129, filed on Dec. 28, 2016.

(30) Foreign Application Priority Data

Jun. 1, 2016  (WO) ............... PCT/JP2016/66151

(51) Int. Cl.
*H01L 27/11* (2006.01)
*H01L 23/485* (2006.01)
(Continued)

(52) U.S. Cl.
CPC ...... *H01L 27/1104* (2013.01); *H01L 21/2018* (2013.01); *H01L 21/2253* (2013.01);
(Continued)

(58) Field of Classification Search
CPC ........... H01L 29/7827; H01L 29/66666; H01L 29/7926; H01L 27/11582; H01L 27/2454;
(Continued)

(56) References Cited

U.S. PATENT DOCUMENTS

| 8,975,689 B1* | 3/2015 | Kim | H01L 29/66666 |
| | | | 257/329 |
| 2002/0034856 A1* | 3/2002 | Jeon | H01L 21/28525 |
| | | | 438/381 |

(Continued)

FOREIGN PATENT DOCUMENTS

CN  101946332 A  1/2011
EP  2244304 A1  10/2010
(Continued)

OTHER PUBLICATIONS

Takato et al., IEEE Transaction on Electron Devices, vol. 38, No. 3, pp. 573-578 (1991).

(Continued)

*Primary Examiner* — Zandra V Smith
*Assistant Examiner* — John M Parker
(74) *Attorney, Agent, or Firm* — Brinks Gilson & Lione

(57) ABSTRACT

A method for producing a pillar-shaped semiconductor device includes steps of forming, on the side surface of an $N^+$ layer (38b) of the top portion of a Si pillar (6b) and the side surface of the top portion of a W layer (43a), ring-shaped $SiO_2$ layers and an AlO layer (51) in outer peripheral portions surrounding the ring-shaped $SiO_2$ layers; etching the ring-shaped $SiO_2$ layers through the AlO layer serving as a mask, to form ring-shaped contact holes; and filling the contact holes with W layers (52a, 52b), to form ring-shaped W layers (52a, 52d) being in contact with the side surface of the $N^+$ layer (38b) and the side surface of the top portion of the W layer (43a), and having constant widths in plan view.

12 Claims, 52 Drawing Sheets

(51) Int. Cl.

| | | |
|---|---|---|
| H01L 21/768 | (2006.01) | |
| H01L 23/522 | (2006.01) | |
| H01L 29/423 | (2006.01) | |
| H01L 29/66 | (2006.01) | |
| H01L 29/78 | (2006.01) | |
| H01L 21/20 | (2006.01) | |
| H01L 21/225 | (2006.01) | |
| H01L 21/28 | (2006.01) | |
| H01L 21/285 | (2006.01) | |
| H01L 21/76 | (2006.01) | |
| H01L 21/764 | (2006.01) | |
| H01L 21/822 | (2006.01) | |
| H01L 21/8234 | (2006.01) | |
| H01L 23/528 | (2006.01) | |
| H01L 29/04 | (2006.01) | |
| H01L 29/06 | (2006.01) | |
| H01L 29/10 | (2006.01) | |
| H01L 29/40 | (2006.01) | |
| H01L 29/417 | (2006.01) | |
| H01L 29/49 | (2006.01) | |
| H01L 21/308 | (2006.01) | |
| H01L 21/8238 | (2006.01) | |
| H01L 29/16 | (2006.01) | |
| H01L 29/51 | (2006.01) | |
| H01L 21/311 | (2006.01) | |
| H01L 23/532 | (2006.01) | |

(52) U.S. Cl.
CPC ...... *H01L 21/2255* (2013.01); *H01L 21/2257* (2013.01); *H01L 21/28088* (2013.01); *H01L 21/28114* (2013.01); *H01L 21/28123* (2013.01); *H01L 21/28132* (2013.01); *H01L 21/28518* (2013.01); *H01L 21/28568* (2013.01); *H01L 21/3086* (2013.01); *H01L 21/76* (2013.01); *H01L 21/764* (2013.01); *H01L 21/7684* (2013.01); *H01L 21/76831* (2013.01); *H01L 21/76834* (2013.01); *H01L 21/76877* (2013.01); *H01L 21/76897* (2013.01); *H01L 21/76898* (2013.01); *H01L 21/8221* (2013.01); *H01L 21/823418* (2013.01); *H01L 21/823456* (2013.01); *H01L 21/823475* (2013.01); *H01L 21/823481* (2013.01); *H01L 21/823487* (2013.01); *H01L 21/823807* (2013.01); *H01L 21/823828* (2013.01); *H01L 21/823871* (2013.01); *H01L 23/485* (2013.01); *H01L 23/528* (2013.01); *H01L 23/5226* (2013.01); *H01L 23/5283* (2013.01); *H01L 27/11* (2013.01); *H01L 29/04* (2013.01); *H01L 29/0657* (2013.01); *H01L 29/1037* (2013.01); *H01L 29/16* (2013.01); *H01L 29/401* (2013.01); *H01L 29/41741* (2013.01); *H01L 29/4238* (2013.01); *H01L 29/42356* (2013.01); *H01L 29/42376* (2013.01); *H01L 29/4966* (2013.01); *H01L 29/517* (2013.01); *H01L 29/66666* (2013.01); *H01L 29/66787* (2013.01); *H01L 29/7827* (2013.01); *H01L 21/31111* (2013.01); *H01L 21/31116* (2013.01); *H01L 21/76805* (2013.01); *H01L 21/76829* (2013.01); *H01L 23/53257* (2013.01); *H01L 29/665* (2013.01)

(58) Field of Classification Search
CPC .......... H01L 27/10885; H01L 27/1104; H01L 21/823487
See application file for complete search history.

(56) References Cited

U.S. PATENT DOCUMENTS

| | | | |
|---|---|---|---|
| 2003/0136978 A1* | 7/2003 | Takaura | H01L 27/0688 257/210 |
| 2009/0148992 A1 | 6/2009 | Oyu | |
| 2010/0187600 A1 | 7/2010 | Masuoka et al. | |
| 2010/0219483 A1* | 9/2010 | Masuoka | H01L 27/0207 257/369 |
| 2012/0299068 A1 | 11/2012 | Masuoka et al. | |
| 2013/0056698 A1* | 3/2013 | Satoh | H01L 27/101 257/2 |
| 2015/0017767 A1* | 1/2015 | Masuoka | H01L 27/092 438/211 |
| 2015/0069582 A1* | 3/2015 | Kim | H01L 29/06 257/622 |
| 2015/0091081 A1* | 4/2015 | Suh | H01L 29/7827 257/329 |
| 2015/0123193 A1* | 5/2015 | Masuoka | H01L 21/2251 257/329 |
| 2015/0357438 A1* | 12/2015 | Masuoka | H01L 21/324 438/268 |
| 2016/0155842 A1* | 6/2016 | Masuoka | H01L 21/225 257/329 |
| 2016/0204251 A1* | 7/2016 | Masuoka | H01L 21/823814 257/329 |

FOREIGN PATENT DOCUMENTS

| | | |
|---|---|---|
| JP | H02-188966 A | 7/1990 |
| JP | H03-024753 A | 2/1991 |
| JP | 2003-224211 A | 8/2003 |
| JP | 2007-525004 A | 8/2007 |
| JP | 2009-141110 A | 6/2009 |
| JP | 2010-040538 A | 2/2010 |
| JP | 2011-029469 A | 2/2011 |
| JP | 2012-209340 A | 10/2012 |
| JP | 5356260 B2 | 12/2013 |
| JP | 2014013922 A | 1/2014 |
| JP | 2014-053424 A | 3/2014 |
| JP | 2014-220543 A | 11/2014 |
| JP | 5692884 B | 4/2015 |
| JP | 2015188115 A | 10/2015 |
| WO | WO 2009/102062 A1 | 8/2009 |
| WO | WO 2009/110048 A1 | 9/2009 |
| WO | WO 2014/184993 A1 | 11/2014 |

OTHER PUBLICATIONS

Shibata et al., "A New Field Isolation Technology for High Density MOS LSI", Japanese Journal of Applied Physics, vol. 18, pp. 263-267 (1979).

Morimoto et al., "Self-Aligned Nickel-Mono-Silicide Technology for High-Speed Deep Submicrometer Logic CMOS ULSI" IEEE Transaction on Electron Devices, vol. 42, No. 5, pp. 915-922 (1995).

Gandhi, et al., "Vertical Si-Nanowire n-Type Tunneling FETs With Low Subthreshold Swing(<50mV/decade) at Room Temperature", IEEE Electron Device Letter, vol. 32, No. 4, pp. 437-439(2011).

International Preliminary Report on Patentability for PCT/JP2015/060763, dated Oct. 19, 2017, pp. 1-5.

International Preliminary Report on Patentability for PCT/JP2015/069689, dated Jan. 11, 2018, pp. 1-6.

International Preliminary Report on Patentability for PCT/JP2015/078776, dated Oct. 12, 2017, pp. 1-6.

International Preliminary Report on Patentability for PCT/JP2016/066151, dated Apr. 19, 2018, pp. 1-7.

International Search Report for PCT/JP2016/089129, dated Feb. 21, 2017, pp. 1-9.

International Preliminary Report on Patentability for Application No. PCT/JP2016/089129, dated Dec. 13, 2018, pp. 1-7.

\* cited by examiner

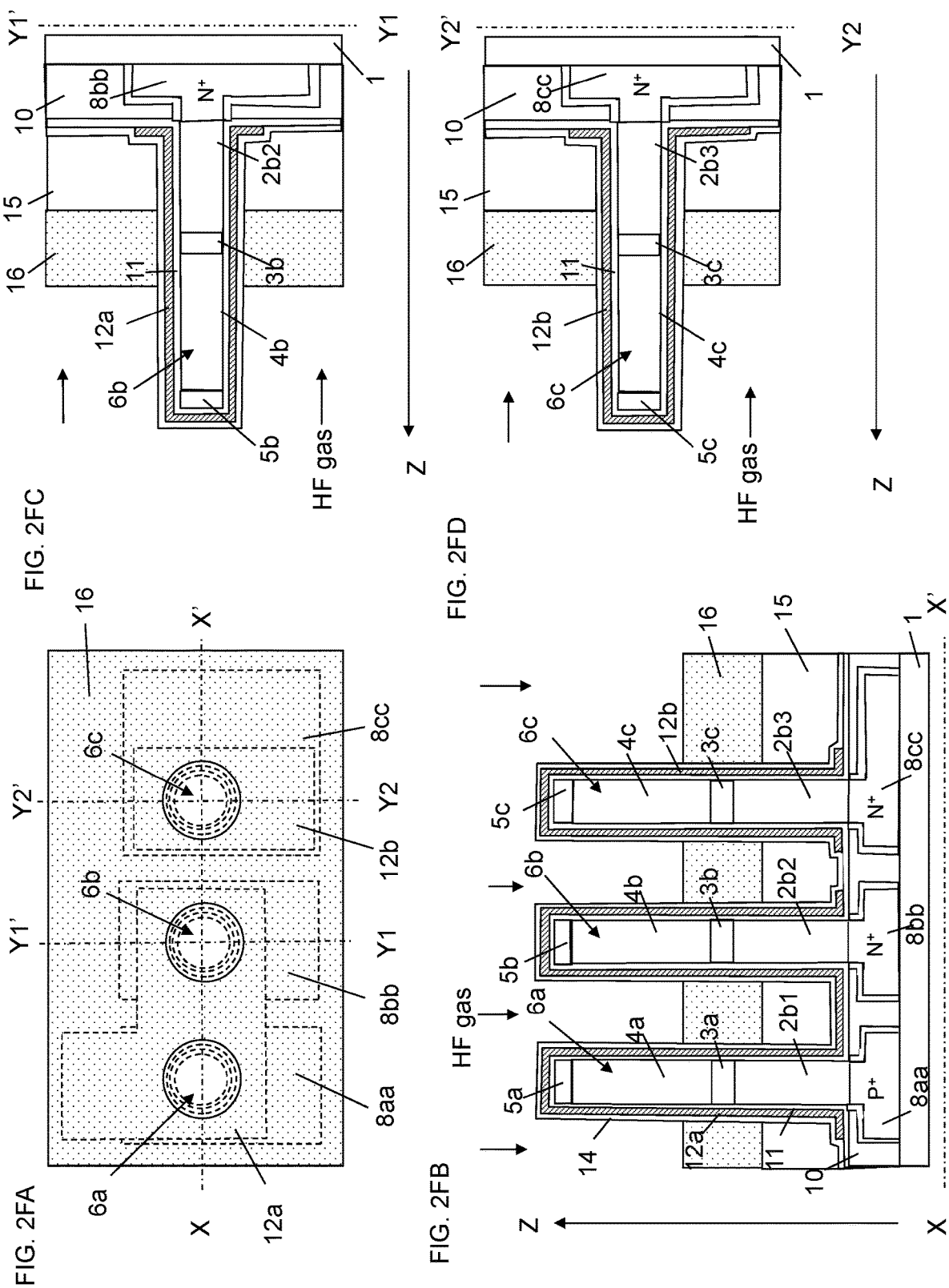

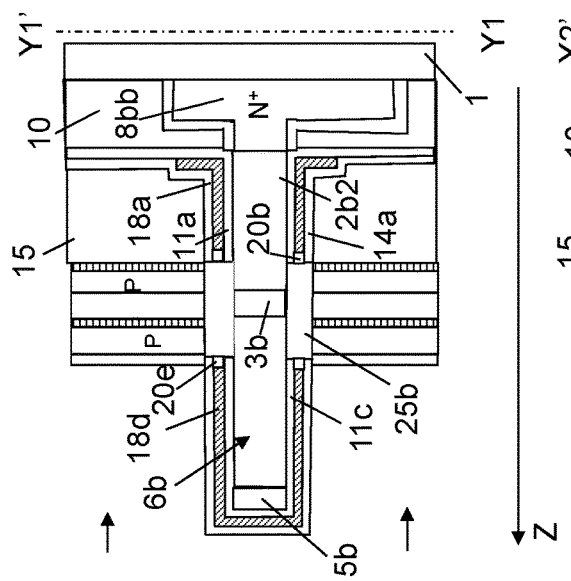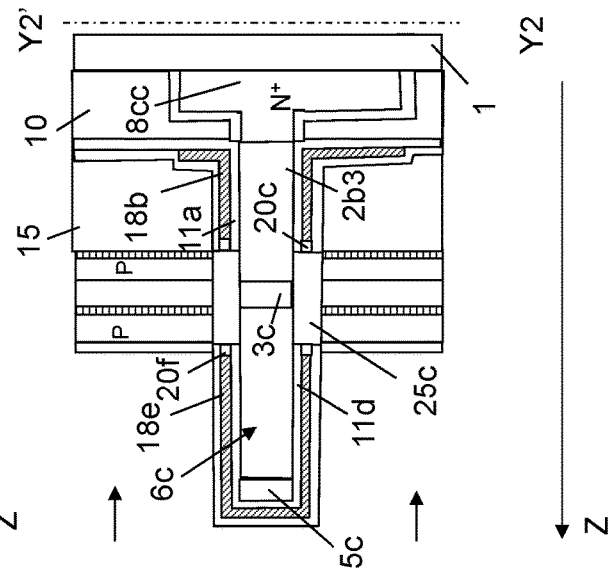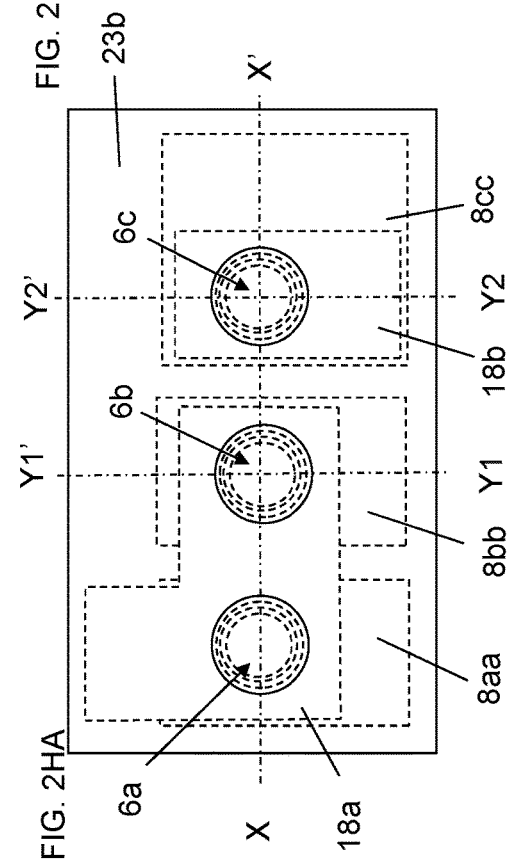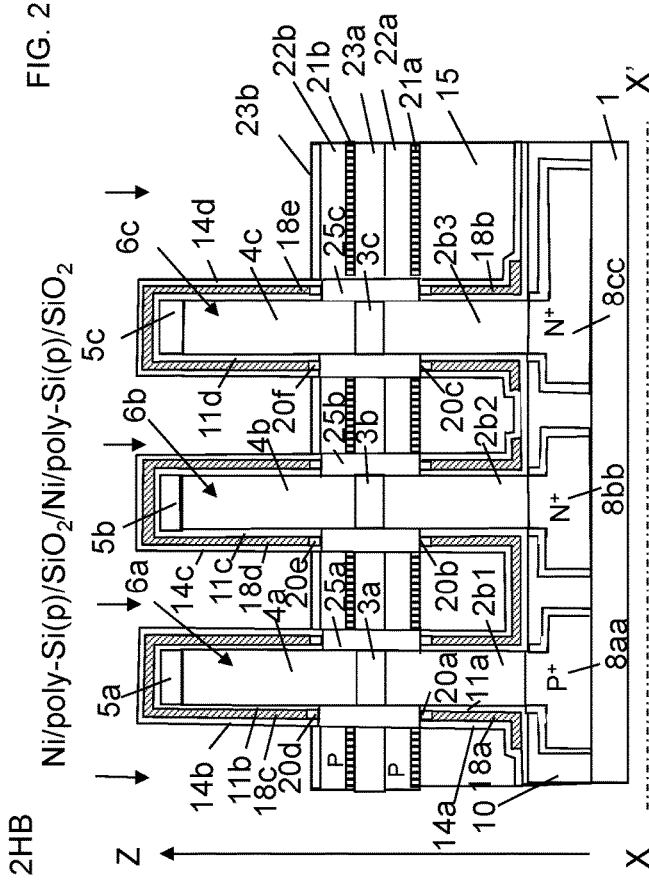

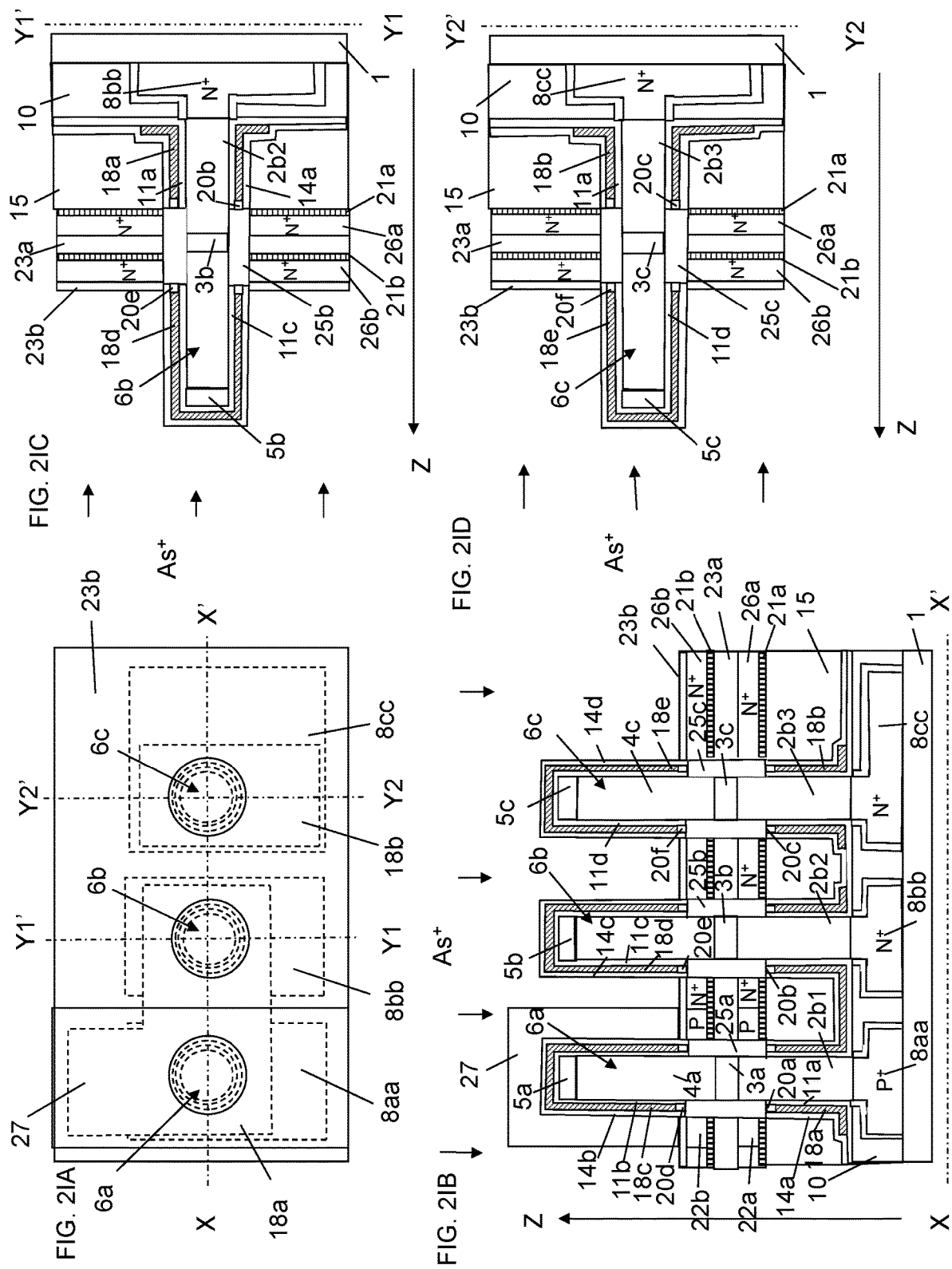

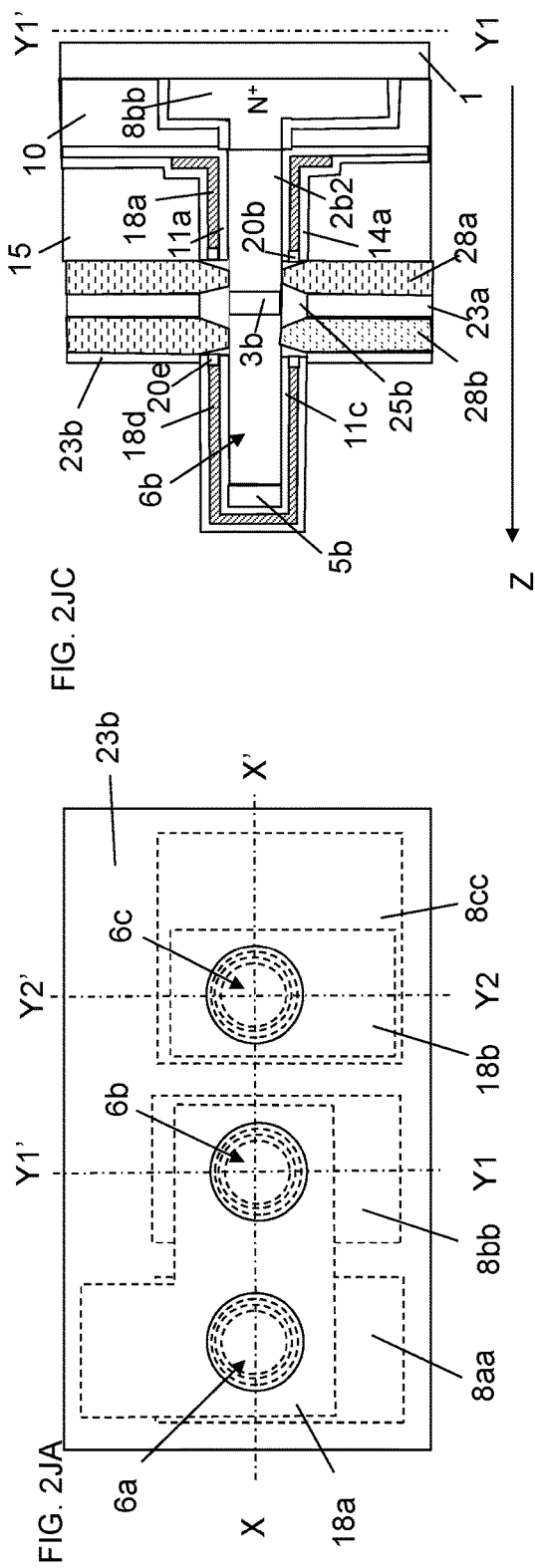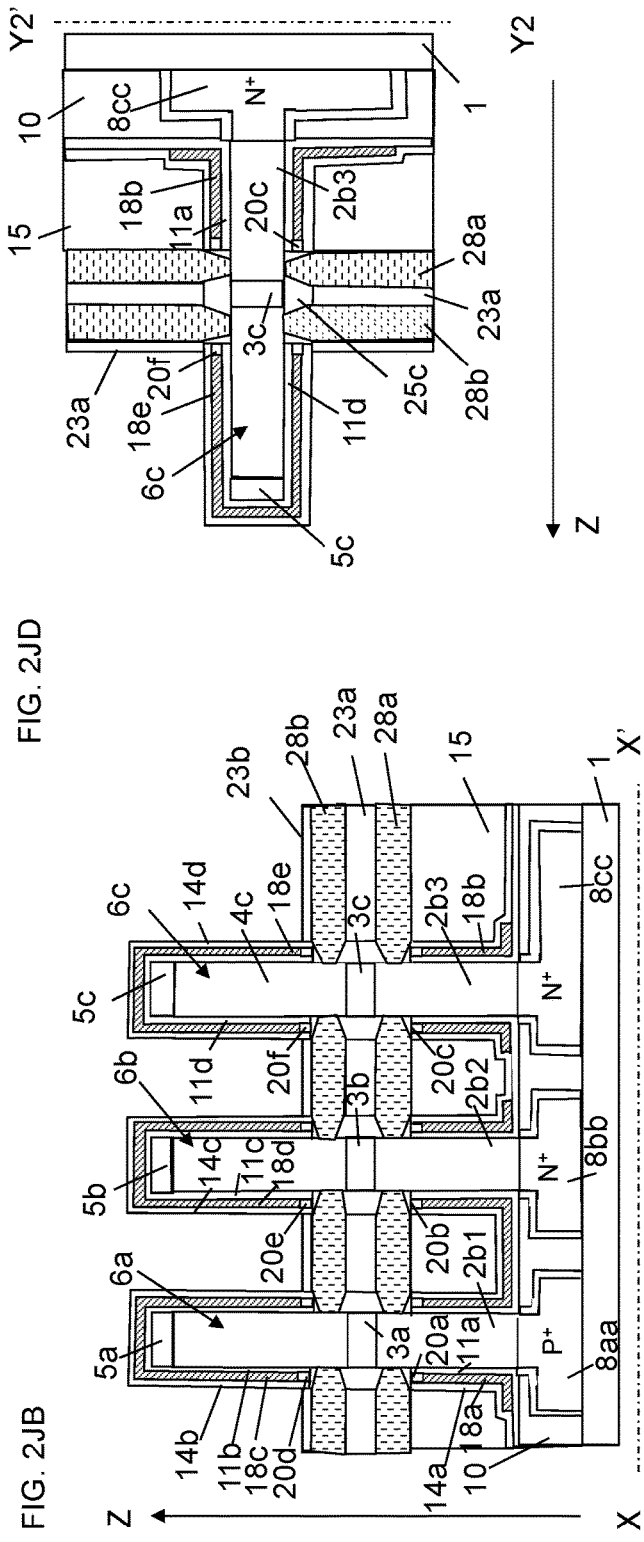

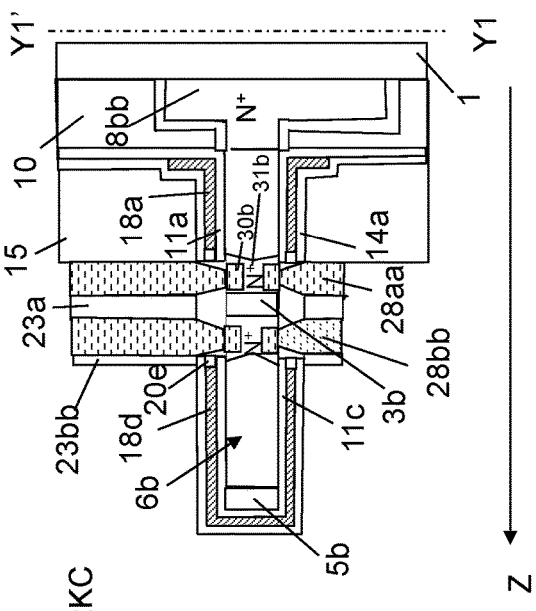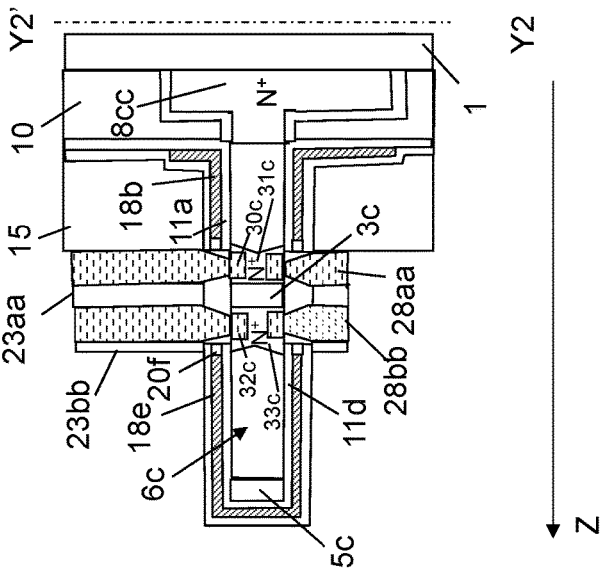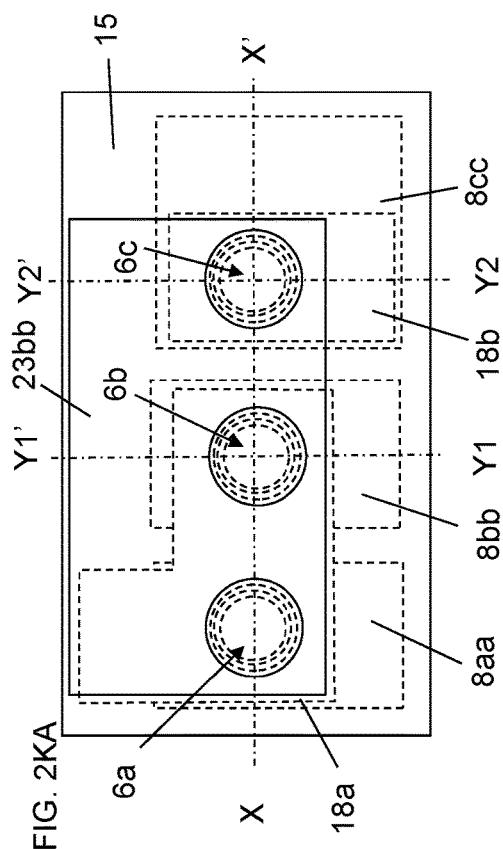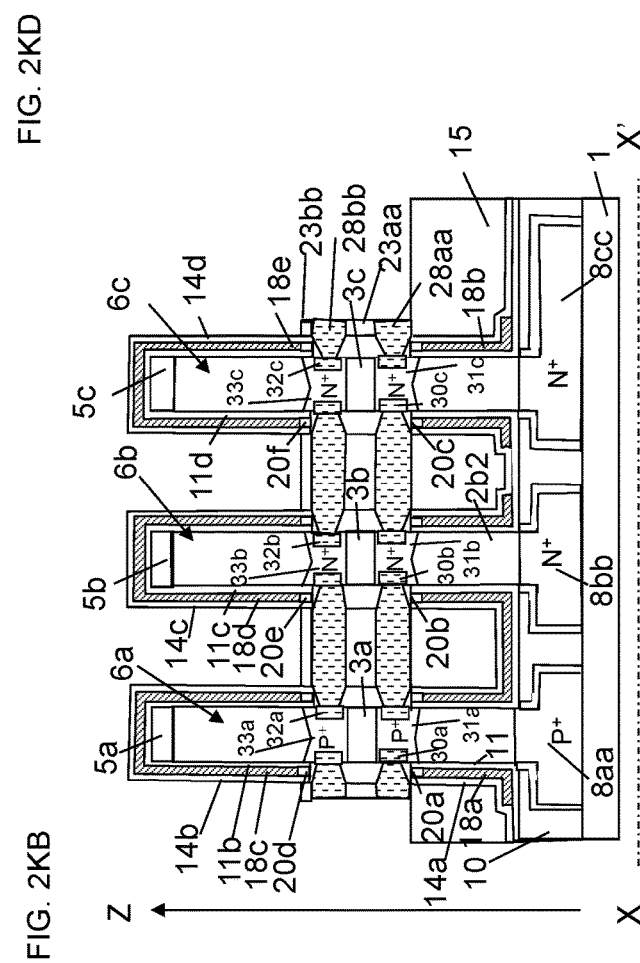
FIG. 2KA
FIG. 2KB
FIG. 2KC
FIG. 2KD

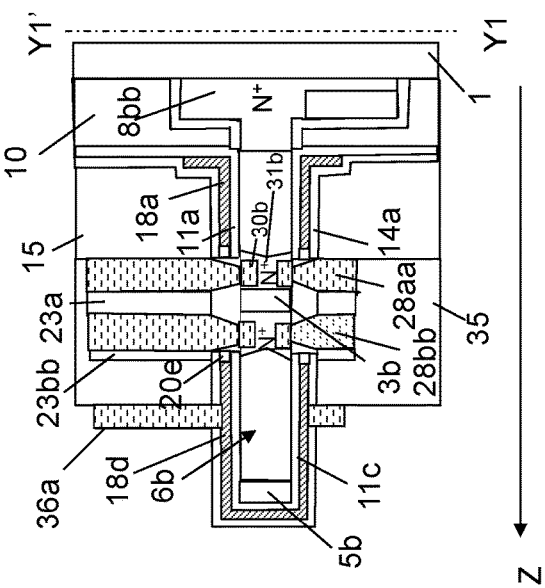
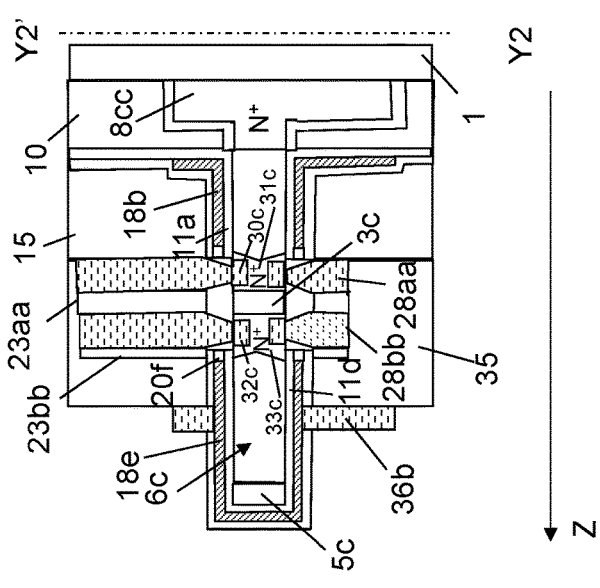
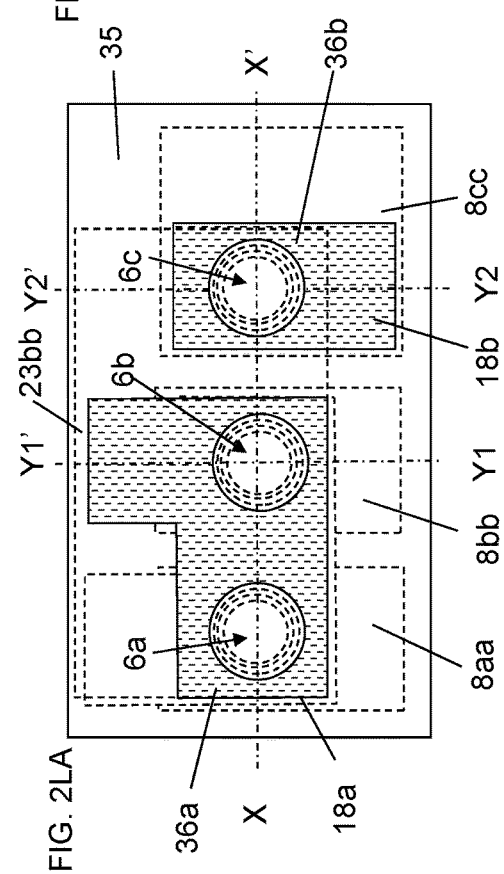
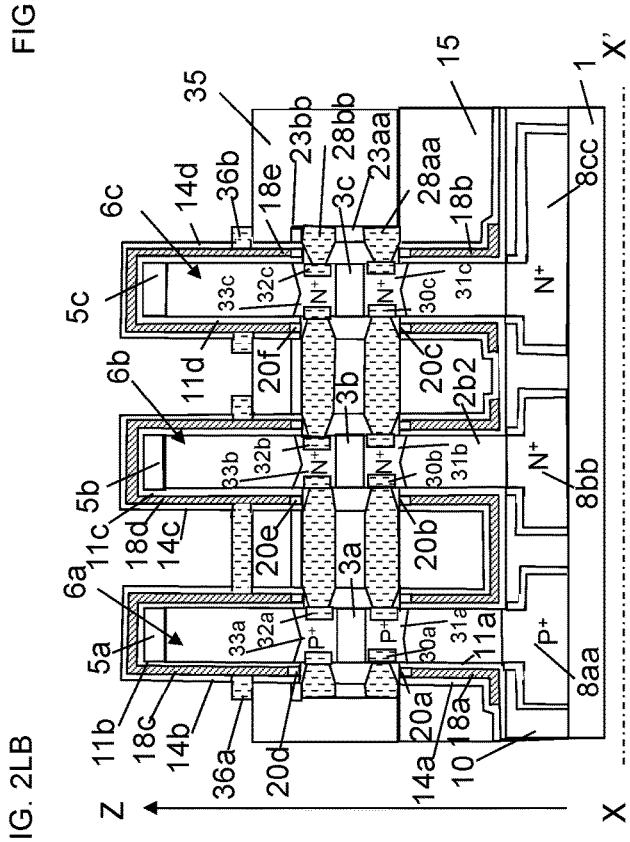
FIG. 2LA
FIG. 2LB
FIG. 2LC
FIG. 2LD

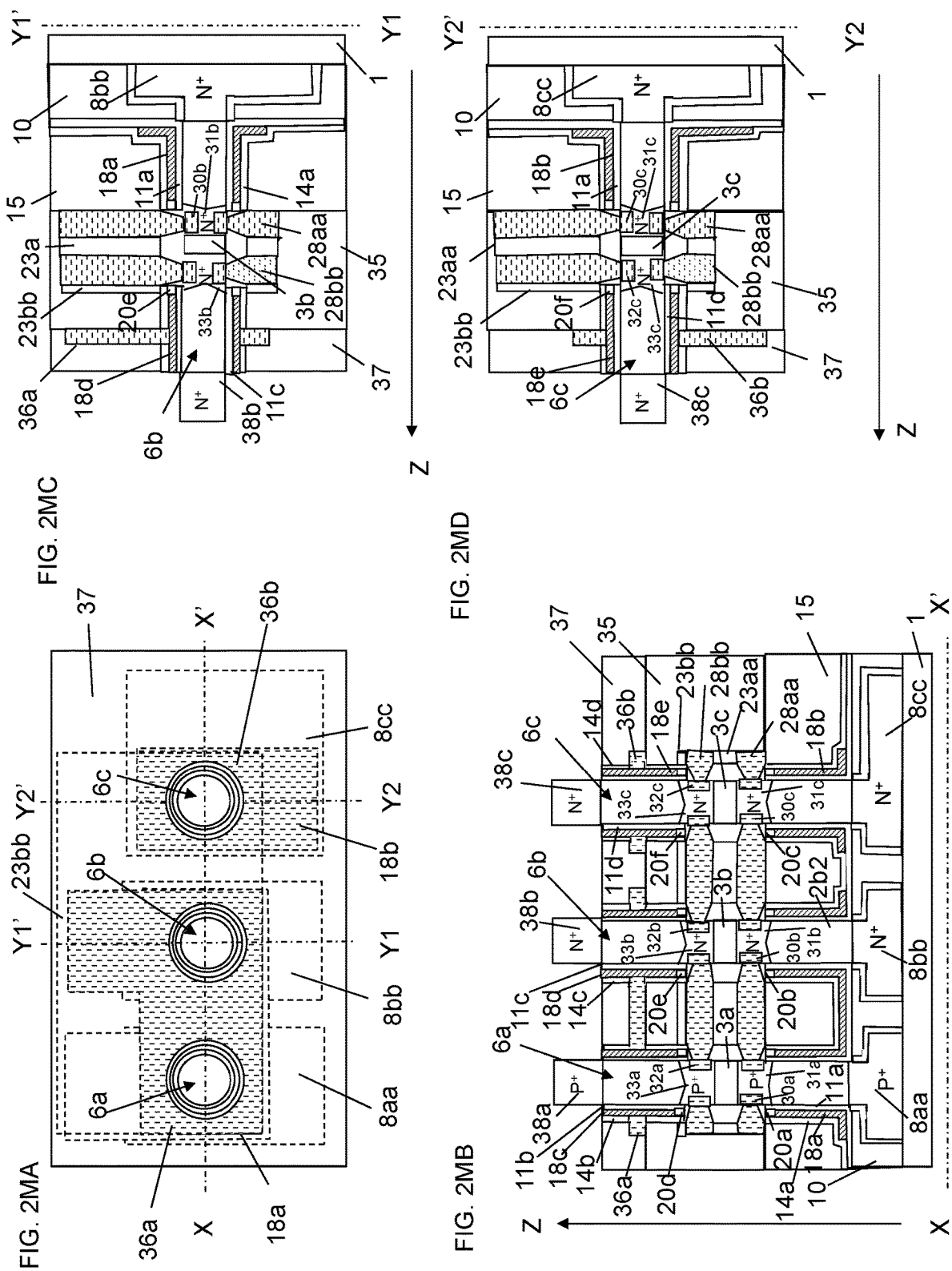

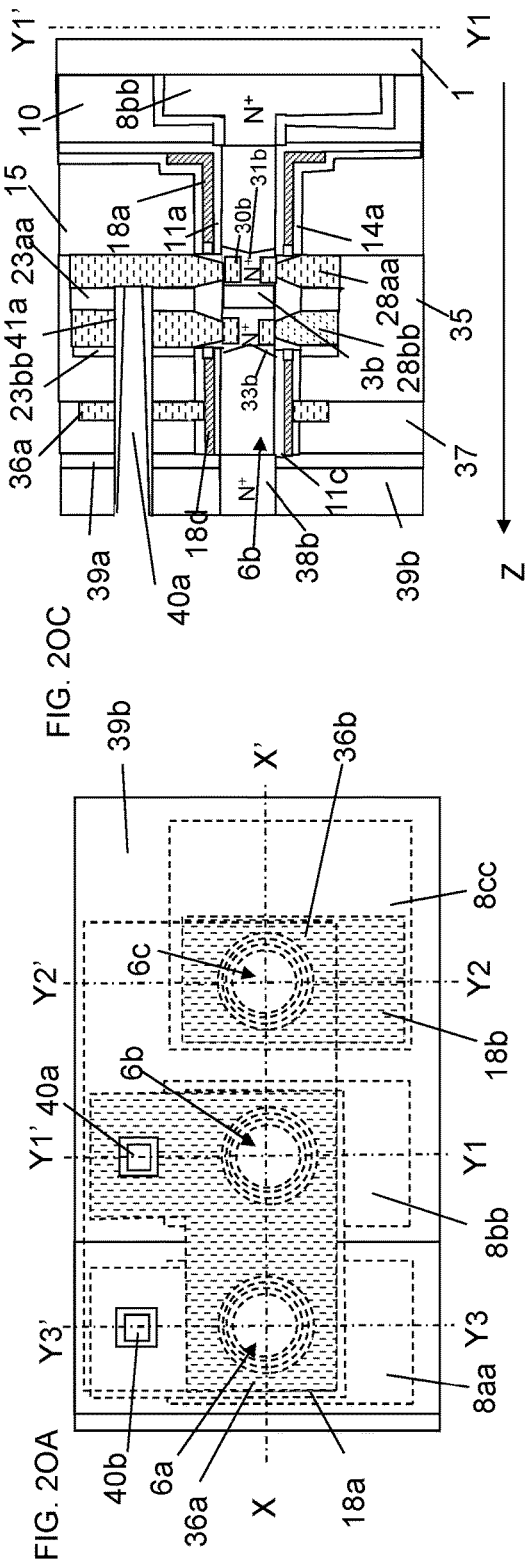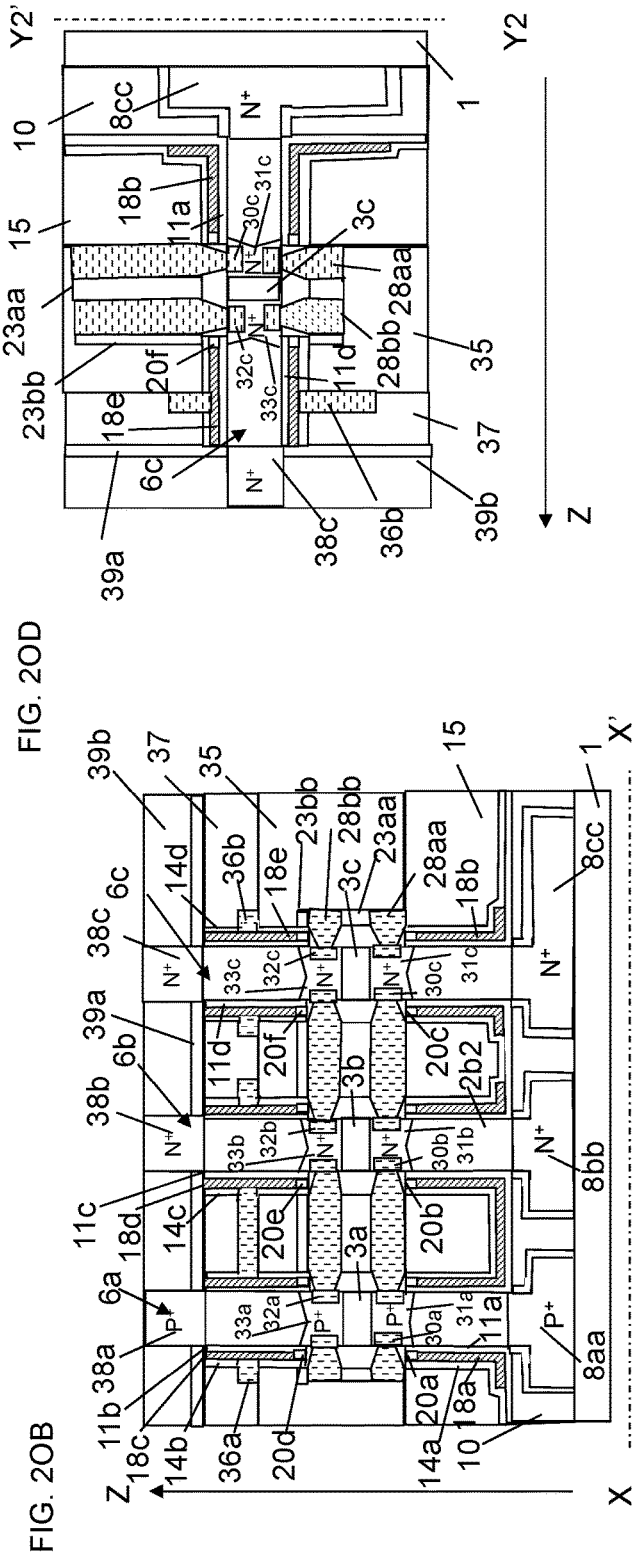

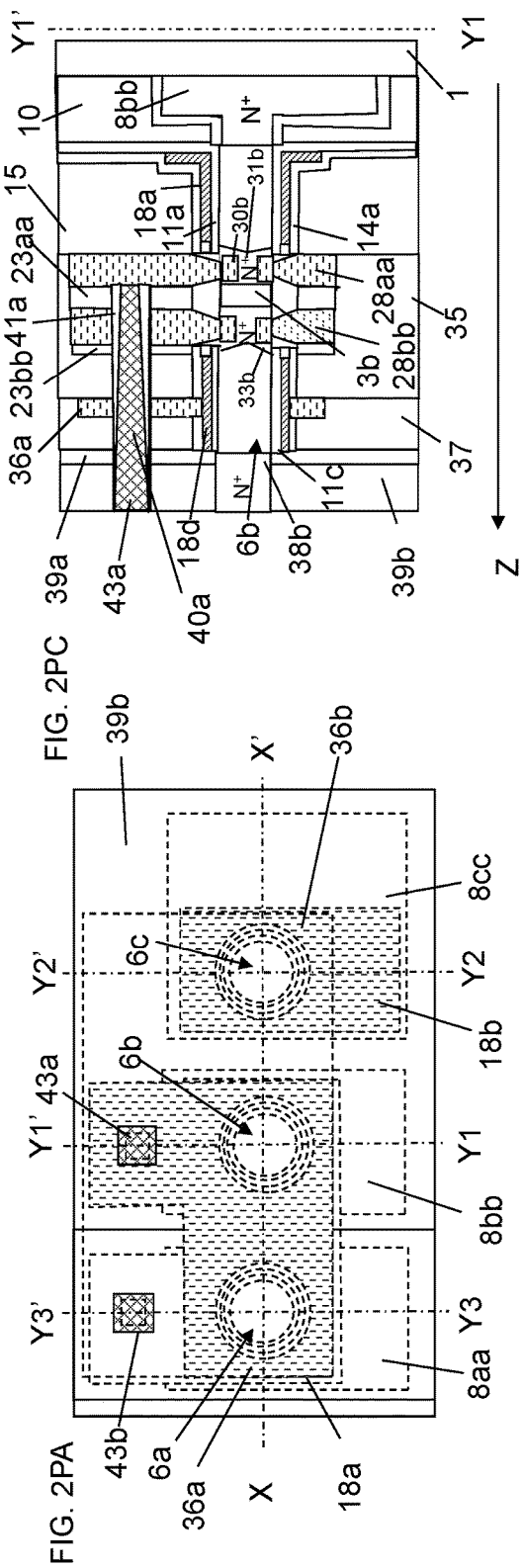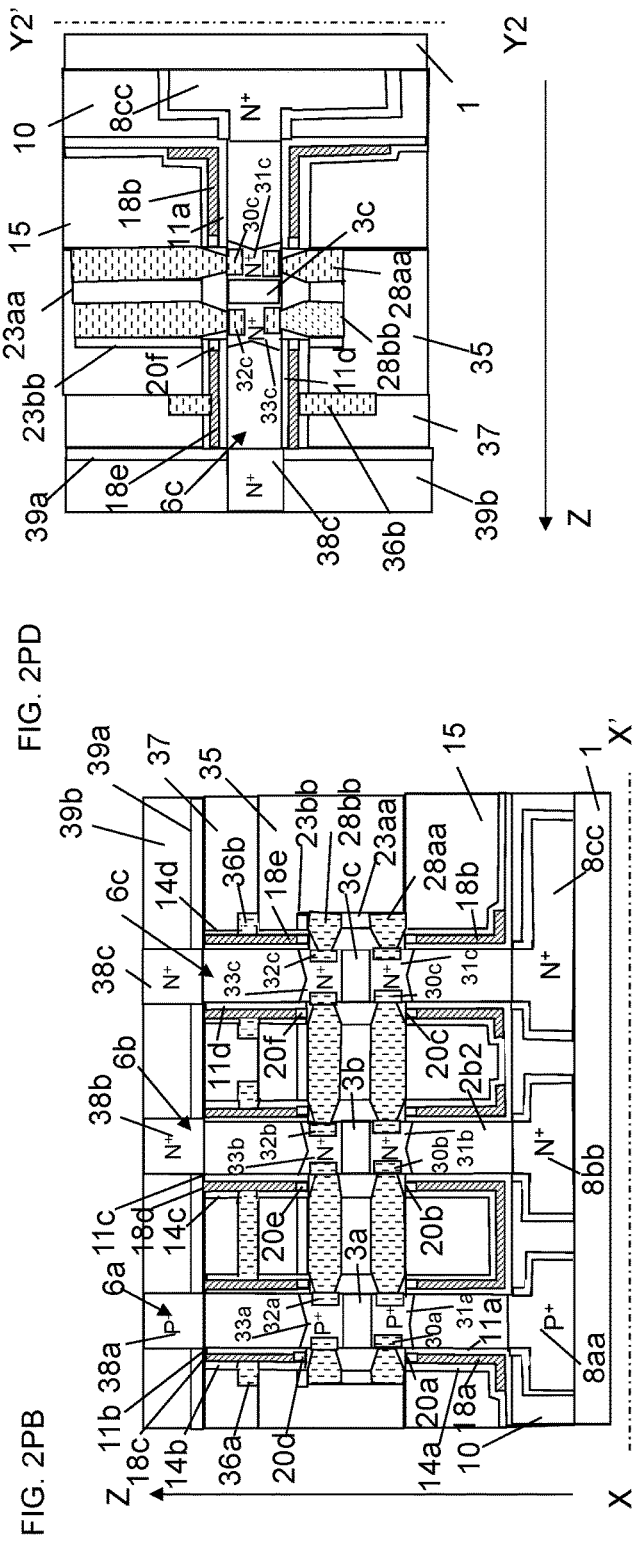

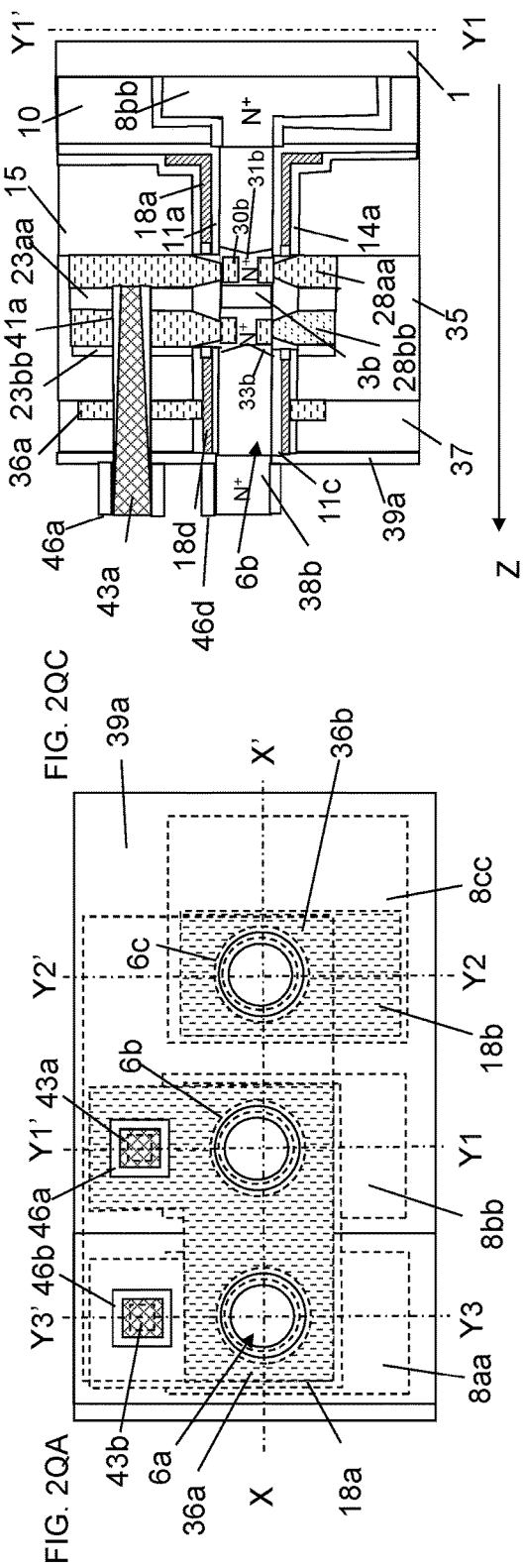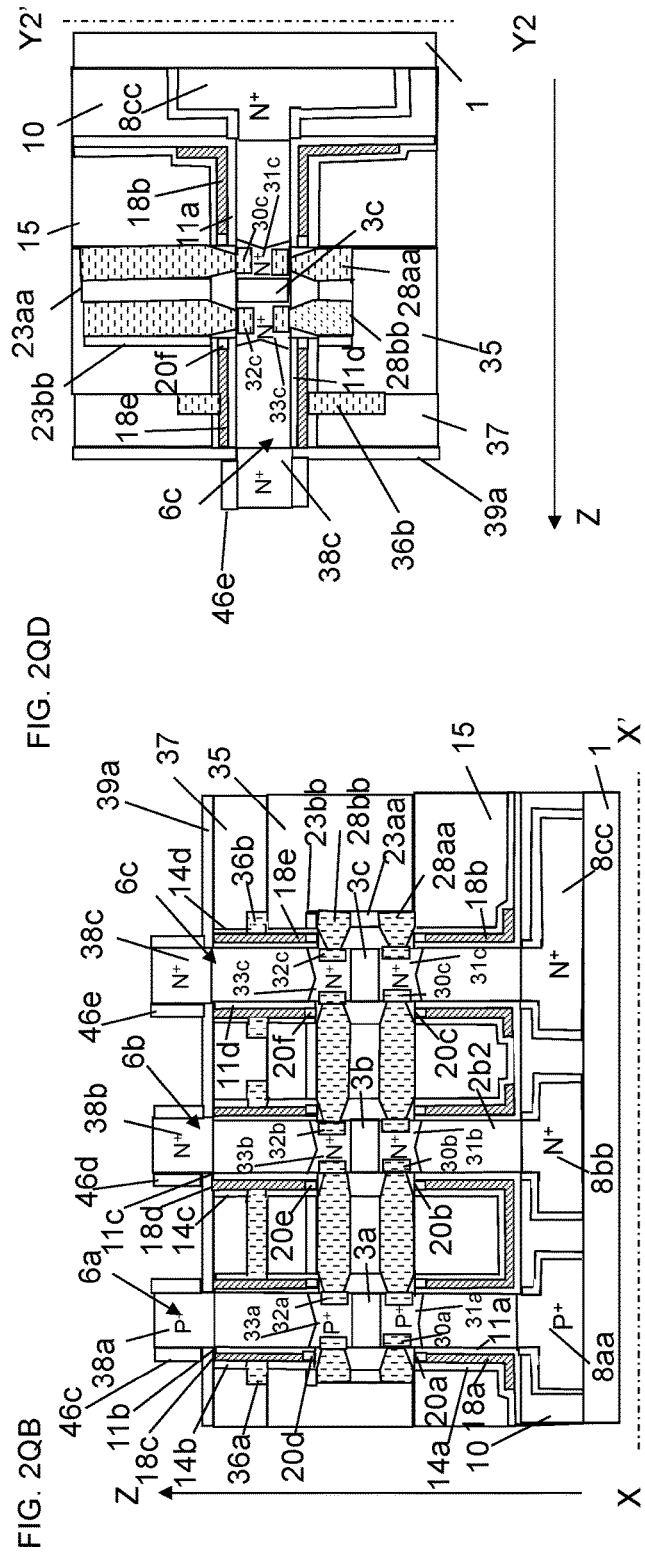

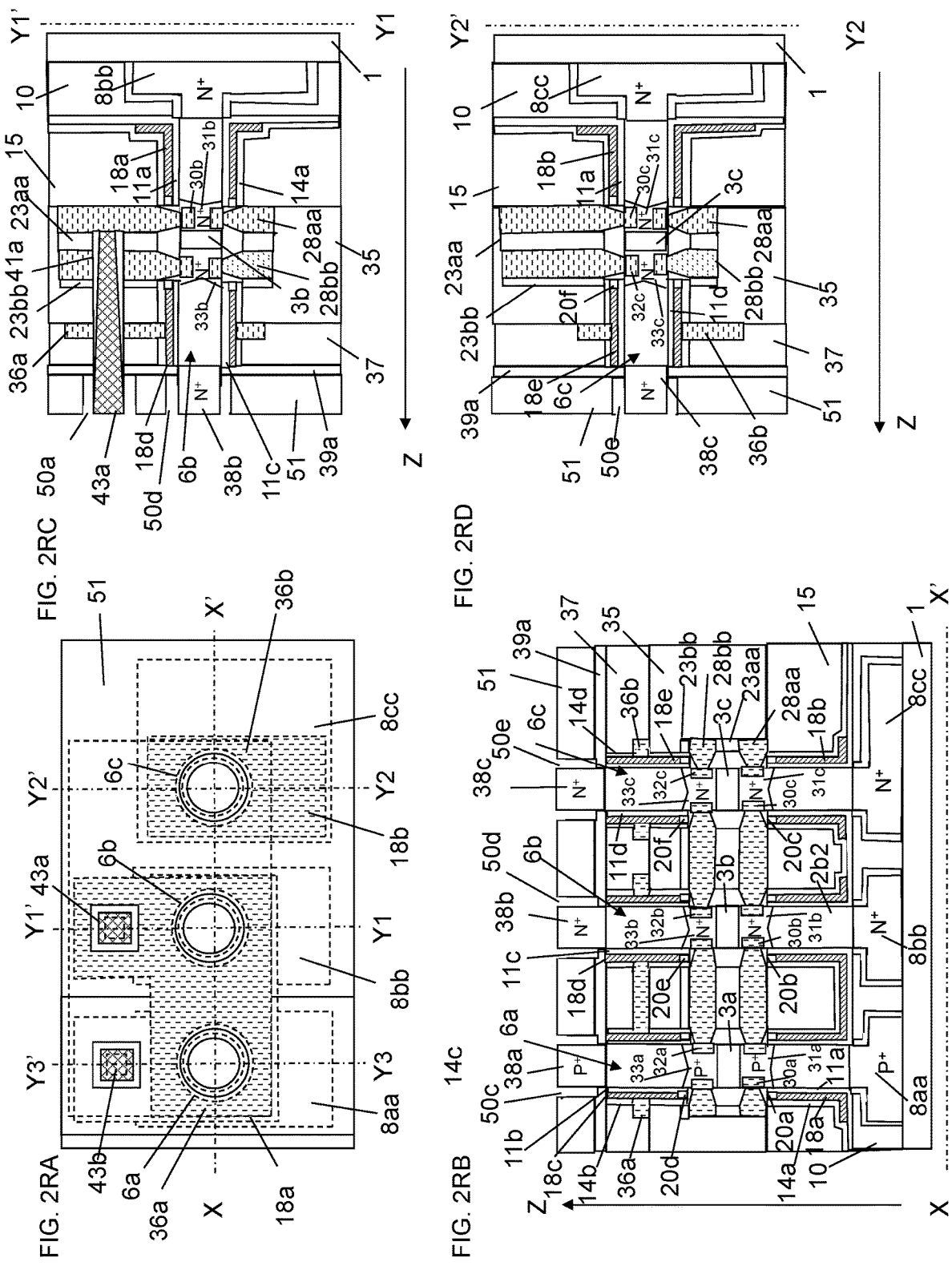

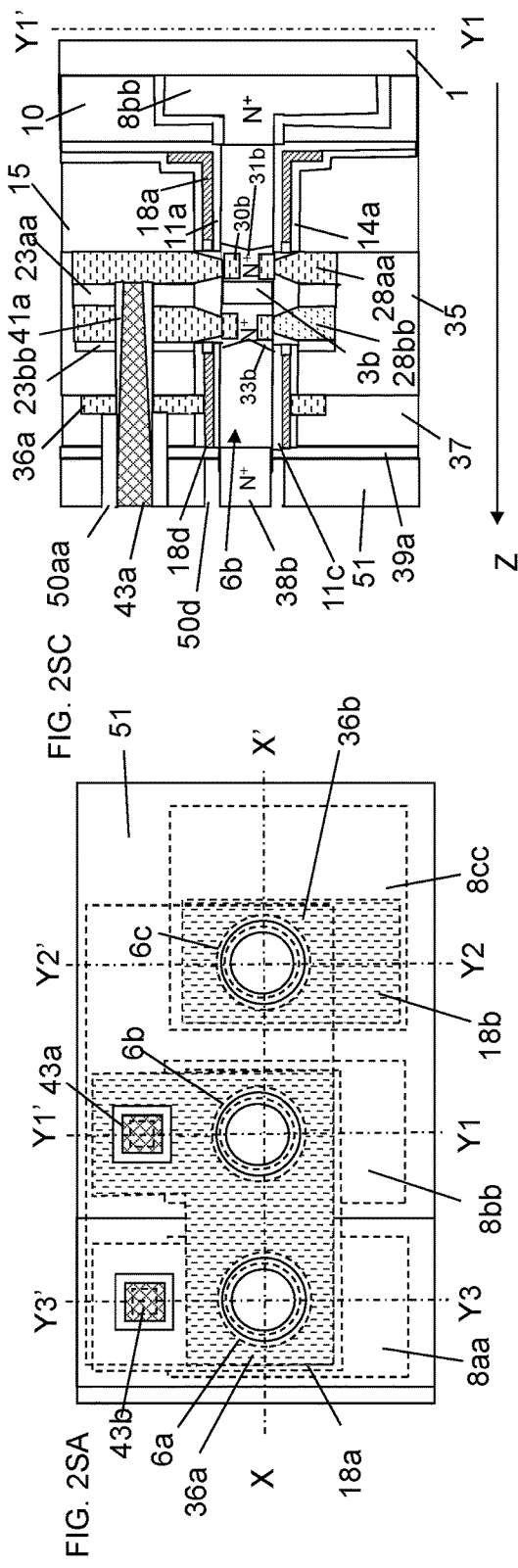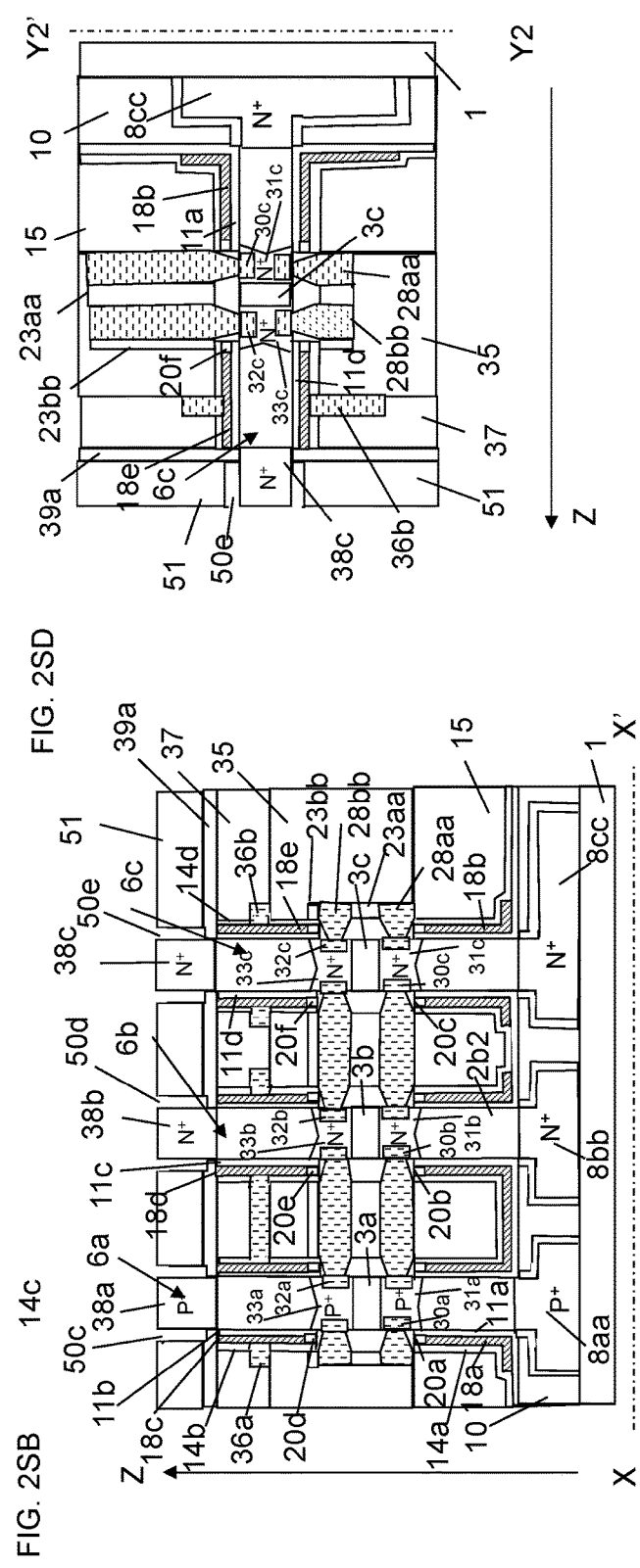

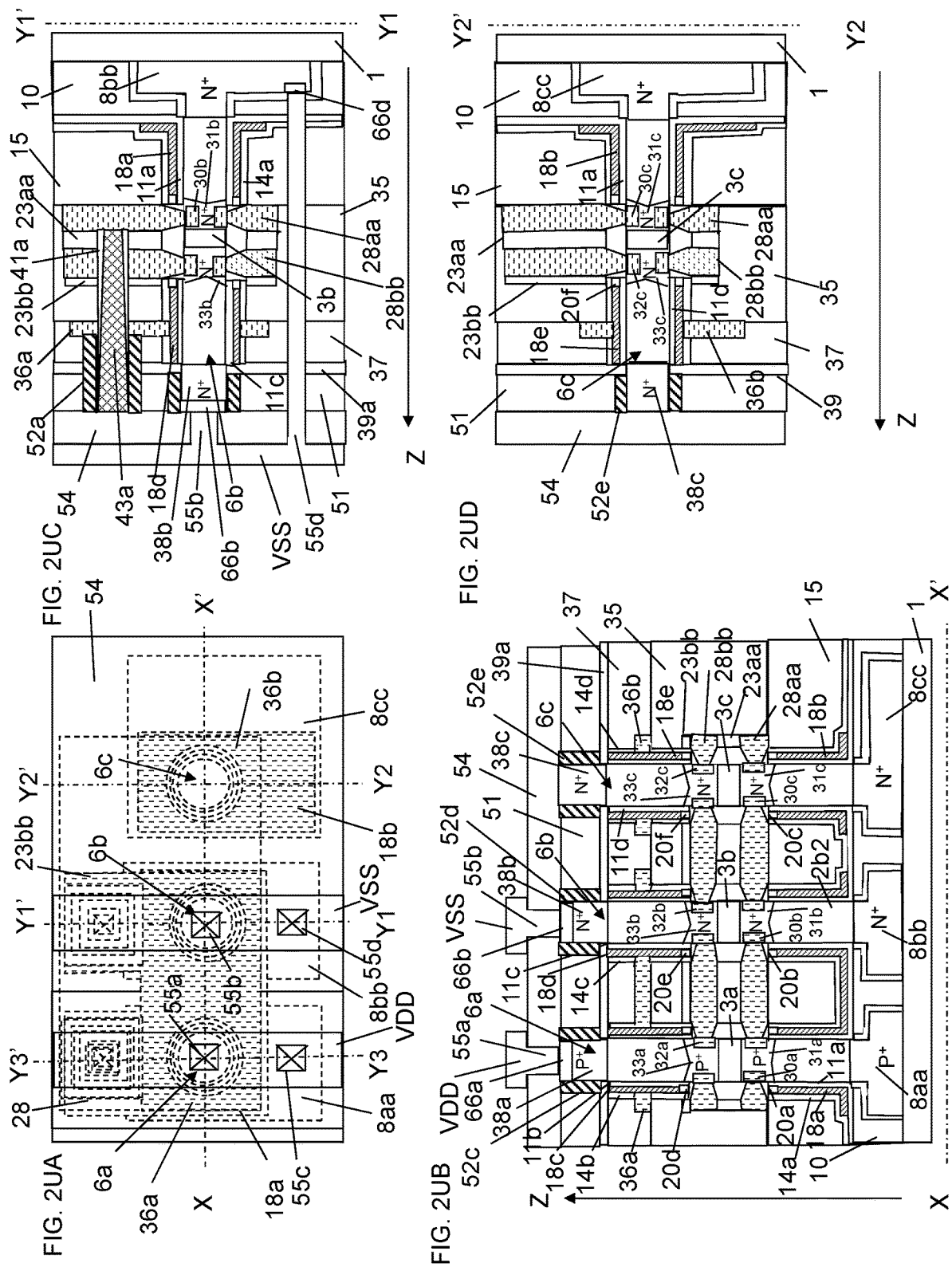

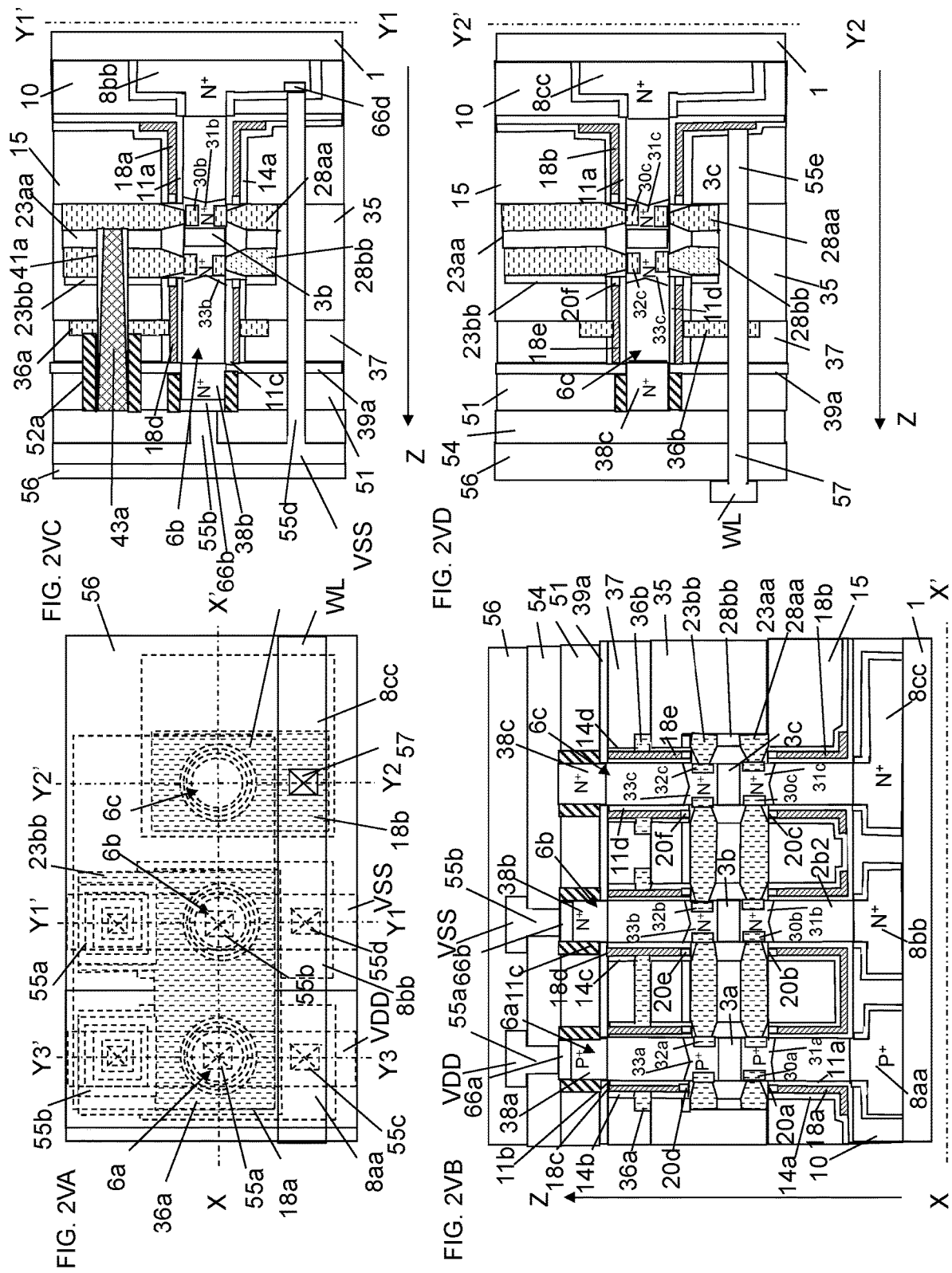

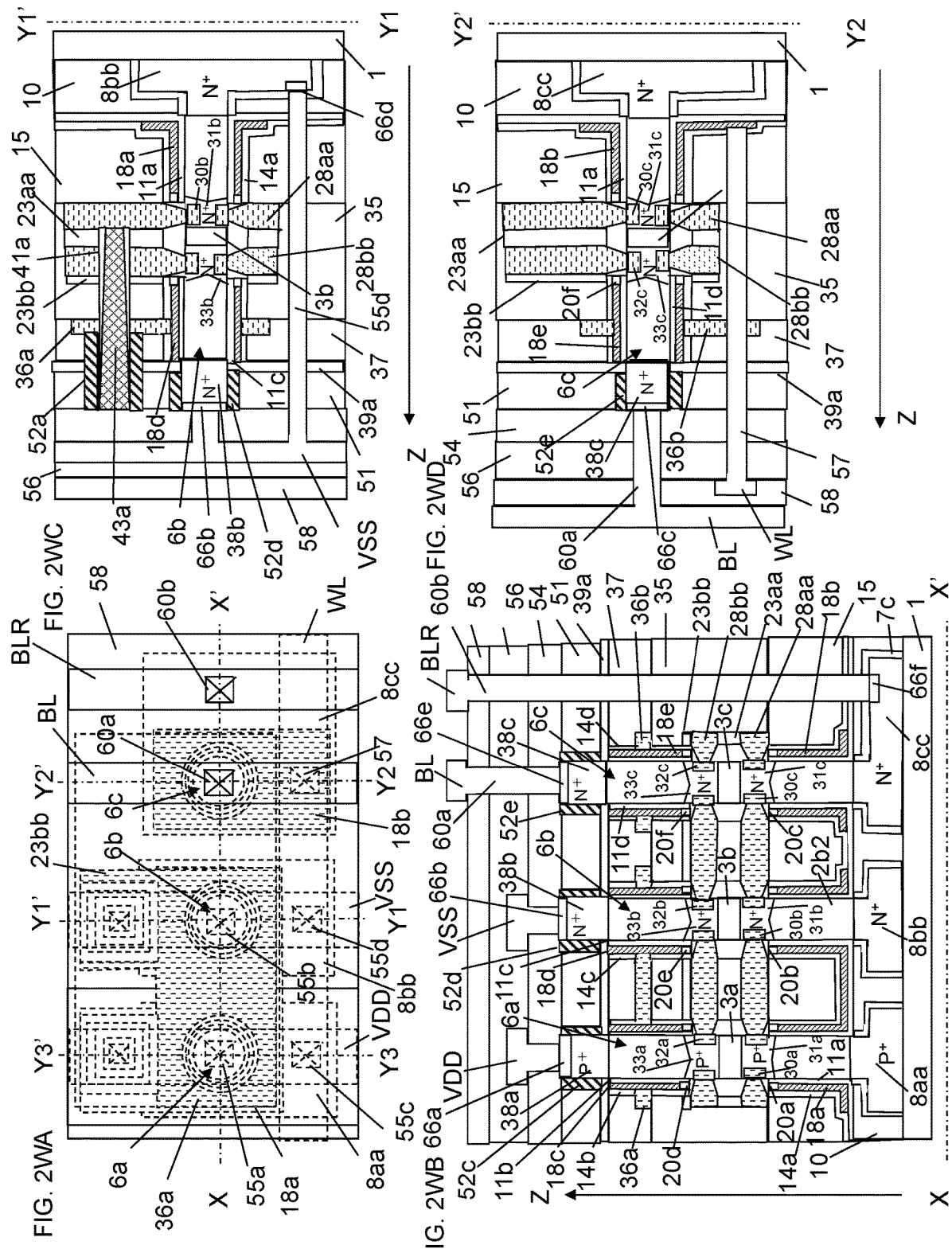

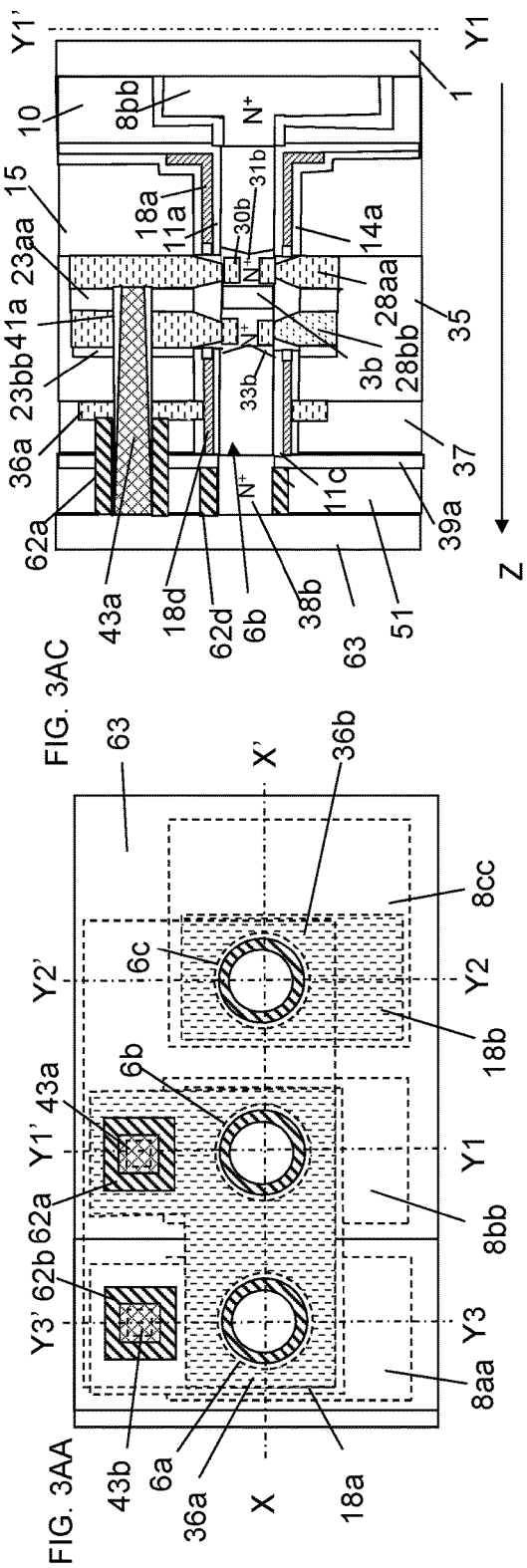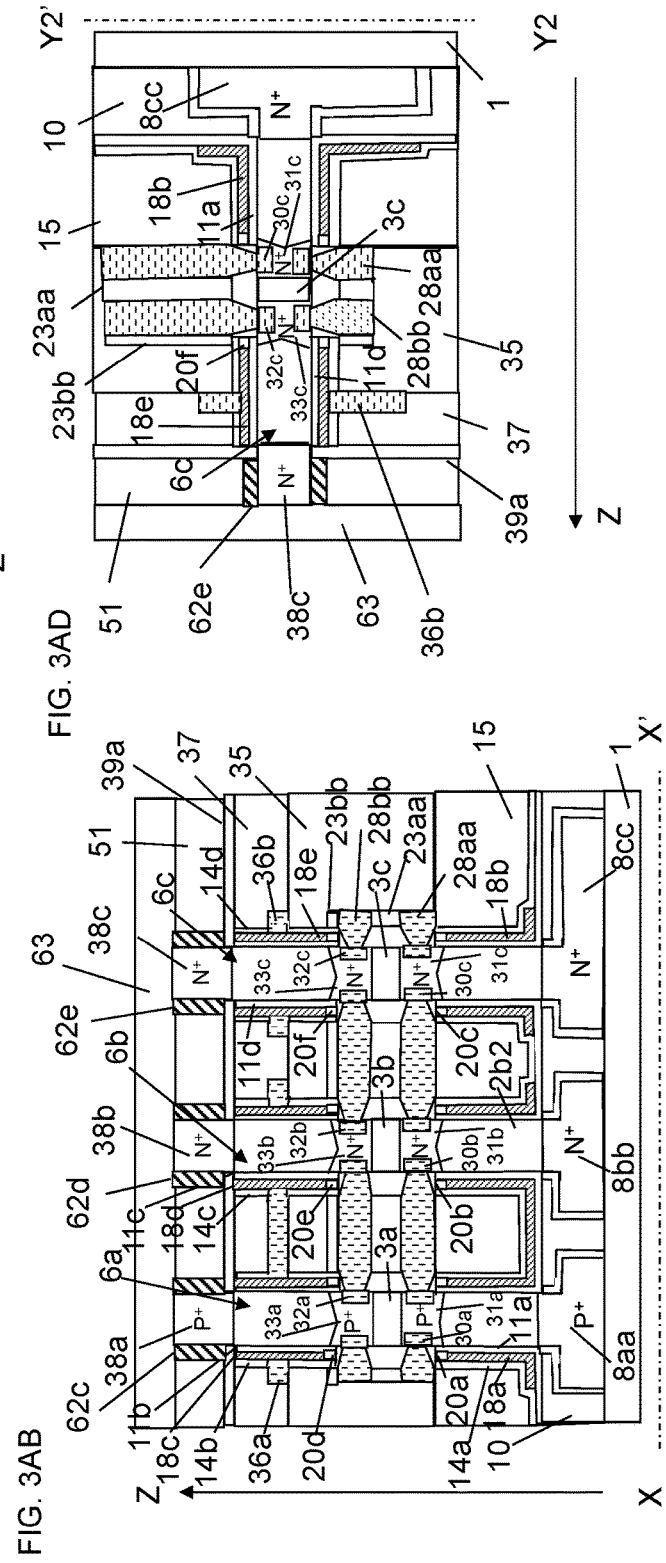
FIG. 3AA
FIG. 3AB
FIG. 3AC
FIG. 3AD

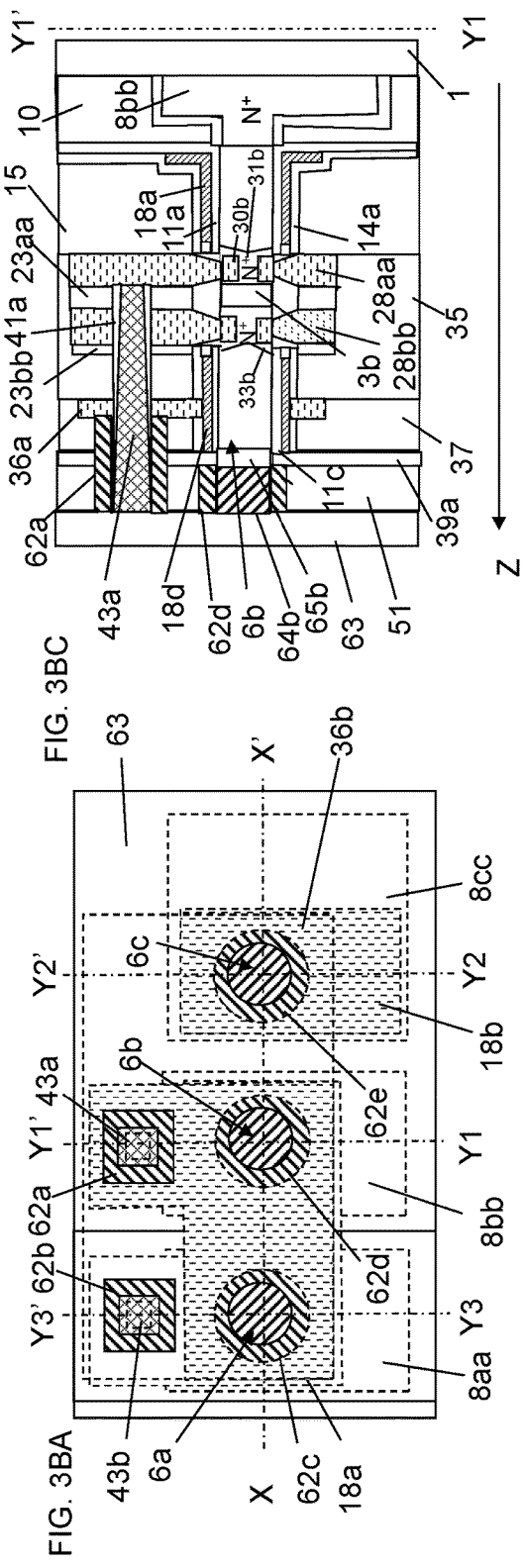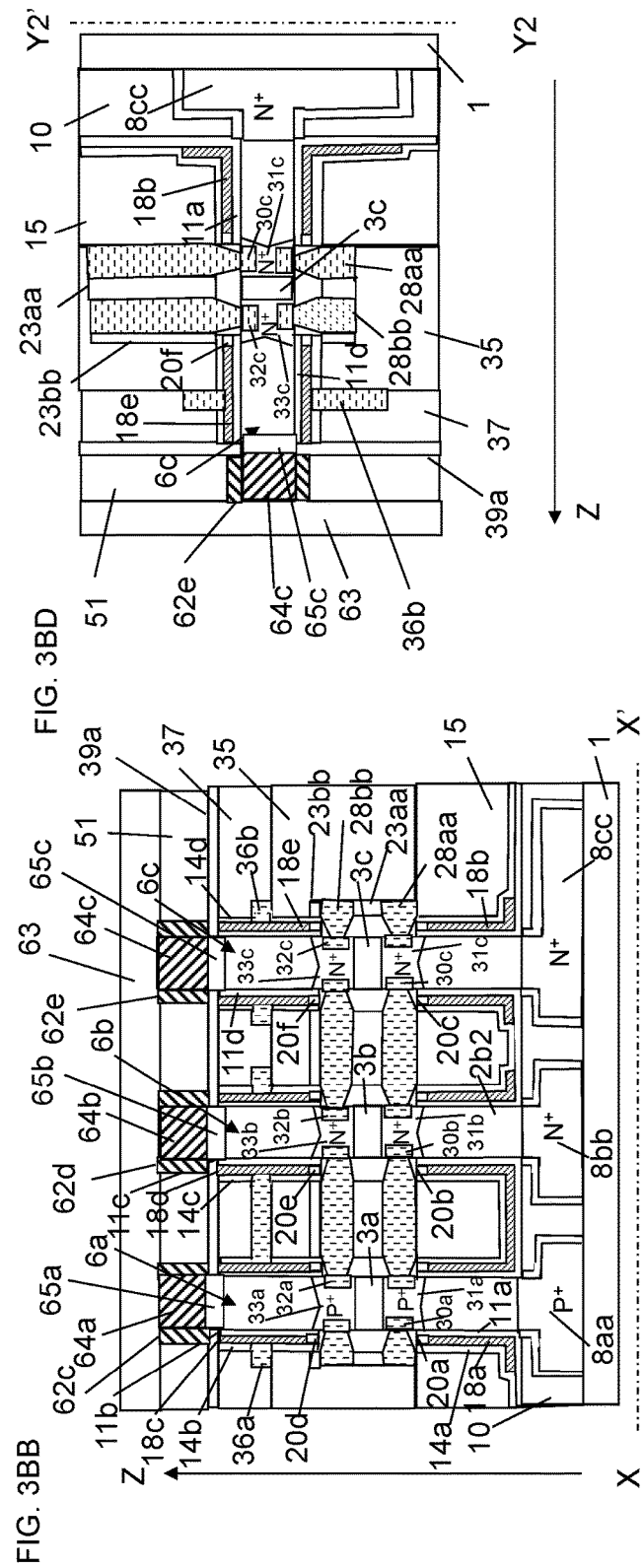

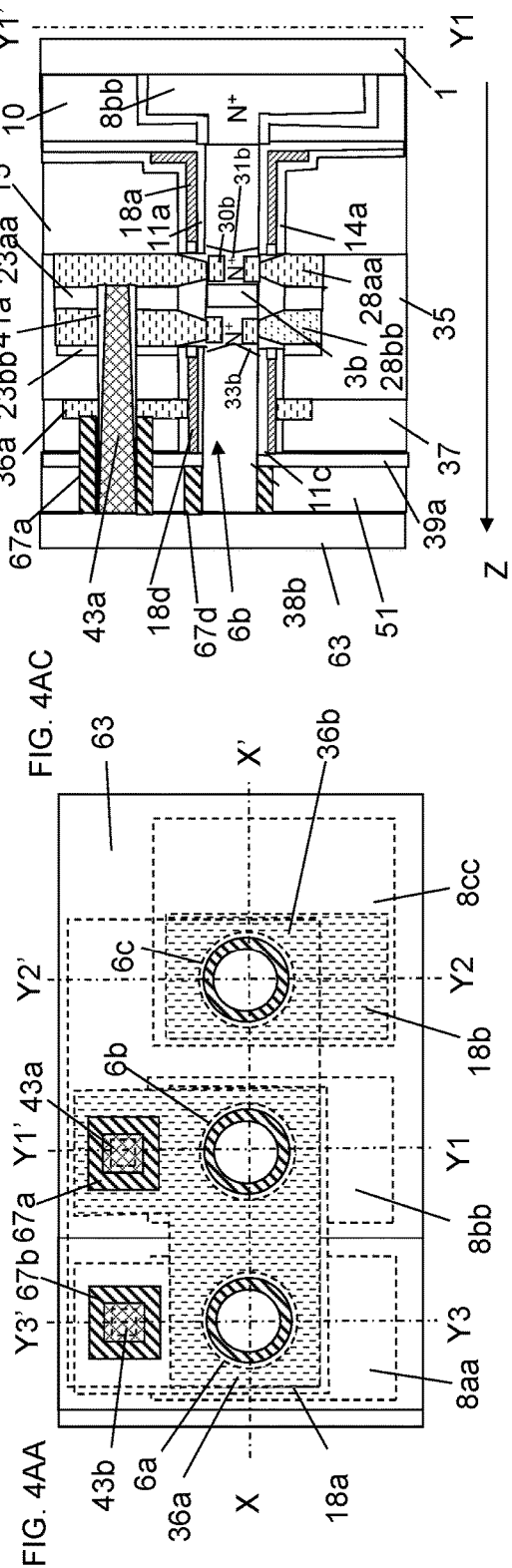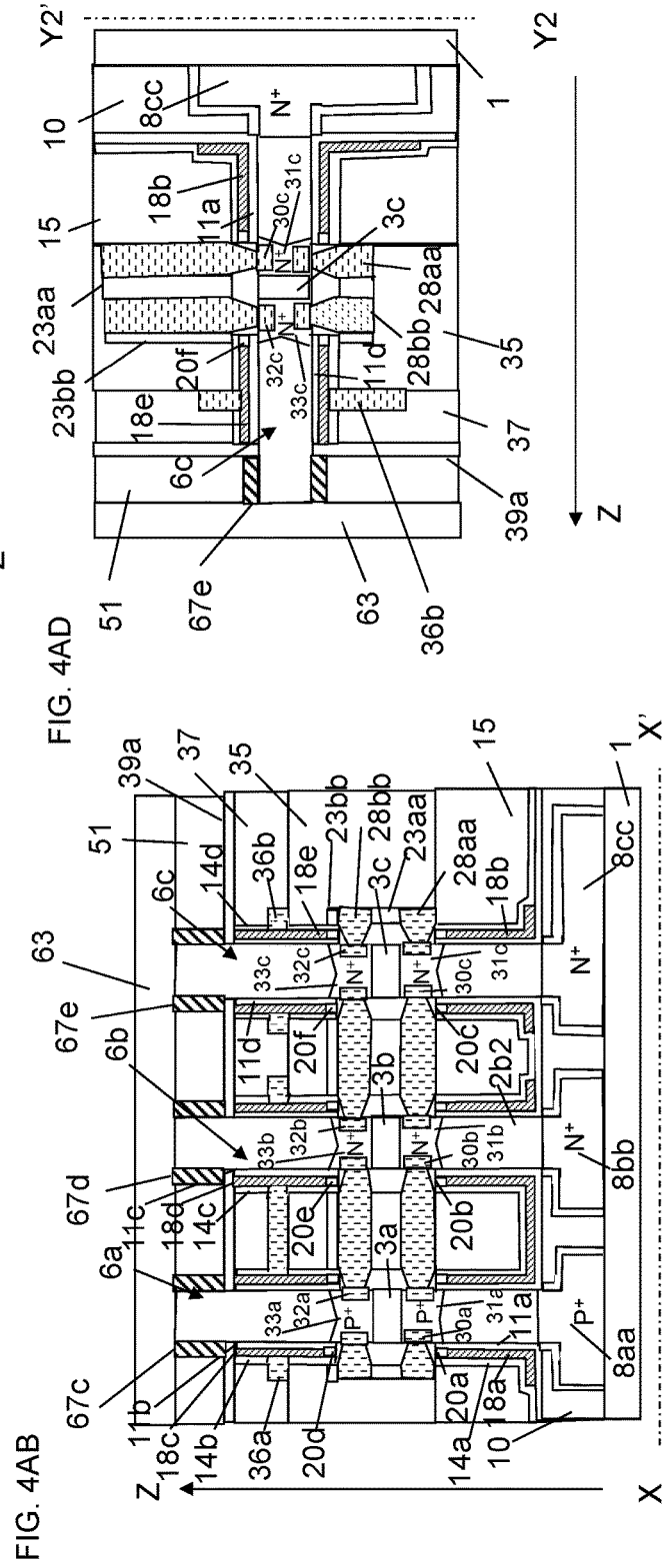
FIG. 4AA
FIG. 4AB
FIG. 4AC
FIG. 4AD

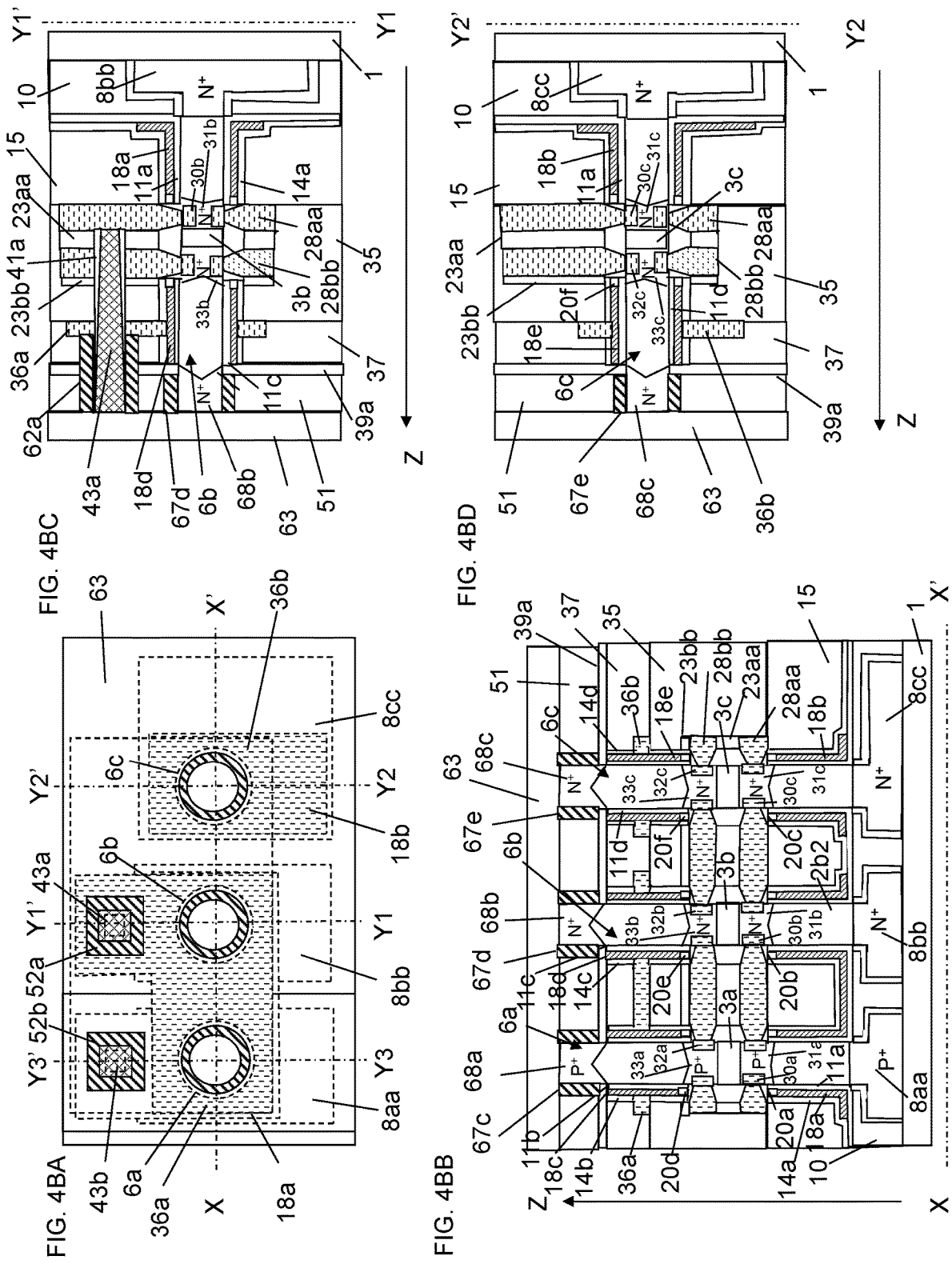

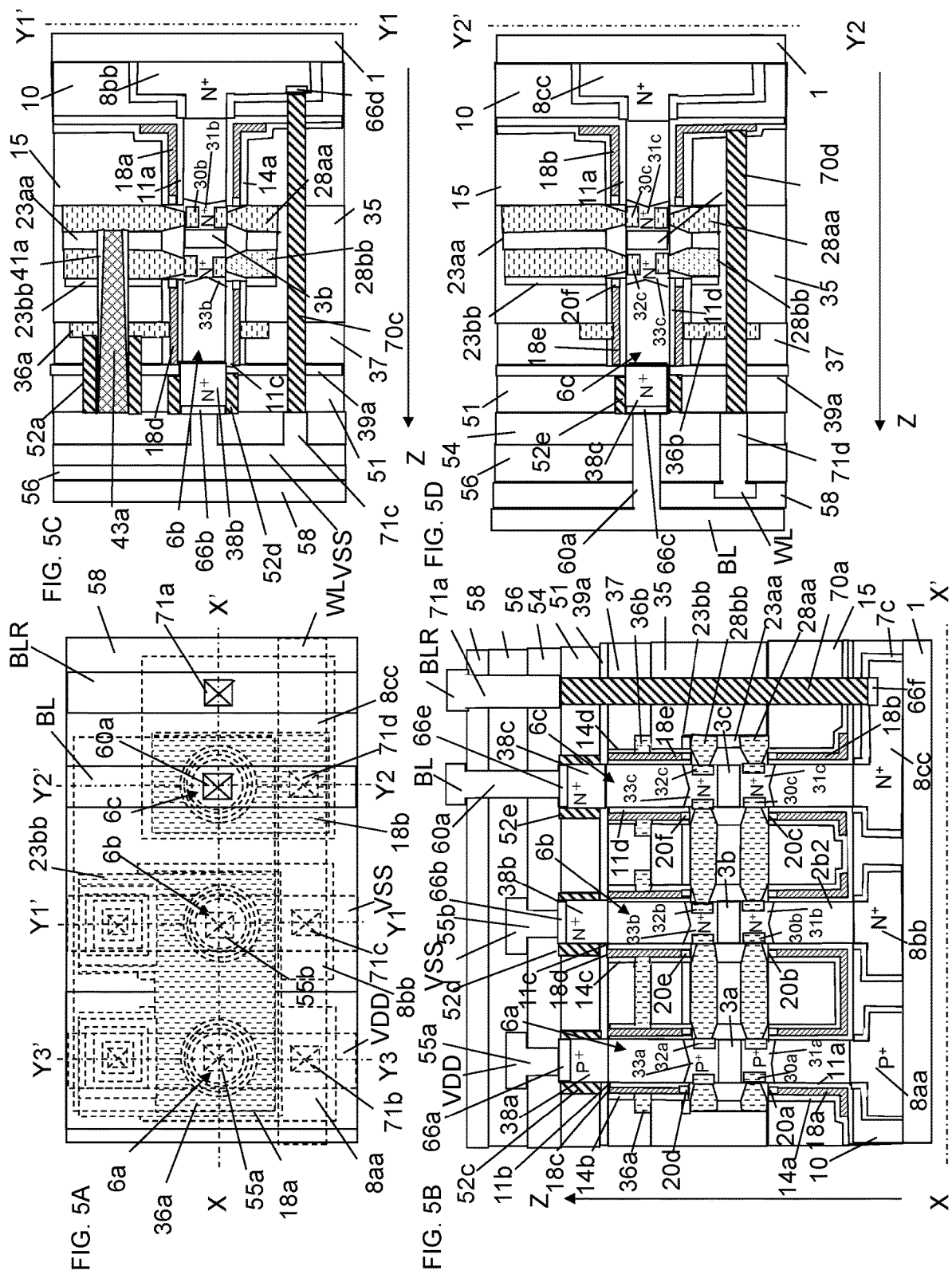

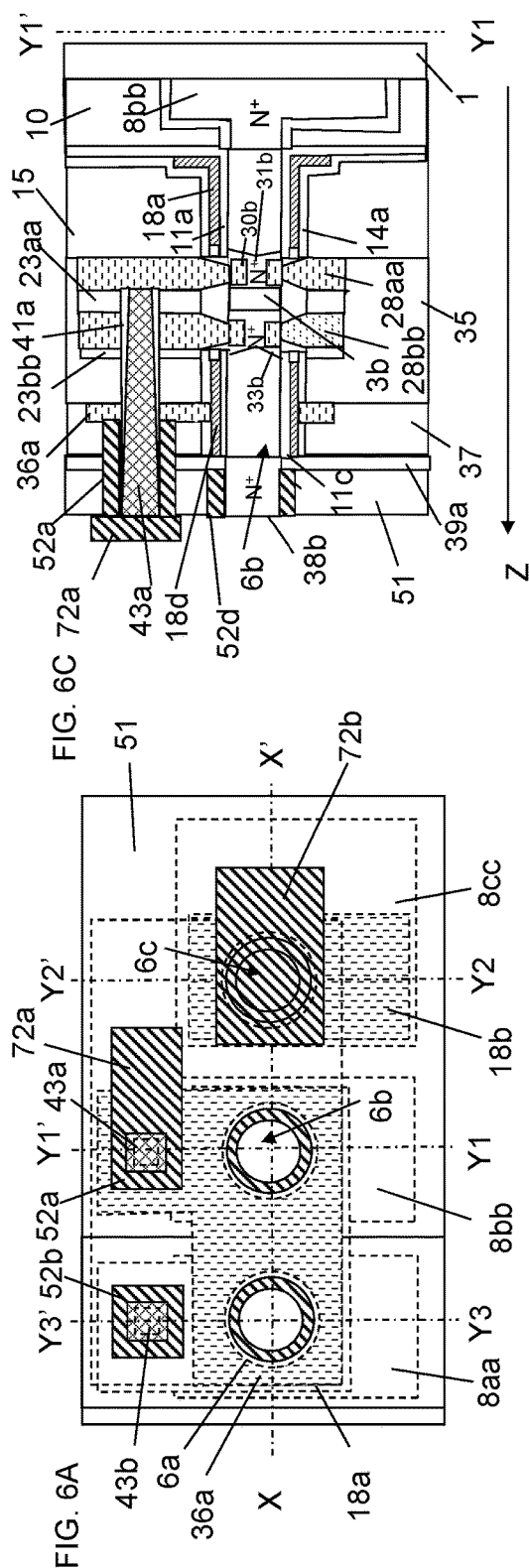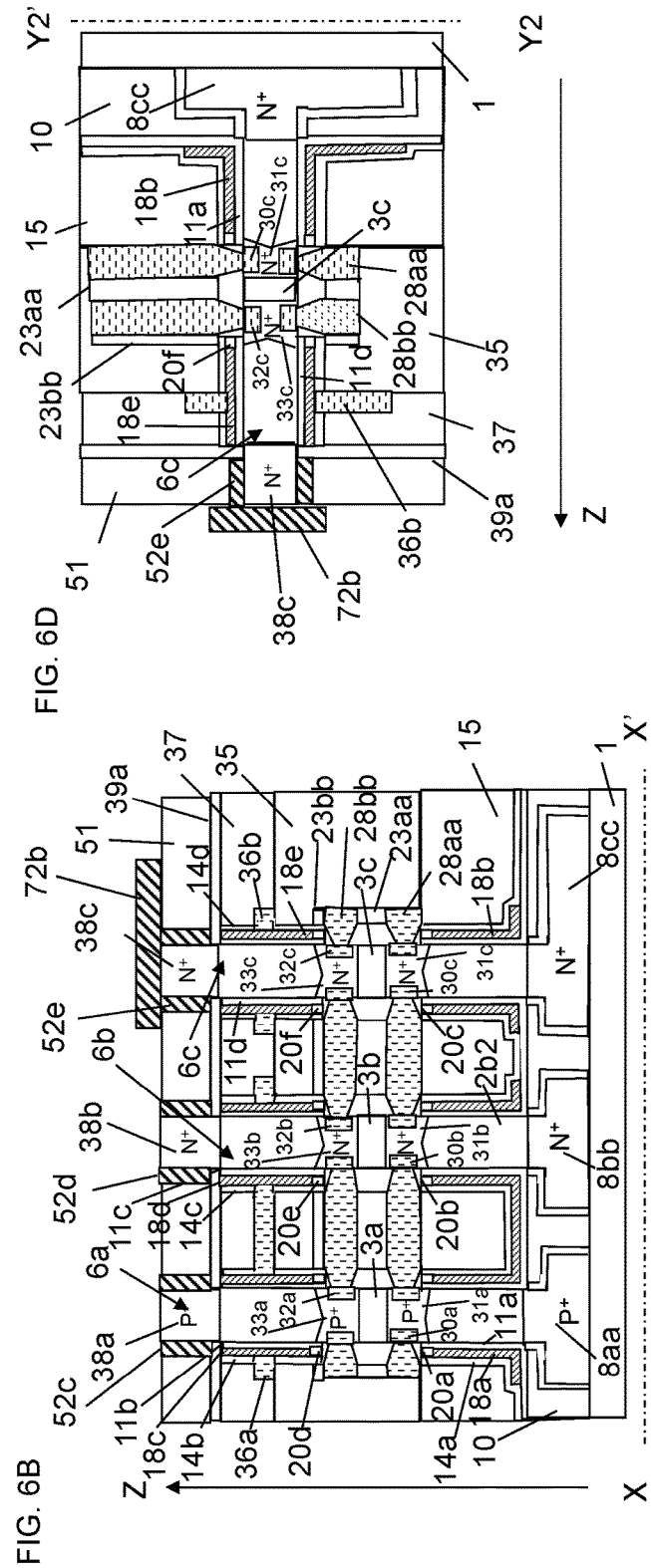

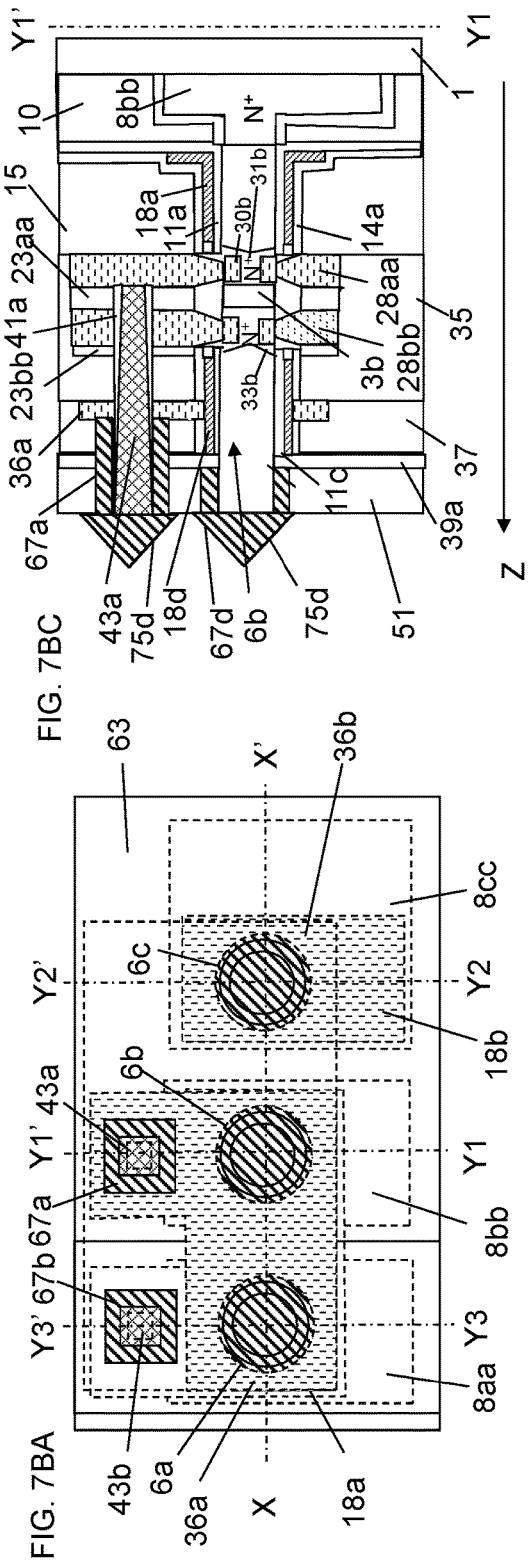

METHOD FOR PRODUCING PILLAR-SHAPED SEMICONDUCTOR DEVICE

RELATED APPLICATIONS

The present application is a continuation-in-part application of PCT/JP2016/089129, filed Dec. 28, 2016, which claims priority to PCT/JP2016/66151, filed Jun. 1, 2016. The contents of these applications are incorporated herein by reference in their entirety.

BACKGROUND OF THE INVENTION

1. Field of the Invention

The present invention relates to a method for producing a pillar-shaped semiconductor device.

2. Description of the Related Art

In these years, three-dimensional transistors have been used in LSI (Large Scale Integration). In particular, surrounding gate transistors (SGTs), which are pillar-shaped semiconductor devices, have been attracting attention as semiconductor elements that provide highly integrated semiconductor devices. There has been a demand for an SGT-including semiconductor device that has a higher degree of integration and a higher performance.

Ordinary planar MOS transistors have a channel that extends in a horizontal direction along the upper surface of the semiconductor substrate. By contrast, SGTs have a channel that extends in a direction perpendicular to the upper surface of the semiconductor substrate (for example, refer to Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 8 is a schematic structural view of an N-channel SGT. A Si pillar 100 of a P or i (intrinsic) conductivity type (hereafter, silicon semiconductor pillars will be referred to as "Si pillars") has, in its upper and lower portions, $N^+$ layers 101a and 101b one of which functions as a source and the other one of which functions as a drain (hereafter, semiconductor regions containing a donor impurity at a high concentration will be referred to as "$N^+$ layers"). A portion of the Si pillar 100 between the $N^+$ layers 101a and 101b, which function as a source and a drain, functions as a channel region 102. Around this channel region 102, a gate insulating layer 103 is formed. Around this gate insulating layer 103, a gate conductor layer 104 is formed. In the SGT, the $N^+$ layers 101a and 101b functioning as the source and the drain, the channel region 102, the gate insulating layer 103, and the gate conductor layer 104 are formed so as to constitute a pillar as a whole. Thus, in plan view, the area occupied by the SGT corresponds to the area occupied by a single source-or-drain $N^-$ layer of a planar MOS transistor. Therefore, compared with a circuit chip including a planar MOS transistor, an SGT-including circuit chip enables a further reduction in the size of the chip.

In the SGT illustrated in FIG. 8, a single SGT is formed within a single Si pillar. Alternatively, plural SGTs may be formed so as to be stacked within a single Si pillar. In this case, wiring conductor layers that are connected to the source/drain semiconductor regions and the gate conductor layers of SGTs and that are formed at the same heights in the perpendicular direction as the source/drain semiconductor regions, overlap in plan view. In a final step of forming the SGT circuit, the wiring conductor layers need to be connected, via contact holes formed on the wiring conductor layers, to wiring metal layers formed above the wiring conductor layers. For this reason, in order to achieve an increase in the degree of integration of an SGT circuit, how to form wiring conductor layers, contact holes, and wiring metal layers is important.

SUMMARY OF THE INVENTION

There has been a demand for an increase in the density of pillar-shaped semiconductor devices.

A method for producing a pillar-shaped semiconductor device according to a first aspect of the present invention includes: a step of providing a semiconductor structure including a substrate, a semiconductor pillar disposed on the substrate and extending in a perpendicular direction with respect to the substrate, a gate insulating layer surrounding an outer periphery of the semiconductor pillar, a gate conductor layer surrounding the gate insulating layer, and an interlayer insulating layer having an upper surface positioned at a level, in the perpendicular direction, that is equal to or higher than an upper end of the gate conductor layer and that is equal to or lower than a top portion of the semiconductor pillar; a step of forming a first material layer so as to surround a side surface of an exposed upper portion of the semiconductor pillar; a step of forming a second material layer so as to surround the first material layer; a step of etching the first material layer through the second material layer serving as an etching mask, to form a first contact hole within the second material layer; and a step of forming a first conductive material layer having conductivity in the first contact hole.

The method preferably further includes: a step of forming a second impurity region containing an acceptor or donor impurity and positioned within the semiconductor pillar and below the upper portion of the semiconductor pillar; and a step of forming, in an outer peripheral portion or an entire inner portion of the upper portion of the semiconductor pillar, a first impurity region containing the acceptor or donor impurity and connecting to a side surface of the first conductive material layer.

The method preferably further includes: a step of providing a stack structure including at least one other semiconductor structure that is different from the semiconductor structure, and that includes another semiconductor pillar being different from the semiconductor pillar and extending in the perpendicular direction with respect to the substrate, another gate insulating layer being different from the gate insulating layer and surrounding an outer periphery of the other semiconductor pillar, another gate conductor layer being different from the gate conductor layer and surrounding the other gate insulating layer, and a third impurity region and a fourth impurity region formed within the other semiconductor pillar so as to be separated from each other, a first wiring conductor layer, a second wiring conductor layer, and a third wiring conductor layer that are individually connected to different regions selected from the gate conductor layer, the other gate conductor layer, the first impurity region, the second impurity region, the third impurity region, and the fourth impurity region, that extend in a horizontal direction along the substrate, that at least partially overlap in plan view, and that are disposed in ascending order; a step of forming a second contact hole extending from an upper surface of the second material layer to an upper surface or inside of the first wiring conductor layer, and extending through the third wiring conductor layer and the second wiring conductor layer; a step of forming a first tubular insulating layer on a side surface of the second wiring conductor layer exposed at the second contact hole; a step of filling the second contact hole to form a second conductive material layer having conductivity; and a step of exposing a side surface of an upper portion of the second conductive material layer, wherein the step of forming the first material layer includes a step of forming a third material layer so as to surround the side surface of the upper portion of the second conductive material layer, the step of forming the second material layer includes a step of forming a fourth material layer so as to surround the third material layer, and further includes a step of etching the third material layer through the fourth material layer serving as an etching mask to form a third contact hole within the fourth material layer, and a step of forming a third conductive material layer having conductivity within the third contact hole.

In the method, preferably, the first conductive material layer at least includes a metal atom and a semiconductor atom, and the method further includes a step of carrying out heat treatment to diffuse the metal atom of the first conductive material layer into the upper portion of the semiconductor pillar, to form an alloy layer within the upper portion of the semiconductor pillar.

In the method, preferably, the first conductive material layer contains the acceptor or donor impurity, and in the step of forming the first impurity region, heat treatment is carried out to diffuse the acceptor or donor impurity into the outer peripheral portion or the entire inner portion of the upper portion of the semiconductor pillar, to form the first impurity region.

The method preferably further includes: a step of forming a fourth contact hole that is positioned, in plan view, not at the first contact hole, that reaches a wiring conductor layer connected to the gate conductor layer, the first impurity region, or the second impurity region and extending in a horizontal direction, and that extends downward beyond a surface of the second material layer; a step of filling a fourth conductive material layer into the fourth contact hole; and a step of processing the first conductive material layer and the fourth conductive material layer so as to have top portions having surfaces flush with each other.

The method preferably further includes a step of processing the first conductive material layer, the second conductive material layer, and the third conductive material layer so as to have top portions having surfaces flush with one another.

In the method, preferably, the step of forming the first conductive material layer and the step of forming the third conductive material layer are carried out such that a conductor material is filled into the first contact hole and the third contact hole and deposited on the second material layer, and, subsequently, a lithographic process and etching are carried out to form, on the second material layer, one or both of a first wiring conductor layer connecting from the conductor material to the first conductive material layer, and a second wiring conductor layer connecting from the conductor material to the third conductive material layer.

The method preferably further includes: a step of depositing a wiring material layer on the second material layer, the step being carried out after the step of processing the first conductive material layer, the second conductive material layer, and the third conductive material layer so as to have top portions having surfaces flush with one another, and a step of carrying out a lithographic process and etching to form, on the second material layer, one or both of a fourth wiring conductor layer connecting from the wiring material layer to the first conductive material layer, and a fifth wiring conductor layer connecting from the wiring material layer to the third conductive material layer, wherein, in the etching, the fourth wiring conductor layer and the fifth wiring conductor layer are etched faster than the first conductive material layer, the second conductive material layer, and the third conductive material layer.

In the method, preferably the first material layer is formed so as to surround, with a constant width in plan view, the upper portion of the semiconductor pillar.

In the method, preferably, the first conductive material layer is formed by a semiconductor layer containing a donor or acceptor impurity.

In the method, preferably, the semiconductor layer is formed by a selective epitaxial crystal growth method so as to fill the first contact hole, and have a top portion positioned above an upper surface of the semiconductor pillar.

The present invention provides a high-density pillar-shaped semiconductor device.

BRIEF DESCRIPTION OF THE DRAWINGS

FIGS. 2FA to 2FD are a plan view and sectional structural views that illustrate a method for producing an SGT-including pillar-shaped semiconductor device according to a first embodiment.

FIGS. 2HA to 2HD are a plan view and sectional structural views that illustrate a method for producing an SGT-including pillar-shaped semiconductor device according to a first embodiment.

FIGS. 21A to 21D are a plan view and sectional structural views that illustrate a method for producing an SGT-including pillar-shaped semiconductor device according to a first embodiment.

FIGS. 2JA to 2JD are a plan view and sectional structural views that illustrate a method for producing an SGT-including pillar-shaped semiconductor device according to a first embodiment.

FIGS. 2KA to 2KD are a plan view and sectional structural views that illustrate a method for producing an SGT-including pillar-shaped semiconductor device according to a first embodiment.

FIGS. 2LA to 2LD are a plan view and sectional structural views that illustrate a method for producing an SGT-including pillar-shaped semiconductor device according to a first embodiment.

FIGS. 2MA to 2MD are a plan view and sectional structural views that illustrate a method for producing an SGT-including pillar-shaped semiconductor device according to a first embodiment.

FIGS. 5A to 5E are a plan view and sectional structural views that illustrate a method for producing an SGT-including pillar-shaped semiconductor device according to a fourth embodiment of the present invention.

FIGS. 6A to 6E are a plan view and sectional structural views that illustrate a method for producing an SGT-including pillar-shaped semiconductor device according to a fifth embodiment of the present invention.

DETAILED DESCRIPTION OF THE PREFERRED EMBODIMENTS

Hereinafter, methods for producing pillar-shaped semiconductor devices according to embodiments of the present invention will be described with reference to drawings.

First Embodiment

Hereinafter, referring to FIGS. 1A, 1B, and 2AA to 2WE, a method for producing an SGT-including pillar-shaped semiconductor device according to a first embodiment of the present invention will be described.

Figure 1A:
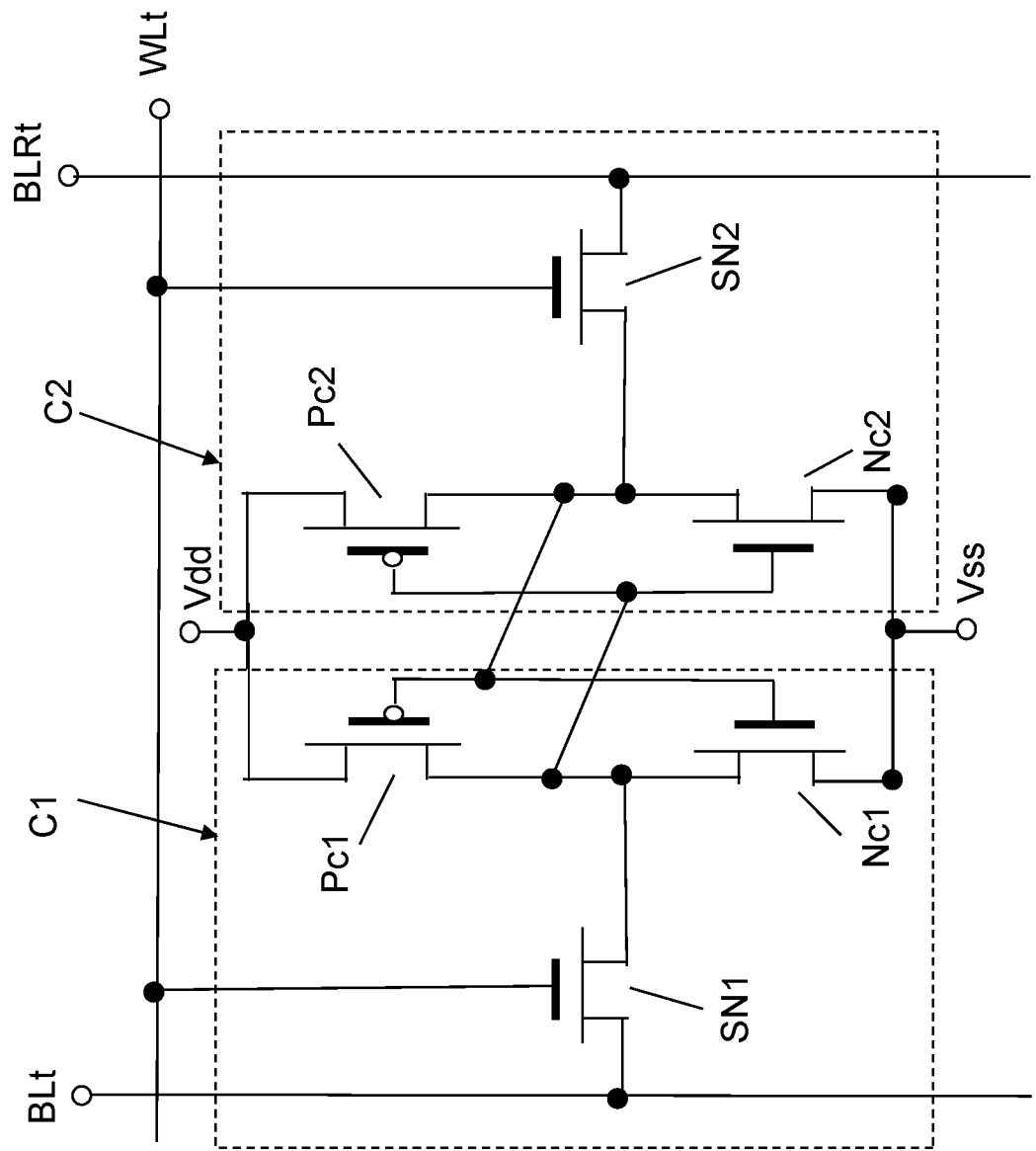
FIG. 1A is an SRAM cell circuit diagram that illustrates an SGT-including pillar-shaped semiconductor device according to a first embodiment of the present invention.

FIG. 1A illustrates a pillar-shaped semiconductor device according to this embodiment, that is, an SRAM cell circuit including SGTs. This SRAM cell circuit includes two inverter circuits. One of the inverter circuits is constituted by a P-channel SGT Pc1 serving as a load transistor, and an N-channel SGT Nc1 serving as a drive transistor. The other inverter circuit is constituted by a P-channel SGT Pc2 serving as a load transistor, and an N-channel SGT Nc2 serving as a drive transistor. The gate of the P-channel SGT Pc1, the gate of the N-channel SGT Nc1, the drain of the P-channel SGT Pc2, and the drain of the N-channel SGT Nc2 are connected together. The gate of the P-channel SGT Pc2, the gate of the N-channel SGT Nc2, the drain of the P-channel SGT Pc1, and the drain of the N-channel SGT Nc1 are connected together.

As illustrated in FIG. 1A, the sources of the P-channel SGTs Pc1 and Pc2 are connected to a power supply terminal Vdd. The sources of the N-channel SGTs Nc1 and Nc2 are connected to a ground terminal Vss. Selection N-channel SGTs SN1 and SN2 are disposed on both sides of the two inverter circuits. The gates of the selection N-channel SGTs SN1 and SN2 are connected to a word line terminal WLt. The source and drain of the selection N-channel SGT SN1 are connected to a bit line terminal BLt and the drains of the N-channel SGT Nc1 and the P-channel SGT Pc1. The source and drain of the selection N-channel SGT SN2 are connected to an inverted bit line terminal BLRt and the drains of the N-channel SGT Nc2 and the P-channel SGT Pc2. Thus, the circuit including an SRAM cell (hereafter, referred to as an "SRAM cell circuit") according to this embodiment is constituted by, in total, six SGTs that are two P-channel SGTs Pc1 and Pc2 and four N-channel SGTs Nc1, Nc2, SN1, and SN2. This SRAM cell circuit is constituted by a circuit area C1, which is constituted by the P-channel SGT Pc1 and the N-channel SGTs Nc1 and SN1, and a circuit area C2, which is constituted by the P-channel SGT Pc2 and the N-channel SGTs Nc2 and SN2.

Figure 1B:
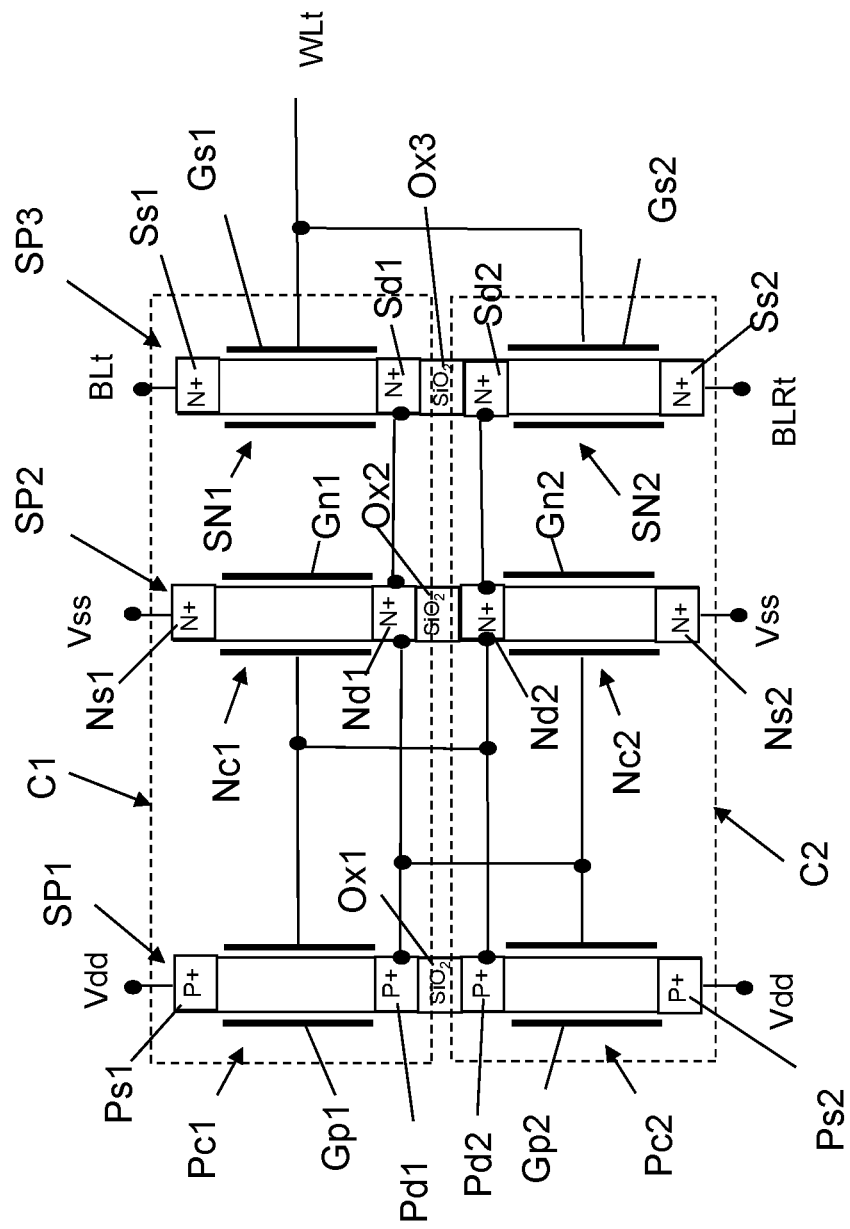
FIG. 1B is an SRAM cell schematic structural view that illustrates an SGT-including pillar-shaped semiconductor device according to a first embodiment.

FIG. 1B is a schematic structural view of the SRAM cell circuit according to the first embodiment. This SRAM cell circuit is constituted by three Si pillars SP1, SP2, and SP3.

In the Si pillar SP1, the P-channel SGT Pc1 in FIG. 1A is formed in an upper portion, and the P-channel SGT Pc2 in FIG. 1A is formed in a lower portion. The P-channel SGTs Pc1 and Pc2 are isolated from each other by a $SiO_2$ layer Ox1, which is formed in an intermediate portion of the Si pillar SP1. The P-channel SGT Pc1 is constituted by a channel portion of the Si pillar SP1, a gate Gp1 surrounding this portion of the Si pillar SP1, and a drain $P^+$ layer Pd1 and a source $P^+$ layer Ps1, which are present over and under the gate Gp1 and within the Si pillar SP1. The P-channel SGT Pc2 is constituted by a channel portion of the Si pillar SP1, a gate Gp2 surrounding this portion of the Si pillar SP1, and a drain $P^+$ layer Pd2 and a source $P^+$ layer Ps2, which are present over and under the gate Gp2 and within the Si pillar SP1.

In the Si pillar SP2, the N-channel SGT Nc1 in FIG. 1A is formed in an upper portion, and the N-channel SGT Nc2 in FIG. 1A is formed in a lower portion. The N-channel SGTs Nc1 and Nc2 are isolated from each other by a $SiO_2$ layer Ox2, which is formed in an intermediate portion of the Si pillar SP2. The N-channel SGT Nc1 is constituted by a channel portion of the Si pillar SP2, a gate Gn1 surrounding this portion of the Si pillar SP2, and a drain $N^+$ layer Nd1 and a source $N^+$ layer Ns1, which are formed over and under the gate Gn1 and within the Si pillar SP2. The N-channel SGT Nc2 is constituted by a channel portion of the Si pillar SP2, a gate Gn2 surrounding this portion of the Si pillar SP2, and a drain $N^+$ layer Nd2 and a source $N^+$ layer Ns2, which are formed over and under the gate Gn2 and within the Si pillar SP2.

In the Si pillar SP3, the N-channel SGT SN1 in FIG. 1A is formed in an upper portion, and the N-channel SGT SN2 in FIG. 1A is formed in a lower portion. The N-channel SGTs SN1 and SN2 are isolated from each other by a $SiO_2$ layer Ox3, which is formed in an intermediate portion of the Si pillar SP3. The N-channel SGT SN1 is constituted by a channel portion of the Si pillar SP3, a gate Gs1 surrounding this portion of the Si pillar SP3, and a drain $N^+$ layer Sd1 and a source $N^+$ layer Ss1, which are formed over and under the gate Gs1 and within the Si pillar SP3. The N-channel SGT SN2 is constituted by a channel portion of the Si pillar SP3, a gate Gs2 surrounding this portion of the Si pillar SP3, and a drain $N^+$ layer Sd2 and a source $N^+$ layer Ss2, which are formed over and under the gate Gs2 and within the Si pillar SP3.

As illustrated in FIG. 1B, components positioned at the same heights are connected to each other in the Si pillars SP1, SP2, and SP3. Specifically, the gates Gp1 and Gn1 are connected to each other; the drain $P^+$ layer Pd1, the drain $N^+$ layer Nd1, and the drain $N^+$ layer Sd1 are connected together; the drain $P^+$ layer Pd2, the drain $N^+$ layer Nd2, and the drain $N^+$ layer Sd2 are connected together; and the gates Gp2 and Gn2 are connected to each other. Furthermore, the gates Gp1 and Gn1, the drain $P^+$ layer Pd2, the drain $N^+$ layer Nd2, and the drain $N^+$ layer Sd2 are connected together; and the gates Gp2 and Gn2, the drain $P^+$ layer Pd1, the drain $N^+$ layer Nd1, and the drain $N^+$ layer Sd1 are connected together.

As illustrated in FIG. 1B, the source $P^+$ layers Ps1 and Ps2 in the Si pillar SP1 are connected to the power supply terminal Vdd; the source $N^+$ layers Ns1 and Ns2 in the Si pillar SP2 are connected to the ground terminal Vss; the source $N^+$ layer Ss1 in the Si pillar SP3 is connected to the bit line terminal BLt; the source $N^+$ layer Ss2 in the Si pillar SP3 is connected to the inverted bit line terminal BLRt; and the gates Gs1 and Gs2 in the Si pillar SP3 are connected to the word line terminal WLt.

As illustrated in FIG. 1B, the circuit area C1 in the circuit diagram in FIG. 1A is formed in an upper portion of the Si pillars SP1, SP2, and SP3, and the circuit area C2 in the circuit diagram in FIG. 1A is formed in a lower portion of the Si pillars SP1, SP2, and SP3. Components at the same heights in the Si pillars SP1, SP2, and SP3 are connected to each other without a vertical connection path between Si pillars. Specifically, the gates Gp1 and Gn1 are connected to each other without a vertical connection path between the Si pillars SP1 and SP2; the drain $P^+$ layer Pd1 and the drain $N^+$ layers Nd1 and Sd1 are connected together without vertical connection paths between the Si pillars SP1, SP2, and SP3; the drain $P^+$ layer Pd2 and the drain $N^+$ layers Nd2 and Sd2 are connected together without vertical connection paths between the Si pillars SP1, SP2, and SP3; similarly, the gates Gp2 and Gn2 are connected to each other without a vertical connection path between the Si pillars SP1 and SP2. By contrast, the connection of the gates Gp1 and Gn1 to the drain $P^+$ layer Pd2 and the drain $N^+$ layer Nd2 needs to be formed via a vertical connection path. Similarly, the connection of the gates Gp2 and Gn2 to the drain $P^+$ layer Pd1 and the drain $N^+$ layer Nd1 is formed via a vertical connection path.

Figure 2A:
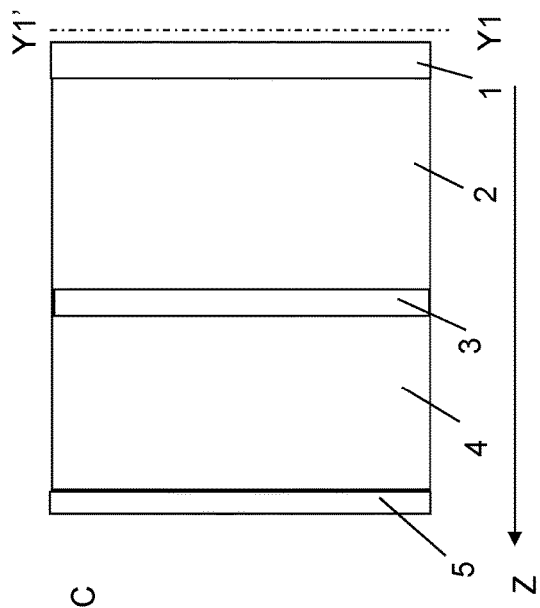
FIGS. 2AA to 2AD are a plan view and sectional structural views that illustrate a method for producing an SGT-including pillar-shaped semiconductor device according to a first embodiment.
Figure 2A:
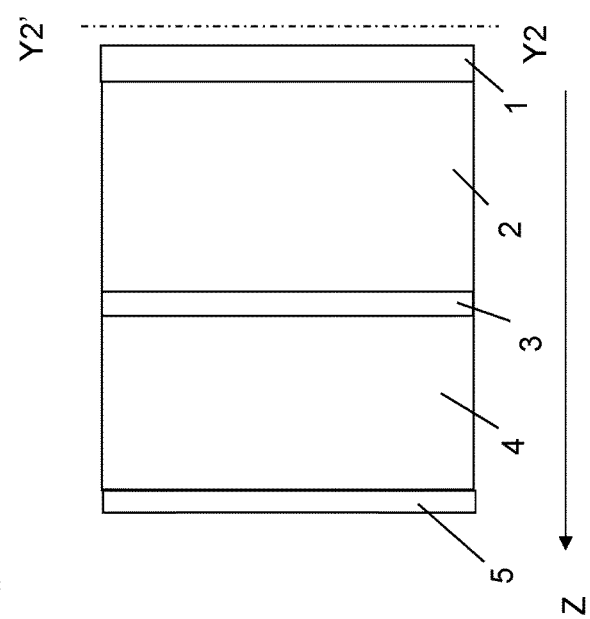
Figure 2A:
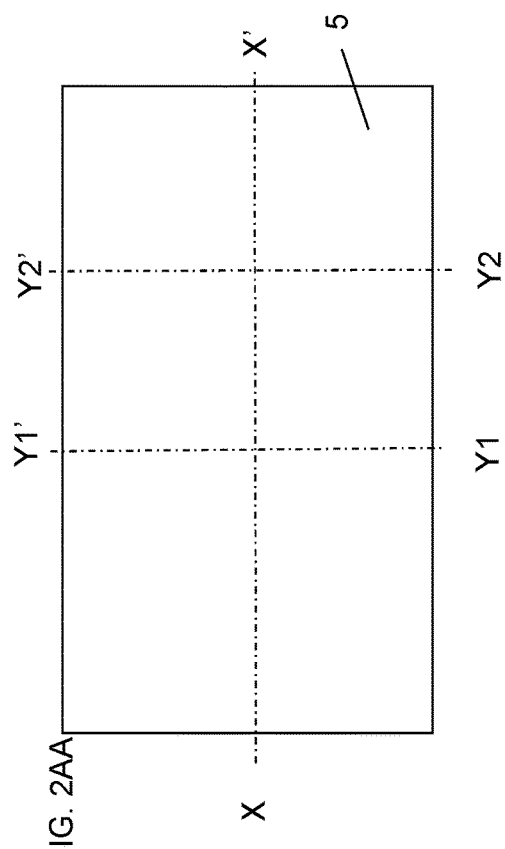
Figure 2A:
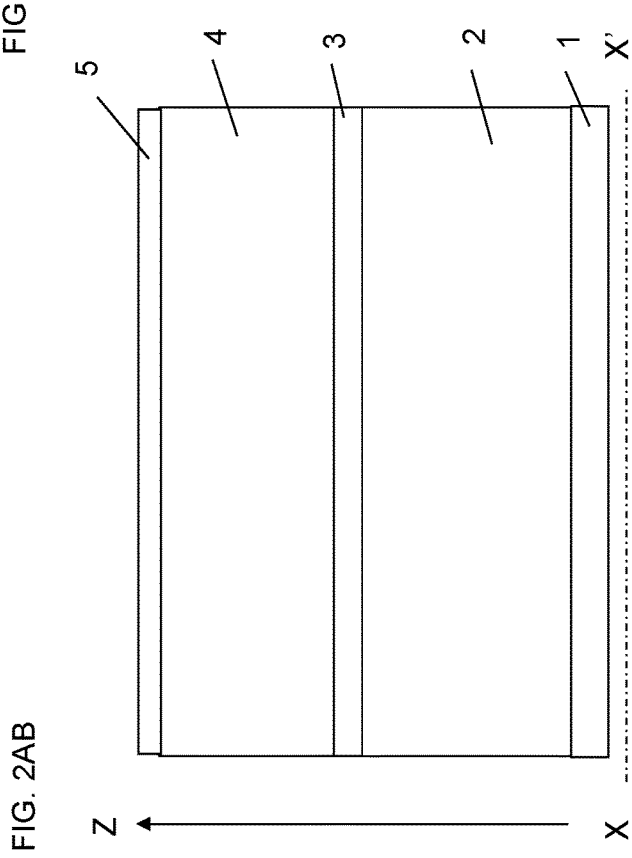

FIGS. 2AA to 2AD are a plan view and sectional views for illustrating a step for producing an SRAM cell circuit that is an SGT-including pillar-shaped semiconductor device. Among FIG. 2AA to FIG. 2WD, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; and figures suffixed with D are sectional structural views taken along lines Y2-Y2' in the corresponding figures suffixed with A.

As illustrated in FIGS. 2AA to 2AD, on a $SiO_2$ layer substrate 1, an i layer 2, a $SiO_2$ layer 3, an i layer 4, and a $SiO_2$ layer 5 are formed so as to be stacked.

Figure 2B:
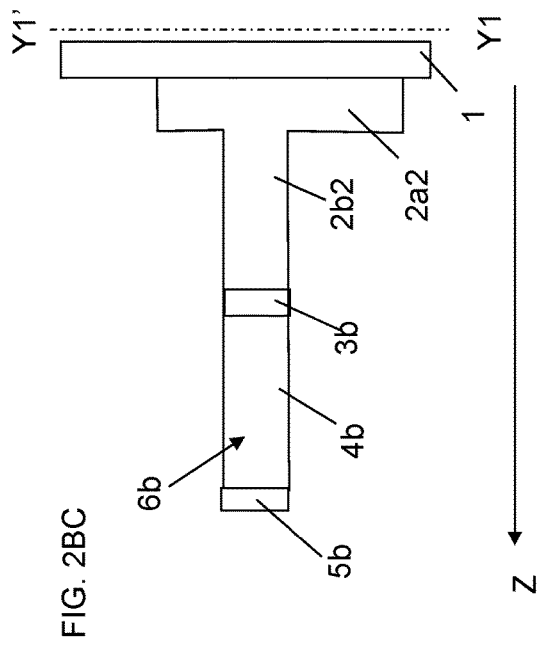
FIGS. 2BA to 2BD are a plan view and sectional structural views that illustrate a method for producing an SGT-including pillar-shaped semiconductor device according to a first embodiment.
Figure 2B:
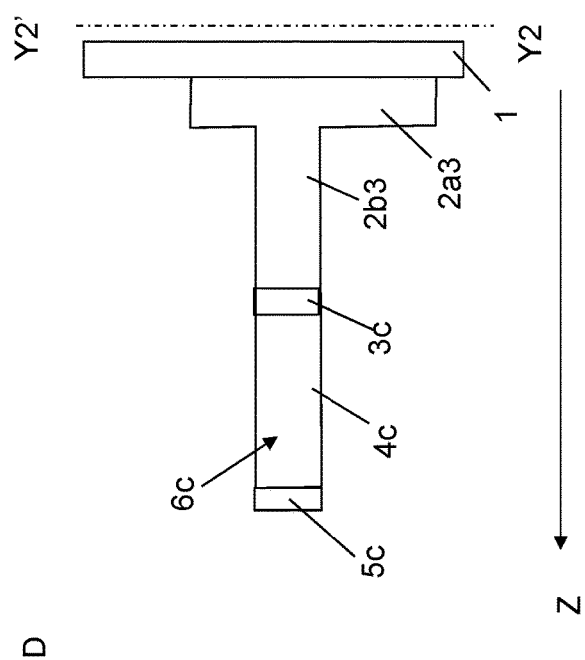
Figure 2B:
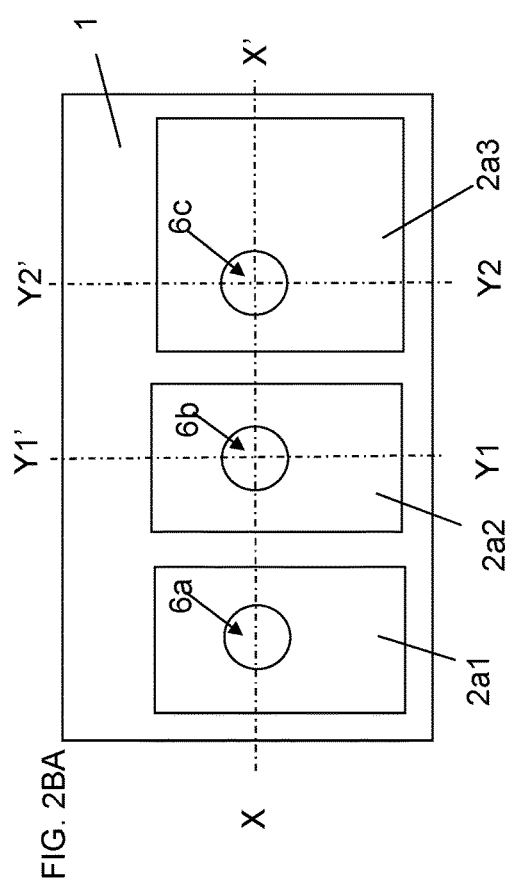
Figure 2B:
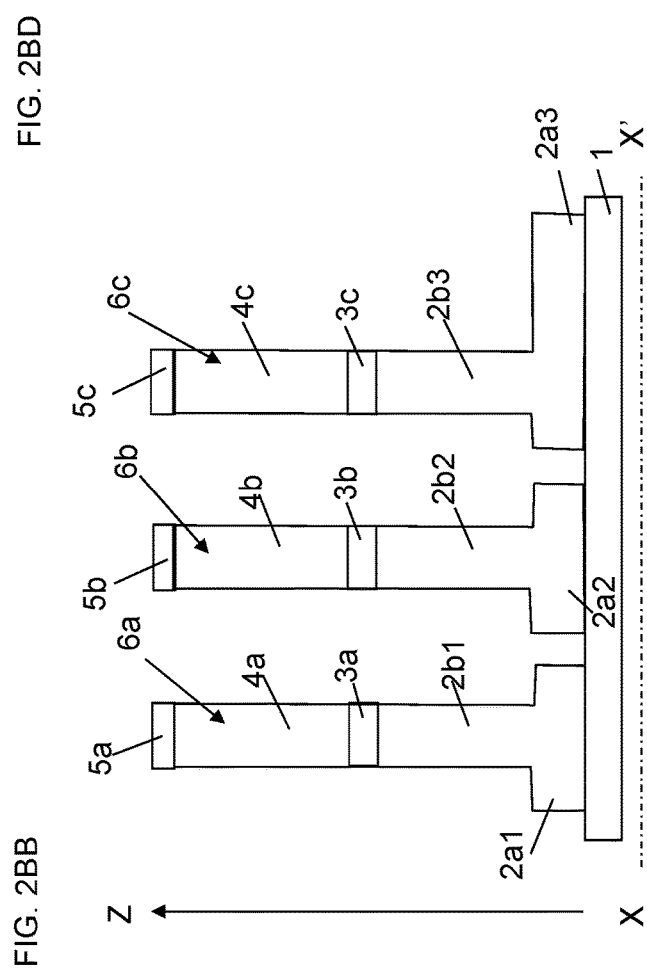

Subsequently, as illustrated in FIGS. 2BA to 2BD, a lithographic process and an RIE (Reactive Ion Etching) process are carried out through a resist layer (not shown) serving as a mask to form $SiO_2$ layers 5a, 5b, and 5c, which are circular in plan view. Subsequently, an RIE process is carried out through the resist layer and the $SiO_2$ layers 5a, 5b, and 5c serving as masks to etch the i layer 4, the $SiO_2$ layer 3, and the i layer 2 such that a lower layer of the i layer 2 is left on the $SiO_2$ layer substrate 1 to thereby form Si pillars 6a, 6b, and 6c. Subsequently, the resist layer is removed. As a result, the Si pillar 6a is formed so as to include an i layer 2b1, a $SiO_2$ layer 3a, an i layer 4a, and a $SiO_2$ layer 5a; the Si pillar 6b is formed so as to include an i layer 2b2, a $SiO_2$ layer 3b, an i layer 4b, and a $SiO_2$ layer 5b; and the Si pillar 6c is formed so as to include an i layer 2b3, a $SiO_2$ layer 3c, an i layer 4c, and a $SiO_2$ layer 5c.

Subsequently, a lithographic process and an RIE process are carried out to etch the i layer 2 remaining as a lower layer, to thereby form an i layer 2a1 in an outer peripheral portion around the Si pillar 6a, an i layer 2a2 in an outer peripheral portion around the Si pillar 6b, and an i layer 2a3 in an outer peripheral portion around the Si pillar 6c.

Figure 2C:
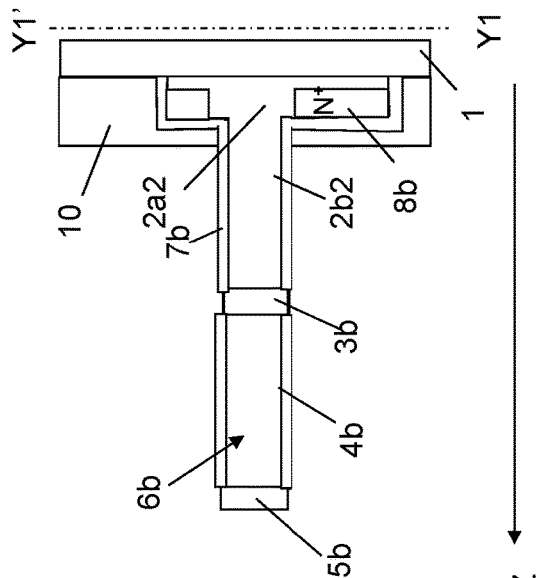
FIGS. 2CA to 2CD are a plan view and sectional structural views that illustrate a method for producing an SGT-including pillar-shaped semiconductor device according to a first embodiment.
Figure 2C:
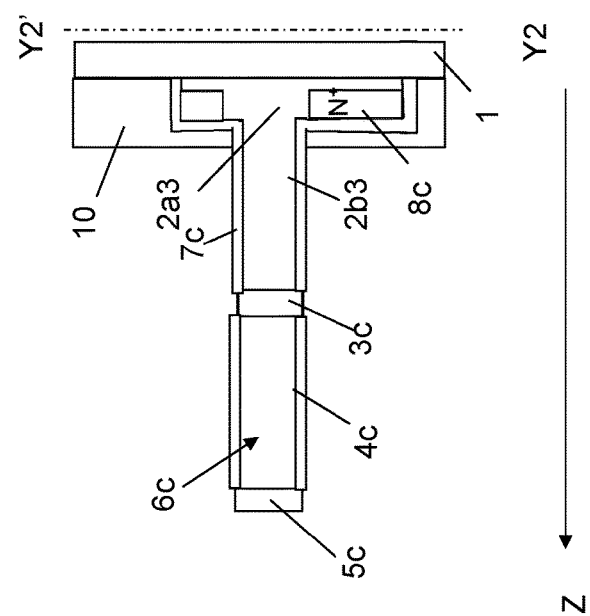
Figure 2C:
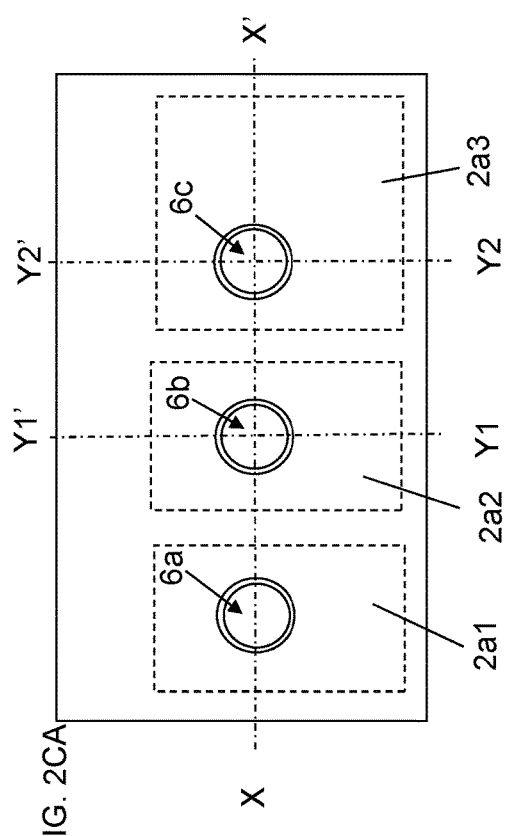
Figure 2C:
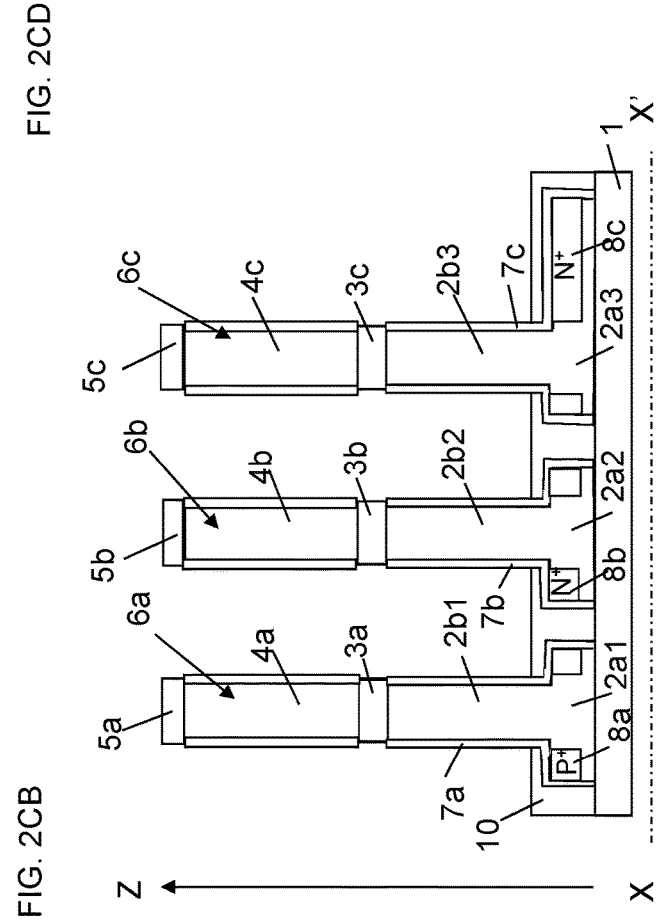

Subsequently, as illustrated in FIGS. 2CA to 2CD, for example, thermal oxidation is carried out, to thereby form $SiO_2$ layers 7a, 7b, and 7c on the outer peripheries of the Si pillars 6a, 6b, and 6c and the i layers 2a1, 2a2, and 2a3. Subsequently, a lithographic process and an ion implantation process are carried out such that a $P^+$ layer 8a is formed in the i layer 2a1 in the outer peripheral portion around the Si pillar 6a, an $N^+$ layer 8b is formed in the i layer 2a2 in the outer peripheral portion around the Si pillar 6b, and an $N^+$ layer 8c is formed in the i layer 2a3 in the outer peripheral portion around the Si pillar 6c. Subsequently, a $SiO_2$ layer 10 is formed so as to surround lower portions of the Si pillars 6a, 6b, and 6c and surround the i layers 2a1, 2a2, and 2a3.

Figure 2D:
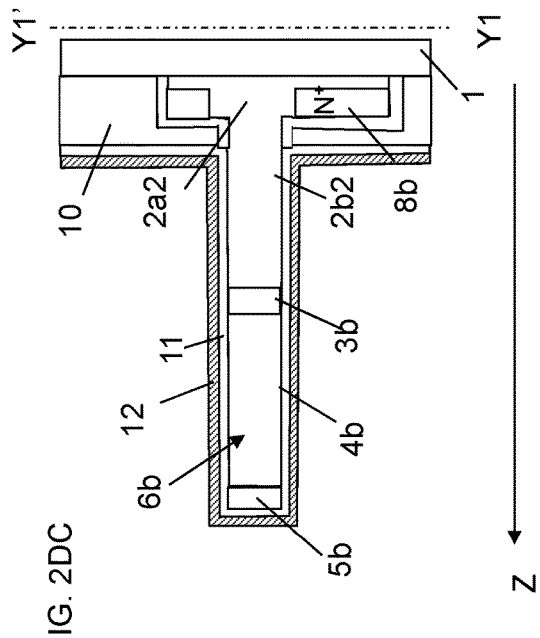
FIGS. 2DA to 2DD are a plan view and sectional structural views that illustrate a method for producing an SGT-including pillar-shaped semiconductor device according to a first embodiment.
Figure 2D:
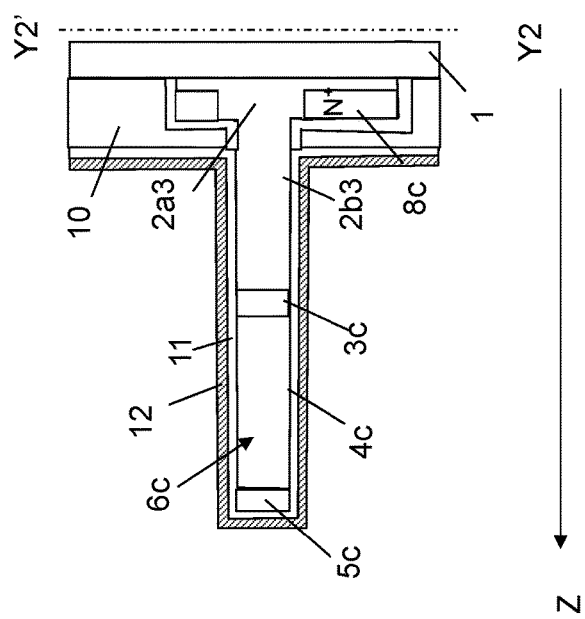
Figure 2D:
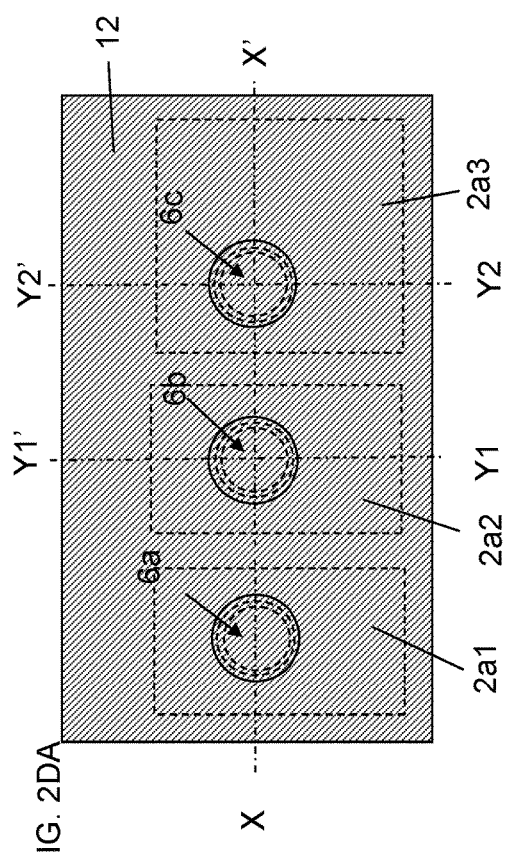
Figure 2D:
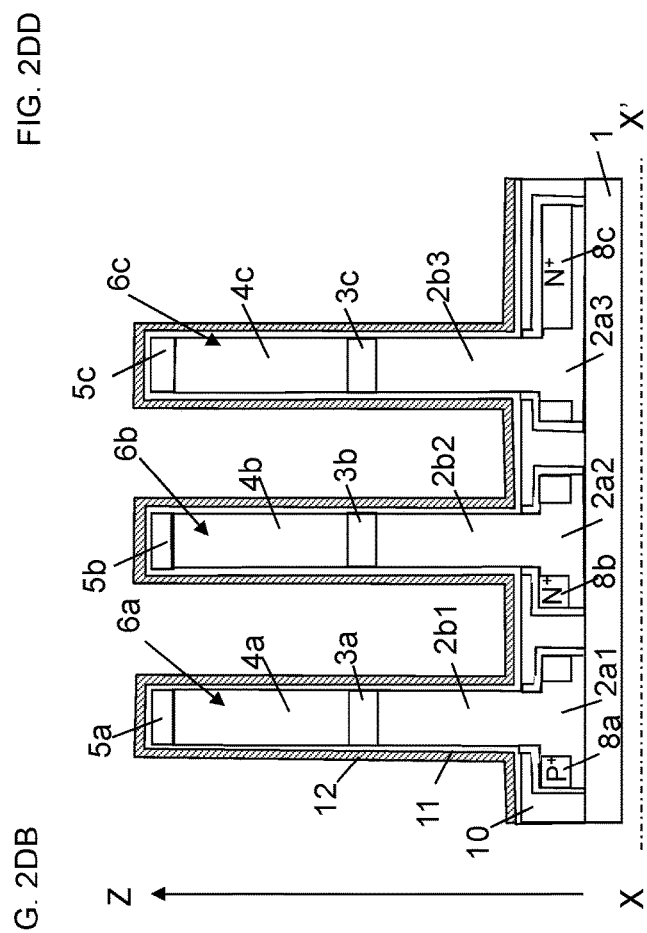

Subsequently, as illustrated in FIGS. 2DA to 2DD, portions of the $SiO_2$ layers 7a, 7b, and 7c above the $SiO_2$ layer 10 are removed. Subsequently, a hafnium oxide ($HfO_2$) layer 11 and a titanium nitride (TiN) layer 12 are sequentially formed so as to cover the Si pillars 6a, 6b, and 6c and the $SiO_2$ layer 10 by, for example, ALD (Atomic Layer Deposition) processes. In the end, the $HfO_2$ layer 11 will function as gate insulating layers of SGTs; and the TiN layer 12 will function as gate conductor layers of SGTs.

Figure 2E:
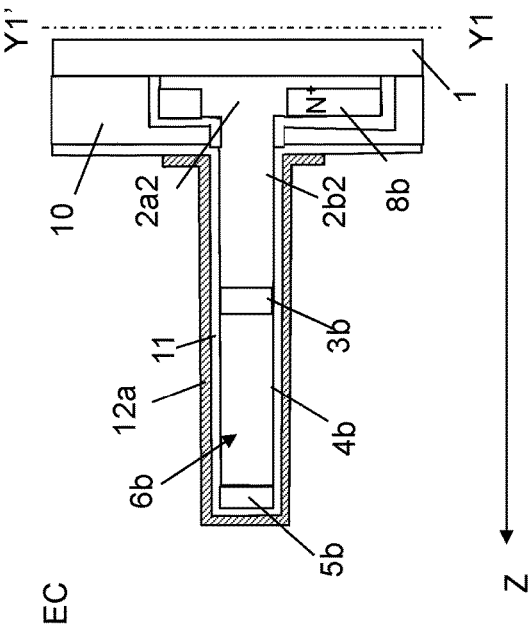
FIGS. 2EA to 2ED are a plan view and sectional structural views that illustrate a method for producing an SGT-including pillar-shaped semiconductor device according to a first embodiment.
Figure 2E:
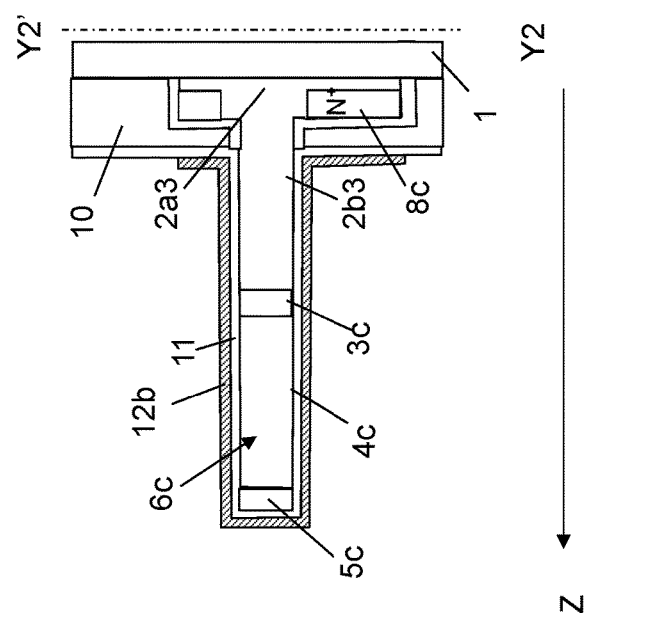
Figure 2E:
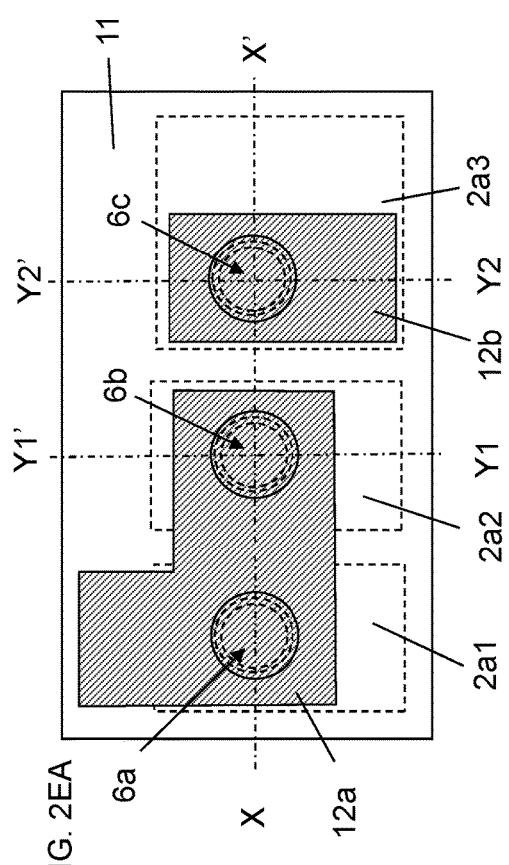
Figure 2E:
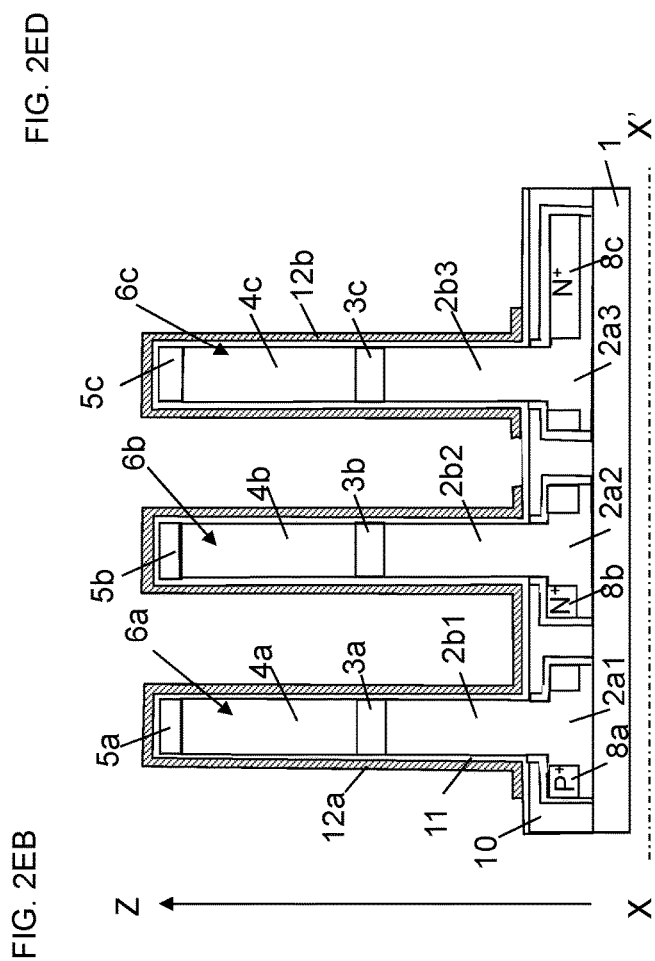

Subsequently, as illustrated in FIGS. 2EA to 2ED, a lithographic process and an RIE process are carried out to form a TiN layer 12a surrounding the Si pillars 6a and 6b, and a TiN layer 12b surrounding the Si pillar 6c.

Subsequently, as illustrated in FIGS. 2FA to 2FD, a $SiO_2$ layer 14 is formed so as to cover the whole structure. Subsequently, a heat treatment is carried out to thermally diffuse the donor/acceptor impurity atoms in the $P^-$ layer 8a and the $N^+$ layers 8b and 8c to the entirety of the i layers 2a1, 2a2, and 2a3, to thereby form a $P^-$ layer 8aa and $N^-$ layers 8bb and 8cc. Subsequently, a silicon nitride (SiN) layer 15 is formed around the outer peripheries of the Si pillars 6a, 6b, and 6c. Subsequently, a resist layer 16 is formed on the SiN layer 15. The resist layer 16 is formed such that the $SiO_2$ layers 3a, 3b, and 3c are positioned in the center portions (in the vertical direction) of the resist layer 16. The resist layer 16 is formed in the following manner: a resist material is applied to the Si pillars 6a, 6b, and 6c and the upper surface of the SiN layer 15; subsequently, a heat treatment at 200° C., for example, is carried out to enhance the fluidity of the resist material, so that the resist material is uniformly distributed around the Si pillars 6a, 6b, and 6c and over the SiN layer 15. Subsequently, a hydrogen fluoride gas (hereafter, referred to as an "HF gas") is supplied to the whole structure. Subsequently, an environment of heating at 180° C., for example, is provided, so that the HF gas is ionized due to moisture contained within the resist layer 16, to form hydrogen fluoride ions ($HF_2^+$) (hereafter, referred to as "HF ions"). These HF ions diffuse through the resist layer 16 to etch portions of the $SiO_2$ layer 14 that are in contact with the resist layer 16 (regarding the mechanism of this etching, refer to Tadashi Shibata, Susumu Kohyama and Hisakazu Iizuka: "A New Field Isolation Technology for High Density MOS LSI", Japanese Journal of Applied Physics, Vol. 18, pp. 263-267 (1979)). On the other hand, the other portions of the $SiO_2$ layer 14 that are not in contact with the resist layer 16 are substantially left without being etched. Subsequently, the resist layer 16 is removed.

Figure 2G:
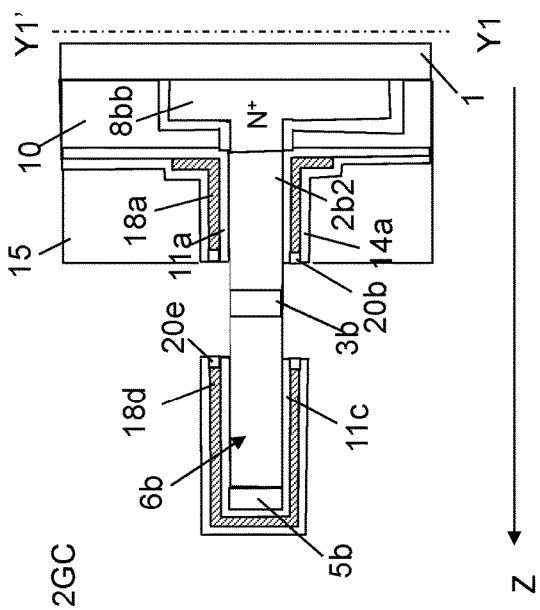
FIGS. 2GA to 2GD are a plan view and sectional structural views that illustrate a method for producing an SGT-including pillar-shaped semiconductor device according to a first embodiment.
Figure 2G:
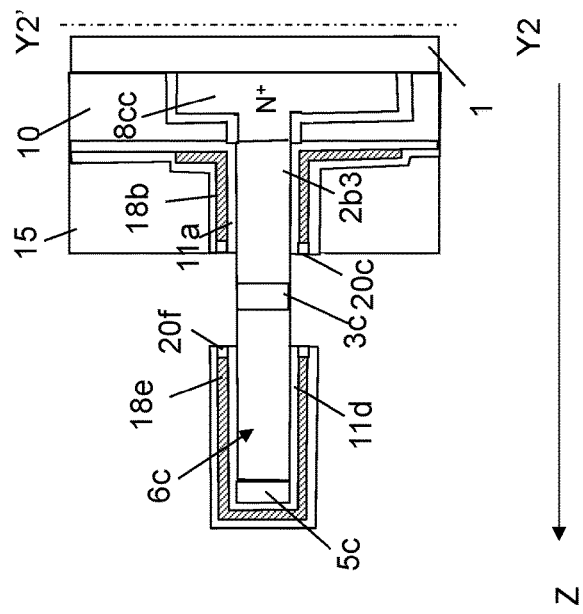
Figure 2G:
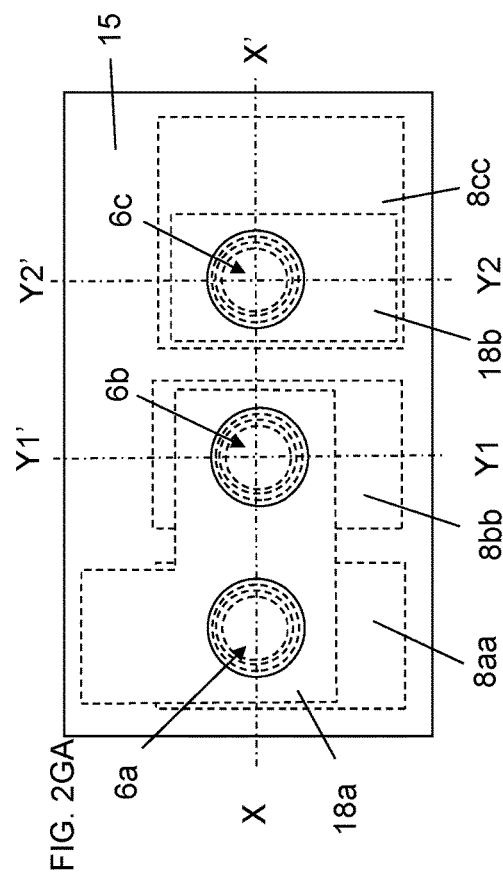
Figure 2G:
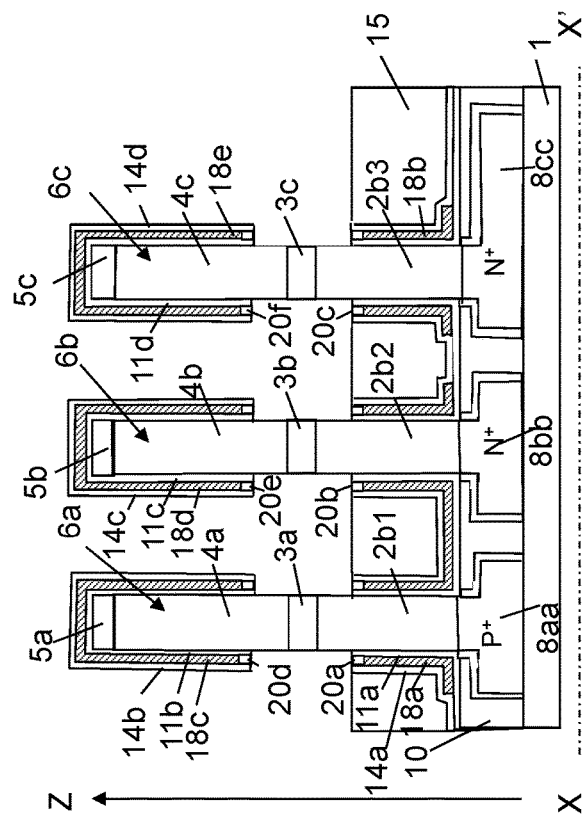

As a result, as illustrated in FIGS. 2GA to 2GD, the $SiO_2$ layer 14 is divided into a $SiO_2$ layer 14a, which is covered by the SiN layer 15, and $SiO_2$ layers 14b, 14c, and 14d, which are upper regions in the Si pillars 6a, 6b, and 6c. Subsequently, the TiN layers 12a and 12b are etched through the $SiO_2$ layers 14a, 14b, 14c, and 14d and the SiN layer 15 serving as masks. As a result, the TiN layer 12a is divided into a TiN layer 18a, which is in lower regions around the Si pillars 6a and 6b and covered by the SiN layer 15, a TiN layer 18c, which is covered by the $SiO_2$ layer 14b, and a TiN layer 18d, which is covered by the $SiO_2$ layer 14c; and the TiN layer 12b is divided into a TiN layer 18b, which is in a lower region around the Si pillar 6c and covered by the SiN layer 15, and a TiN layer 18e, which is covered by the $SiO_2$ layer 14d. Subsequently, the $HfO_2$ layer 11 is etched through the $SiO_2$ layers 14a, 14b, and 14c and the TiN layers 18a, 18b, 18c, 18d, and 18e serving as masks. As a result, the $HfO_2$ layer 11 is divided into a $HfO_2$ layer 11a, which is in lower regions around the Si pillars 6a, 6b, and 6c and covered by the TiN layers 18a and 18b, and $HfO_2$ layers 11b, 11c, and 11d, which are in upper regions around the Si pillars 6a, 6b, and 6c and respectively covered by the TiN layers 18c, 18d, and 18e. Subsequently, an exposed portion of the TiN layer 18a around the Si pillar 6a, an exposed portion of the TiN layer 18a around the Si pillar 6b, and the exposed portions of the TiN layers 18b, 18c, 18d, and 18e are oxidized to thereby form TiO (titanium oxide) layers 20a, 20b, 20c, 20d, 20e, and 20f. Subsequently, $SiO_2$ layers (not shown) are removed that are formed on the side surfaces of the Si pillars 6a, 6b, and 6c during formation of the TiO layers 20a, 20b, 20c, 20d, 20e, and 20f.

Subsequently, as illustrated in FIGS. 2HA to 2HD, for example, a bias sputtering process is carried out in the following manner: a substrate metal plate on which the $SiO_2$ layer substrate 1 is disposed and an opposite metal plate separated from the substrate metal plate are prepared; a direct-current voltage is applied to the substrate metal plate, and an RF voltage is applied across these two parallel metal plates, to thereby sputter the material atoms of the opposite metal plate onto the $SiO_2$ layer substrate 1. In this way, Ni atoms are directed to, in a direction perpendicular to, the upper surface of the $SiO_2$ layer substrate 1, to thereby form a Ni layer 21a on the SiN layer 15. Similarly, bias sputtering processes are carried out to thereby sequentially stack the following layers: a P-type poly-Si layer 22a containing boron (B) as an impurity, a $SiO_2$ layer 23a, a Ni layer 21b, a P-type poly-Si layer 22b, and a $SiO_2$ layer 23b. Incidentally, the $SiO_2$ layer 23b is formed such that its upper surface is in contact with the $SiO_2$ layers 14b, 14c, and 14d, which cover upper portions of the Si pillars 6a, 6b, and 6c. The Ni atoms, the poly-Si atoms, and the $SiO_2$ atoms are directed to, in a direction perpendicular to, the upper surface of the $SiO_2$ layer substrate 1. As a result, sealed spaces 25a, 25b, and 25c are formed between the outer peripheral side surfaces of the Si pillars 6a, 6b, and 6c and the Ni layers 21a and 21b, the P-type poly-Si layers 22a and 22b, and the $SiO_2$ layers 23a and 23b. Subsequently, stacked films (not shown) are removed that are formed over the top of the Si pillars 6a, 6b, and 6c during formation of the stacked films on the SiN layer 15 that are constituted by the Ni layers 21a and 21b, the P-type poly-Si layers 22a and 22b, and the $SiO_2$ layers 23a and 23b.

Subsequently, as illustrated in FIGS. 2IA to 2ID, a resist layer 27 is formed so as to cover the Si pillar 6a. Subsequently, ion implantation of arsenic (As) atoms is carried out from above the upper surface of the $SiO_2$ layer substrate 1, to thereby turn the P-type poly-Si layers 22a and 22b in the outer peripheral portions around the Si pillars 6b and 6c, into $N^+$ layers. Thus, $N^+$-type poly-Si layers 26a and 26b are formed. Subsequently, the resist layer 27 is removed.

Subsequently, as illustrated in FIGS. 2JA to 2JD, for example, a heat treatment at 550° C. is carried out, so that Ni atoms in the Ni layers 21a and 21b are diffused into the P-type poly-Si layers 22a and 22b and the N$^+$-type poly-Si layers 26a and 26b, to thereby form nickel silicide (NiSi) layers 28a and 28b. The NiSi layers 28a and 28b have volumes expanded from the volumes of the P-type poly-Si layers 22a and 22b and the N$^+$-type poly-Si layers 26a and 26b (regarding this expansion in the volumes, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Since the P-type poly-Si layers 22a and 22b and the N$^+$-type poly-Si layers 26a and 26b are held between the SiN layer 15 and the SiO$_2$ layers 23a and 23b, the NiSi layers 28a and 28b mainly protrude into the spaces 25a, 25b, and 25c. The As atoms contained in the N$^+$-type poly-Si layers 26a and 26b and the B atoms contained in the P-type poly-Si layers 22a and 22b are pushed outward in the NiSi layers 28a and 28b (regarding this push-out phenomenon, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). As a result of this impurity-atom push-out effect, protrusions (not shown) having high contents of impurity atoms are formed in the surface layers of the sides of the NiSi layers 28a and 28b, which protrude into the spaces 25a, 25b, and 25c. The side surfaces of the protrusions are in contact with the surfaces of the Si pillars 6a, 6b, and 6c.

Subsequently, as illustrated in FIGS. 2KA to 2KD, a heat treatment is carried out to cause silicide expansion of the NiSi layers 28a and 28b, and to diffuse, by the impurity push-out effect, from the protrusions, As atoms and B atoms into the Si pillars 6a, 6b, and 6c. As a result, NiSi layers 30a, 30b, and 30c are respectively formed in the surface layers of the sides of the Si pillars 6a, 6b, and 6c in contact with the NiSi layer 28a; and B atoms and As atoms are diffused, by the impurity push-out effect, into the Si pillars 6a, 6b, and 6c, to thereby form a P$^+$ layer 31a and N$^+$ layers 31b and 31c respectively within the Si pillars 6a, 6b, and 6c. Similarly, NiSi layers 32a, 32b, and 32c are respectively formed in the surface layers of the sides of the Si pillars 6a, 6b, and 6c in contact with the NiSi layer 28b; and B atoms and As atoms are diffused, by the impurity push-out effect, into the Si pillars 6a, 6b, and 6c, to thereby respectively form a P$^+$ layer 33a and N$^+$ layers 33b and 33c within the Si pillars 6a, 6b, and 6c. In the SiO$_2$ layers 3a, 3b, and 3c, thermal diffusion of donor and acceptor impurity atoms is suppressed and simultaneously formation of silicide is suppressed. As a result, the P$^+$ layer 31a and the N$^+$ layers 31b and 31c are isolated from the P$^+$ layer 33a and the N$^+$ layers 33b and 33c by the SiO$_2$ layers 3a, 3b, and 3c. Subsequently, a lithographic process and an RIE process are carried out to pattern the NiSi layers 28a and 28b and the SiO$_2$ layers 23a and 23b so as to remain in the outer peripheral portions around the Si pillars 6a, 6b, and 6c. As a result, NiSi layers 28aa and 28bb and SiO$_2$ layers 23aa and 23bb are formed.

Subsequently, as illustrated in FIGS. 2LA to 2LD, the same process as in the formation of the SiN layer 15 is carried out to form a SiN layer 35 such that its upper surface is positioned at an intermediate level of (in the height direction of) the TiN layers 18c, 18d, and 18e. Subsequently, the same process as in the formation of the spaces 25a, 25b, and 25c is carried out to form openings in the outer peripheries of the TiN layers 18c, 18d, and 18e. Subsequently, a NiSi layer 36a in contact with the TiN layers 18c and 18d, and a NiSi layer 36b in contact with the TiN layer 18e are formed.

Subsequently, as illustrated in FIGS. 2MA to 2MD, a SiO$_2$ layer 37 is formed such that its upper surface is positioned higher than the surfaces of the NiSi layers 36a and 36b and lower than the top portions of the Si pillars 6a, 6b, and 6c. Subsequently, the SiO$_2$ layers 14b, 14c, and 14d, the TiN layers 18c, 18d, and 18e, and the HfO$_2$ layers 11b, 11c, and 11d in the top portions of the Si pillars 6a, 6b, and 6c are etched off through the SiO$_2$ layer 37 serving as a mask. Subsequently, a lithographic process and an ion implantation process are carried out with the SiO$_2$ layers 37, 14b, 14c, and 14d, the TiN layers 18c, 18d, and 18e, and the HfO$_2$ layers 11b, 11c, and 11d serving as masks, such that boron (B) is ion-implanted into the top portion of the Si pillar 6a to form a P$^+$ layer 38a, and arsenic (As) is ion-implanted into the top portions of the Si pillars 6b and 6c to form N$^+$ layers 38b and 38c.

Figure 2N:
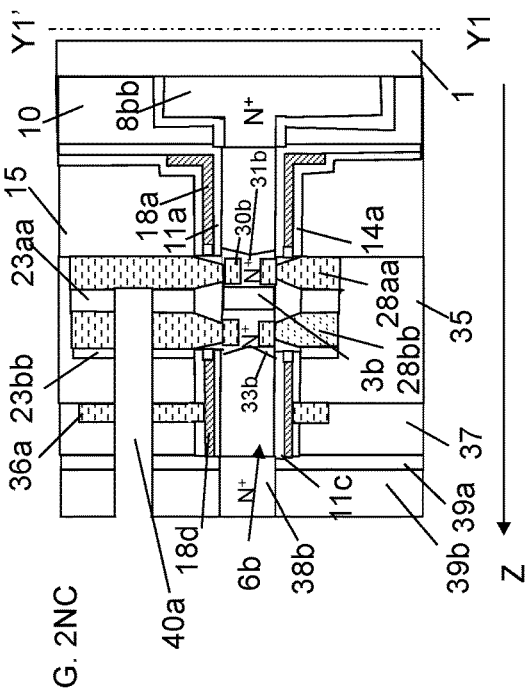
FIGS. 2NA to 2NE are a plan view and sectional structural views that illustrate a method for producing an SGT-including pillar-shaped semiconductor device according to a first embodiment.
Figure 2N:
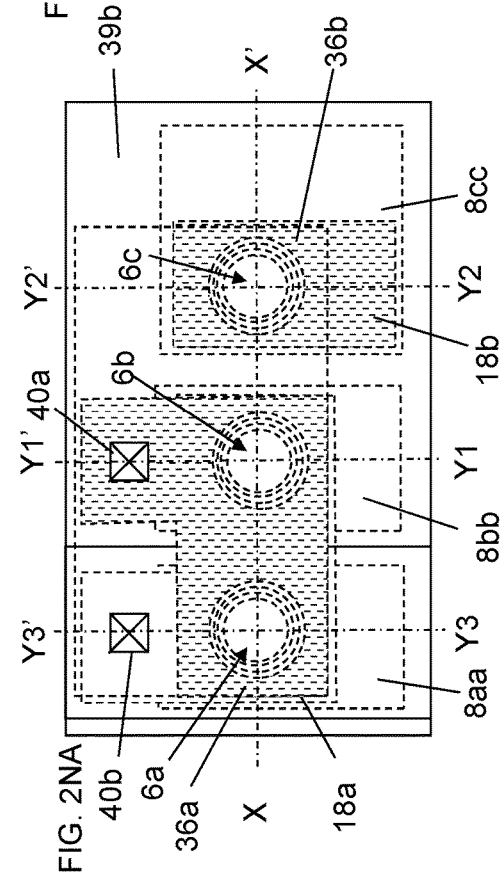
Figure 2N:
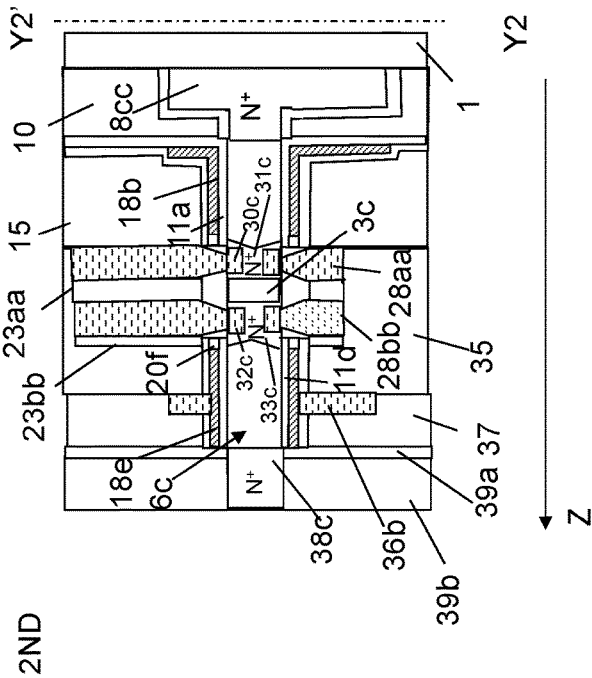
Figure 2N:
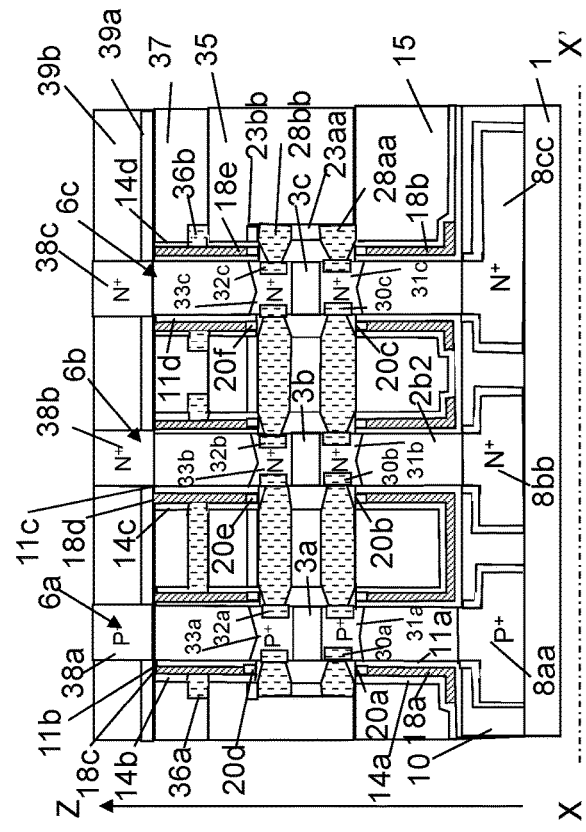
Figure 2N:
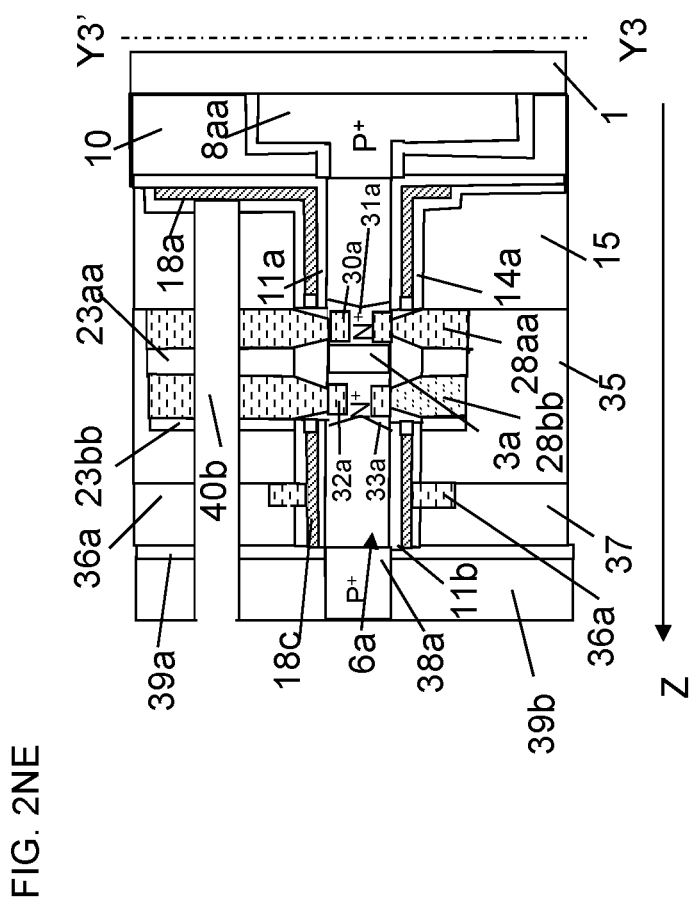

FIGS. 2NA to 2NE illustrate the following steps. Among FIG. 2NE to FIG. 2WE, figures suffixed with E are sectional structural views taken along lines Y3-Y3' in the corresponding figures suffixed with A. As illustrated in FIGS. 2NA to 2NE, in outer peripheral portions around the P$^+$ layer 38a and the N$^+$ layers 38b and 38c and on the SiO$_2$ layer 37, a SiN layer 39a is formed. Subsequently, the whole structure is covered with a SiO$_2$ film (not shown). Subsequently, a CMP process is carried out to form a SiO$_2$ layer 39b having a flat surface such that the level of the upper surface matches with the level of the top portions of the P$^+$ layer 38a and the N$^+$ layers 38b and 38c. Subsequently, a lithographic process and an RIE process are carried out to form, above the NiSi layer 28aa, a contact hole 40a extending through the SiO$_2$ layer 39b, the SiN layer 39a, the SiO$_2$ layer 37, the NiSi layer 36a, the SiN layer 35, the SiO$_2$ layer 23bb, the NiSi layer 28bb, and the SiO$_2$ layer 23aa. Similarly, a lithographic process and an RIE process are carried out to form, above the TiN layer 18a, a contact hole 40b extending through the SiO$_2$ layer 39b, the SiN layer 39a, the SiO$_2$ layer 37, the SiN layer 35, the SiO$_2$ layer 23bb, the NiSi layer 28bb, the SiO$_2$ layer 23aa, the NiSi layer 28aa, the SiN layer 15, and the SiO$_2$ layer 14a.

Figure 2O:
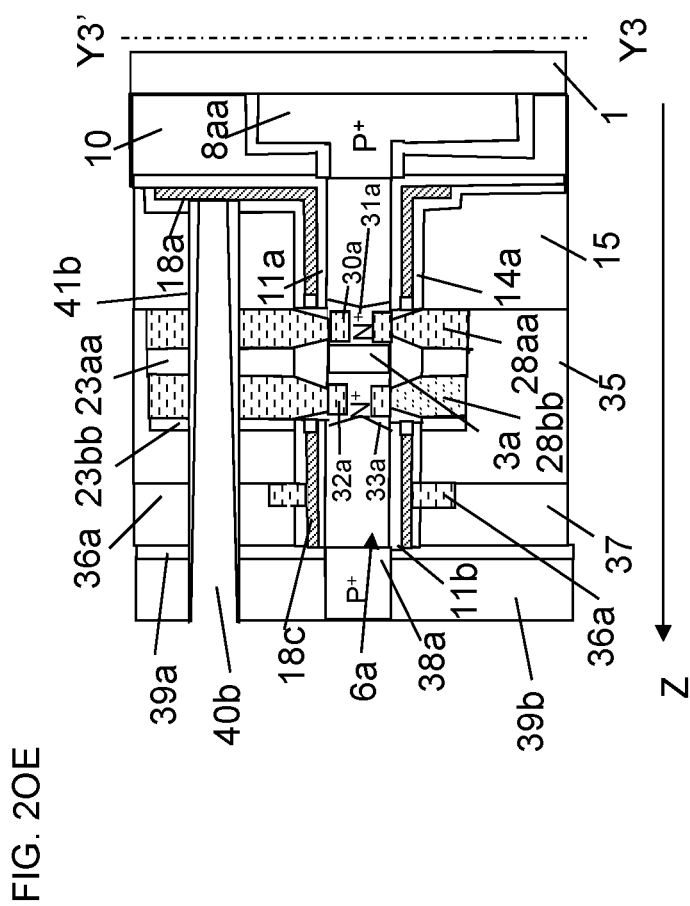
FIGS. 2OA to 2OE are a plan view and sectional structural views that illustrate a method for producing an SGT-including pillar-shaped semiconductor device according to a first embodiment.

Subsequently, an ALD process is carried out to deposit a SiO$_2$ layer (not shown) over the whole structure. Subsequently, as illustrated in FIGS. 2OA to 2OE, an RIE process is carried out such that a SiO$_2$ layer 41a is left on the side surface of the contact hole 40a, and the SiO$_2$ layer on the NiSi layer 28aa is removed; similarly, a SiO$_2$ layer 41b is left on the side surface of the contact hole 40b, and the SiO$_2$ layer on the TiN layer 18a is removed.

Figure 2P:
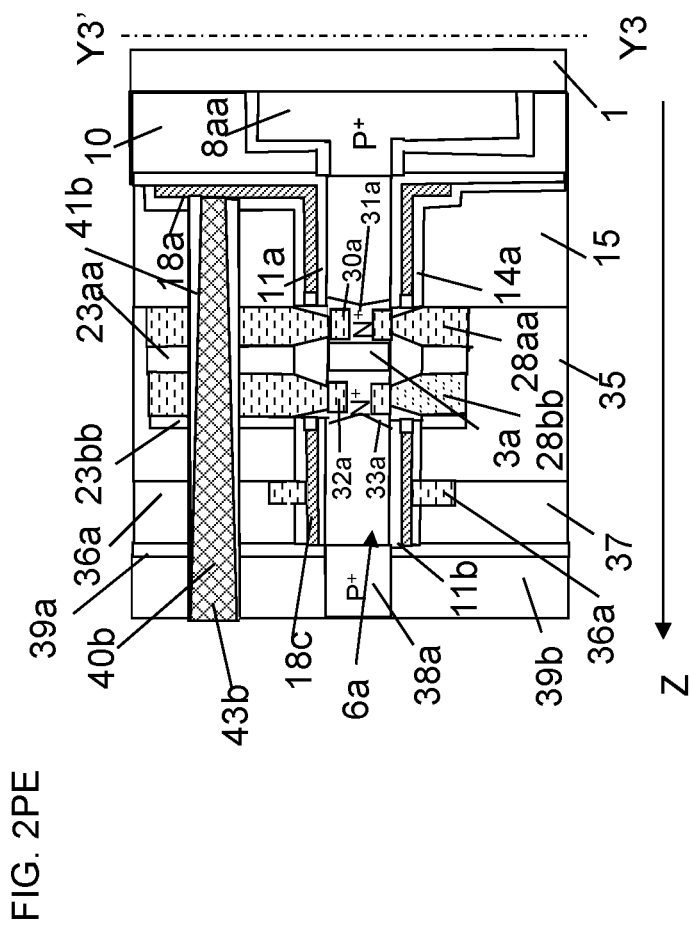
FIGS. 2PA to 2PE are a plan view and sectional structural views that illustrate a method for producing an SGT-including pillar-shaped semiconductor device according to a first embodiment.

Subsequently, an ALD process is carried out over the whole structure such that a tungsten (W) layer (not shown) is deposited into the contact holes 40a and 40b and on the SiO$_2$ layer 39b. Subsequently, as illustrated in FIGS. 2PA to 2PE, an MCP process is carried out to polish the surface layers of the W layer and the SiO$_2$ layer 39b, to form W layers 43a and 43b having upper surfaces positioned at a level matching with the level of the top portions of the P$^+$ layer 38a and the N$^+$ layers 38b and 38c, and the upper surface of the SiO$_2$ layer 39b.

Figure 2Q:
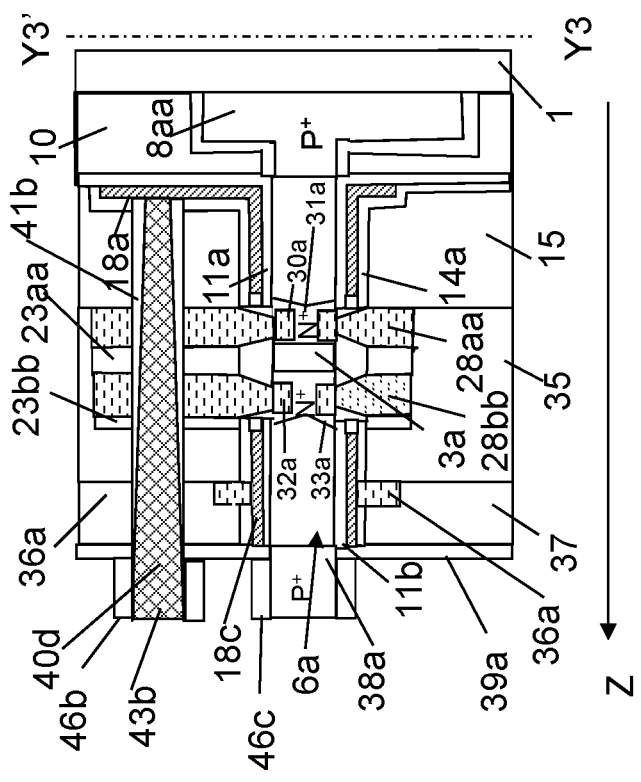
FIGS. 2QA to 2QE are a plan view and sectional structural views that illustrate a method for producing an SGT-including pillar-shaped semiconductor device according to a first embodiment.

Subsequently, the SiO$_2$ layer 39b is removed to expose, above the upper surface of the SiN layer 39a, the P$^+$ layer 38a, the N$^+$ layers 38b and 38c, and the W layers 43a and 43b. Subsequently, a CVD process is carried out to deposit a SiO$_2$ layer (not shown) over the whole structure. Subsequently, as illustrated in FIGS. 2QA to 2QE, an RIE process is carried out to etch the SiO$_2$ layer uniformly to the upper surface of the SiN layer 39a. This leaves SiO$_2$ layers 46a and 46b on the side surfaces of the W layers 43a and 43b, and simultaneously leaves SiO$_2$ layers 46c, 46d, and 46e on the side surfaces of the P$^+$ layer 38a and the N$^+$ layers 38b and 38c.

Figure 2R:
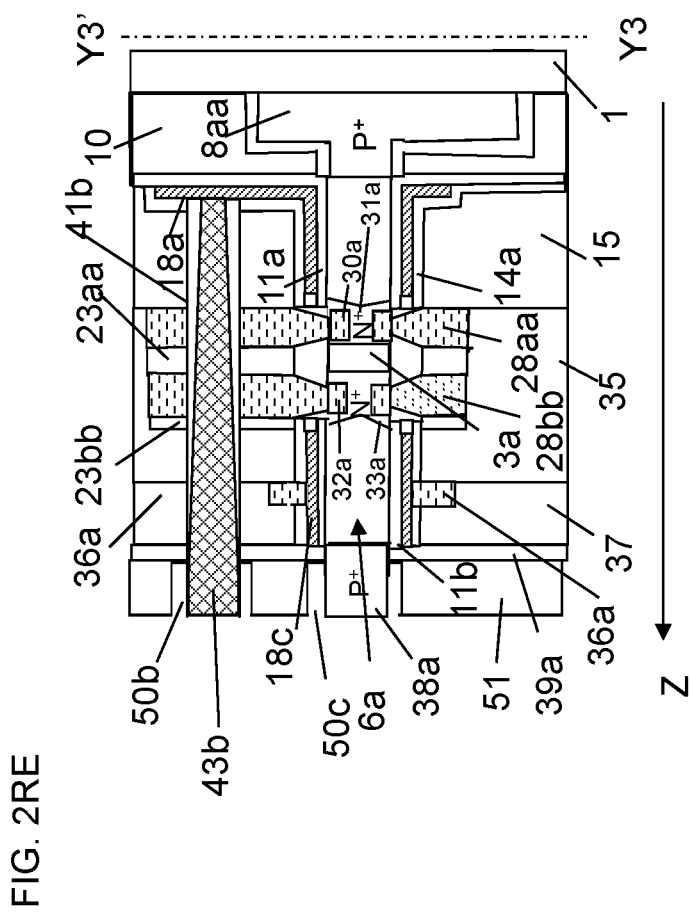
FIGS. 2RA to 2RE are a plan view and sectional structural views that illustrate a method for producing an SGT-including pillar-shaped semiconductor device according to a first embodiment.

Subsequently, a CVD process is carried out to deposit, for example, an aluminum oxide (AlO) insulating layer (not shown) over the whole structure. Subsequently, as illustrated in FIGS. 2RA to 2RE, a CMP process is carried out to flatly polish the AlO layer such that the upper surface of the AlO layer is positioned at the level of the top portions of the P$^+$ layer 38a and the N$^+$ layers 38b and 38c, and the upper surfaces of the W layers 43a and 43b. Thus, an AlO layer 51 is formed. Subsequently, the SiO$_2$ layers 46a, 46b, 46c, 46d, and 46e on the top portions of the P$^+$ layer 38a and the N$^+$ layers 38b and 38c and on the side surfaces of the W layers 43a and 43b are removed. This forms contact holes 50a, 50b, 50c, 50d, and 50e that are ring-shaped and surround the top portions of the P$^+$ layer 38a and the N$^+$ layers 38b and 38c, and the W layers 43a and 43b.

Figure 2S:
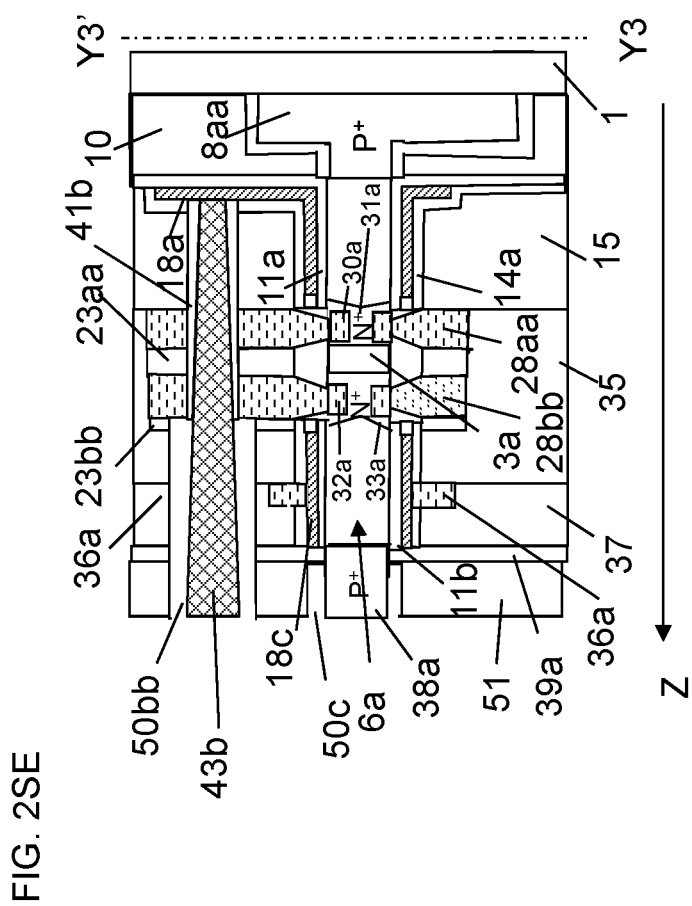
FIGS. 2SA to 2SE are a plan view and sectional structural views that illustrate a method for producing an SGT-including pillar-shaped semiconductor device according to a first embodiment.

Subsequently, a resist layer (not shown) is formed so as to cover the contact holes 50c, 50d, and 50e. Subsequently, as illustrated in FIGS. 2SA to 2SE, an RIE process is carried out through the resist layer and the AlO layer 51 serving as masks, to etch the SiN layer 39a and the SiO$_2$ layer 37 in an outer peripheral portion around the W layer 43a to thereby form a contact hole 50aa above the NiSi layer 36a; similarly, the RIE process is carried out through the resist layer and the AlO layer 51 serving as masks, to etch, in an outer peripheral portion around the W layer 43b, the SiN layer 39a, the SiO$_2$ layer 37, the SiN layer 35, the SiO$_2$ layer 23bb, and the SiO$_2$ layer 41b in contact with these layers, to thereby form a contact hole 50bb above the NiSi layer 28bb.

Figure 2T:
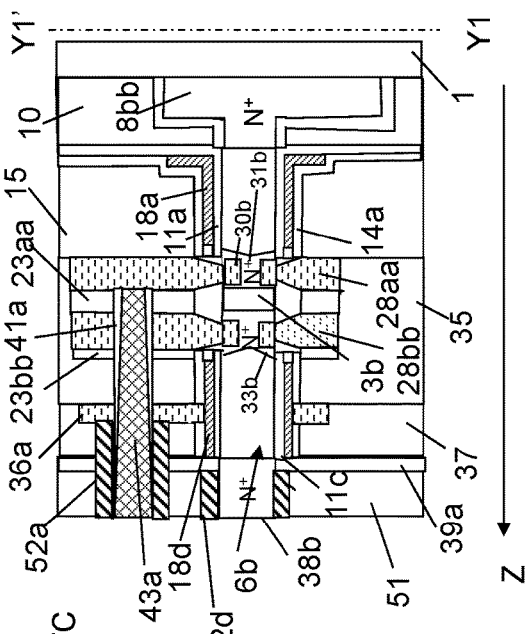
FIGS. 2TA to 2TE are a plan view and sectional structural views that illustrate a method for producing an SGT-including pillar-shaped semiconductor device according to a first embodiment.
Figure 2T:
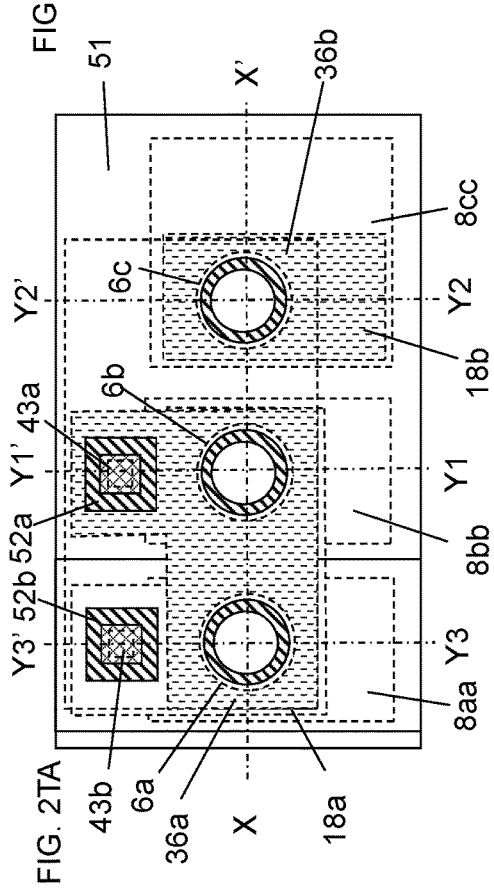
Figure 2T:
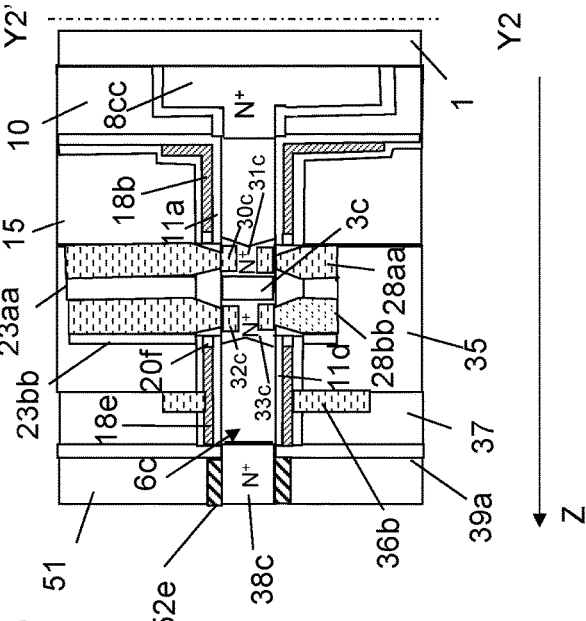
Figure 2T:
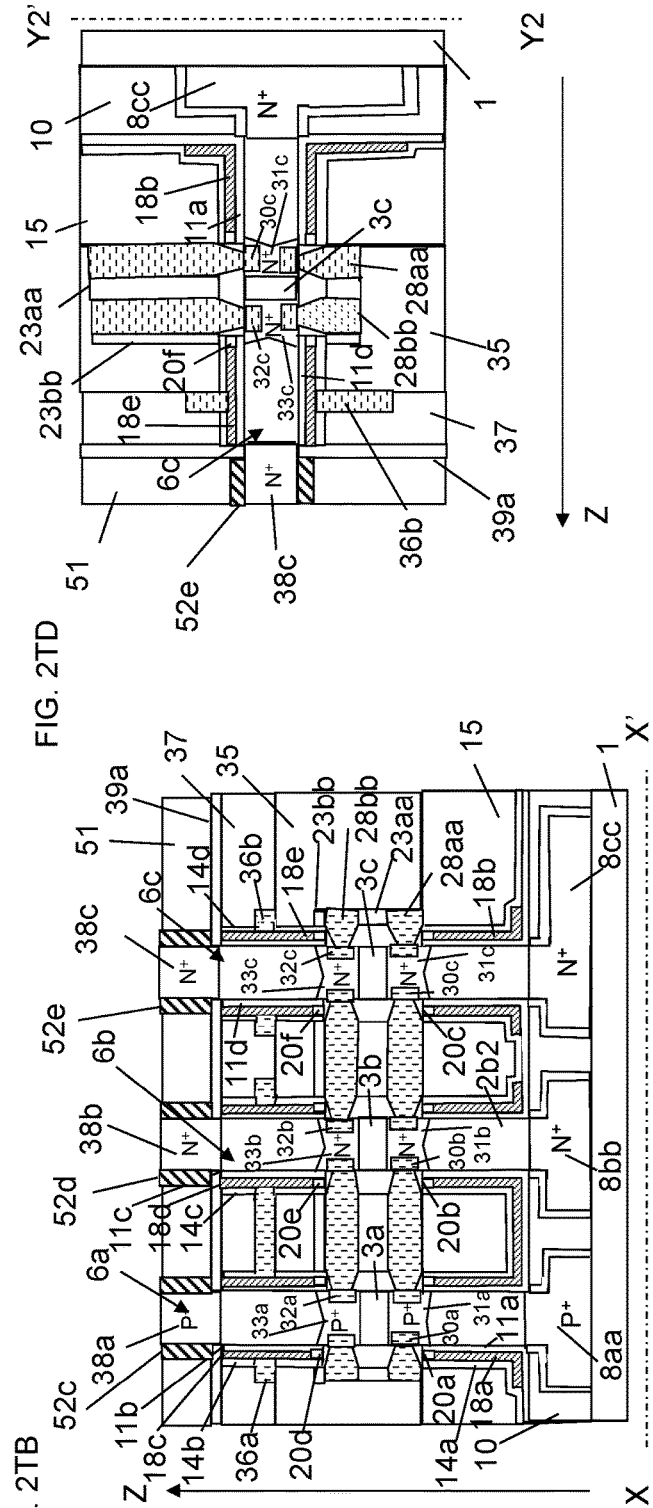
Figure 2T:
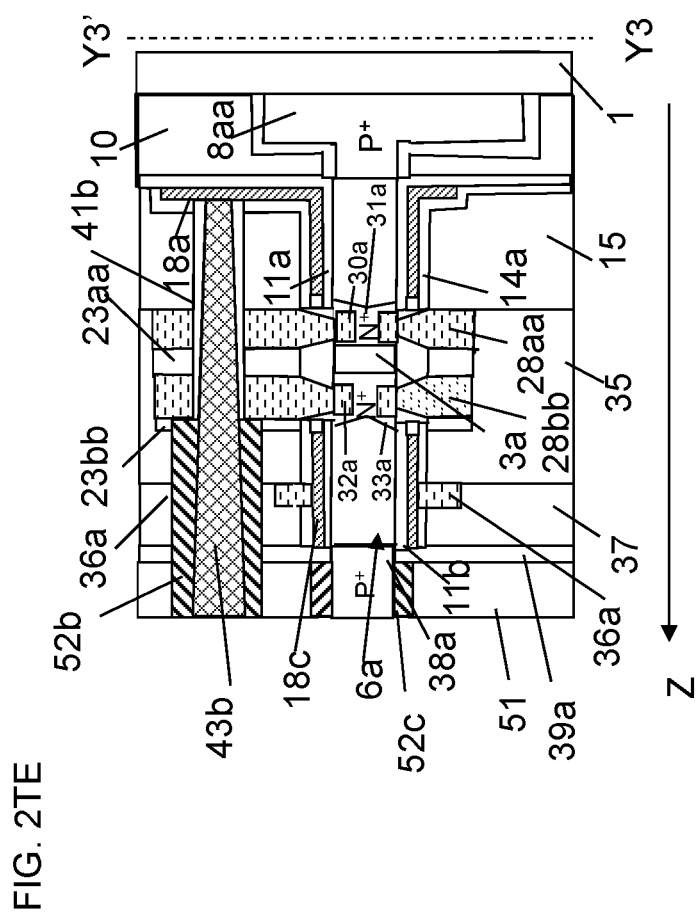

Subsequently, an ALD process is carried out to deposit a W layer (not shown) into the contact holes 50c, 50d, 50e, 50aa, and 50bb and on the AlO layer 51. Subsequently, as illustrated in FIGS. 2TA to 2TE, a CMP process is carried out to polish the W layer such that its upper surface is positioned at the level of the top portions of the P$^+$ layer 38a and the N$^+$ layers 38b and 38c, and the upper surfaces of the W layers 43a and 43b. This forms W layers 52a, 52b, 52c, 52d, and 52e around the side surfaces of the W layers 43a and 43b, the side surface of the P$^+$ layer 38a, and the side surfaces of the N$^+$ layers 38b and 38c, and within the contact holes 50aa, 50bb, 50c, 50d, and 50e. Incidentally, the W layers 52a, 52b, 52c, 52d, and 52e may be replaced by material layers having conductivity such as layers of other metals or alloys, or semiconductor layers having high contents of donor or acceptor impurities. However, when semiconductor layers having high contents of donor or acceptor impurities are employed, the layers are separately formed: a layer in contact with the P$^+$ layer 38a is formed as a P$^+$ semiconductor layer, and layers in contact with the N$^+$ layers 38b and 38c are formed as N$^+$ semiconductor layers.

Figure 2U:
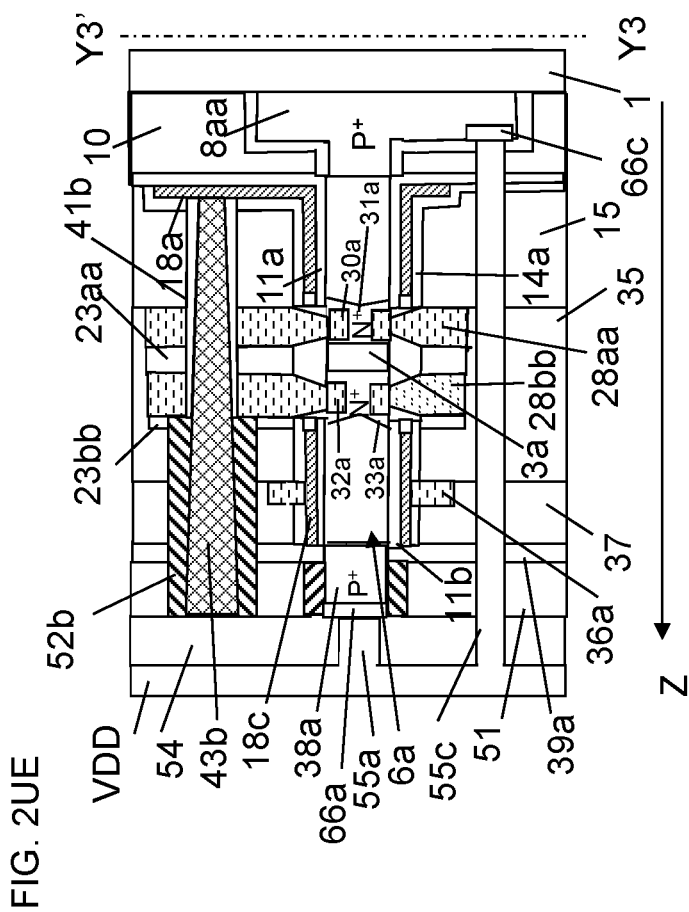
FIGS. 2UA to 2UE are a plan view and sectional structural views that illustrate a method for producing an SGT-including pillar-shaped semiconductor device according to a first embodiment.

Subsequently, as illustrated in FIGS. 2UA to 2UE, a SiO$_2$ layer 54 is formed over the whole structure. Subsequently, contact holes 55a and 55b are formed above the P$^-$ layer 38a and the N$^+$ layer 38b so as to extend through the SiO$_2$ layer 54; a contact hole 55c is formed above the P$^+$ layer 8aa so as to extend through the SiO$_2$ layer 54, the AlO layer 51, the SiN layer 39a, the SiO$_2$ layer 37, the SiN layers 35 and 15, the SiO$_2$ layer 14a, the HfO$_2$ layer 11b, and the SiO$_2$ layer 10; and a contact hole 55d is formed above the N$^+$ layer 8bb so as to extend through the SiO$_2$ layer 54, the AlO layer 51, the SiN layer 39a, the SiO$_2$ layer 37, the SiN layers 35 and 15, the SiO$_2$ layer 14a, the HfO$_2$ layer 11a, and the SiO$_2$ layer 10. Subsequently, silicide layers are formed: NiSi layers 66a and 66b are formed in the top portions of the Si pillars 6a and 6b; a NiSi layer 66c is formed, in the contact hole 55c, in its bottom portion on the P$^+$ layer 8aa; and a NiSi layer 66d is formed, in the contact hole 55c, in its bottom portion on the N$^+$ layer 8bb. The NiSi layers 66a and 66b are desirably formed so as to extend to, in plan view, the outer peripheries of the Si pillars 6a and 6b. Subsequently, a power supply wiring metal layer VDD is formed so as to connect via the contact holes 55a and 55c to the P$^+$ layers 38a and 8aa; and a ground wiring metal layer VSS is formed so as to connect via the contact holes 55b and 55d to the N$^+$ layers 38b and 8bb.

Figure 2V:
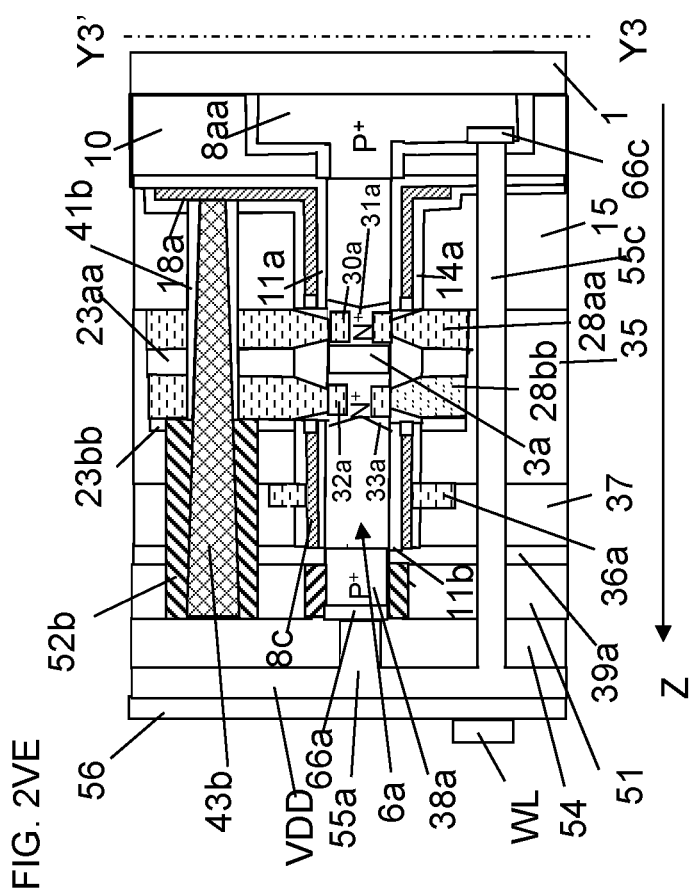
FIGS. 2VA to 2VE are a plan view and sectional structural views that illustrate a method for producing an SGT-including pillar-shaped semiconductor device according to a first embodiment.

Subsequently, as illustrated in FIGS. 2VA to 2VE, a CVD process and a CMP process are carried out to form a SiO$_2$ layer 56 over the whole structure. Subsequently, a contact hole 57 is formed so as to extend through the SiO$_2$ layers 56 and 54, the AlO layer 51, the SiN layer 39a, the SiO$_2$ layer 37, the SiN layer 35, the SiN layer 15, and the SiO$_2$ layer 11a, and above the TiN layer 18b. Subsequently, a word line wiring metal layer WL is formed so as to connect via the contact hole 57 to the TiN layer 18b.

Figure 2W:
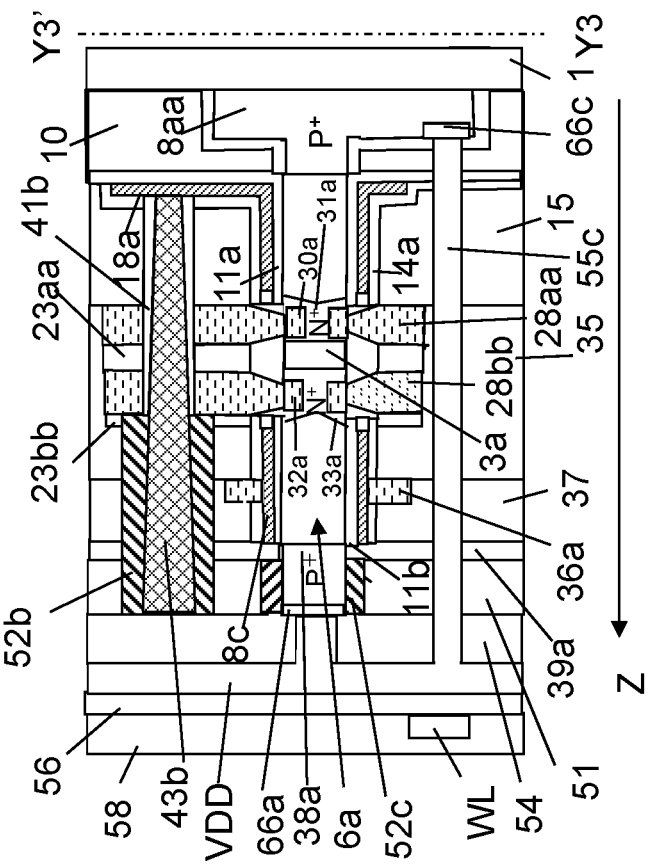
FIGS. 2WA to 2WE are a plan view and sectional structural views that illustrate a method for producing an SGT-including pillar-shaped semiconductor device according to a first embodiment.

Subsequently, as illustrated in FIGS. 2WA to 2WE, a CVD process and a CMP process are carried out to form a SiO$_2$ layer 58 over the whole structure. Subsequently, a contact hole 60a is formed above the N$^+$ layer 38c in the top portion of the Si pillar 6c so as to extend through the SiO$_2$ layers 58, 56, and 54; and a contact hole 60b is formed above the N$^+$ layer 8cc so as to extend through the SiO$_2$ layers 58, 56, and 54, the AlO layer 51, the SiN layer 39a, the SiO$_2$ layer 37, the SiN layers 35 and 15, the SiO$_2$ layer 14a, the HfO$_2$ layer 11a, and the SiO$_2$ layers 10 and 7c. Subsequently, silicide layers are formed: a NiSi layer 66e is formed in the top portion of the Si pillar 6c, and a NiSi layer 66f is formed, in the contact hole 60b, in its bottom portion on the N$^+$ layer 8cc. Subsequently, a bit line wiring metal layer BL is formed so as to connect via the contact hole 60a to the N$^+$ layer 38c, and so as to extend along line Y2-Y2' in plan view; and an inverted bit line wiring metal layer BLR is formed so as to connect via the contact hole 60b to the N$^-$ layer 8cc, and so as to extend along the bit line wiring metal layer BL in plan view.

As illustrated in FIGS. 2WA to 2WE, in an upper portion of the Si pillar 6a, an SGT (corresponding to the P-channel SGT Pc1 in FIG. 1B) is formed that includes the P$^+$ layers 33a and 38a as the drain and the source, includes the TiN layer 18c as the gate, and includes, as the channel, a region between the P$^+$ layers 33a and 38a in the Si pillar 6a; and, in a lower portion of the Si pillar 6a, an SGT (corresponding to the P-channel SGT Pc2 in FIG. 1B) is formed that includes the P$^+$ layers 8aa and 31a as the source and the drain, includes the TiN layer 18a as the gate, and includes, as the channel, a region between the P$^+$ layers 8aa and 31a in the Si pillar 6a.

In addition, in an upper portion of the Si pillar 6b, an SGT (corresponding to the N-channel SGT Nc1 in FIG. 1B) is formed that includes the N$^+$ layers 33b and 38b as the source and the drain, includes the TiN layer 18d as the gate, and includes, as the channel, a region between the N$^+$ layers 33b and 38b in the Si pillar 6b; and, in a lower portion of the Si pillar 6b, an SGT (corresponding to the N-channel SGT Nc2 in FIG. 1B) is formed that includes the N$^+$ layers 8bb and 31b as the source and the drain, includes the TiN layer 18a as the gate, and includes, as the channel, a region between the N+ layers 8*bb* and 31*b* in the Si pillar 6*a*.

In addition, in an upper portion of the Si pillar 6*c*, an SGT (corresponding to the N-channel SGT SN1 in FIG. 1B) is formed that includes the N+ layers 33*c* and 38*c* as the source and the drain, includes the TiN layer 18*e* as the gate, and includes, as the channel, a region between the N+ layers 33*c* and 38*c* in the Si pillar 6*c*; and, in a lower portion of the Si pillar 6*c*, an SGT (corresponding to the N-channel SGT Nc2 in FIG. 1B) is formed that includes the N+ layers 8*cc* and 31*c* as the source and the drain, includes the TiN layer 18*b* as the gate, and includes, as the channel, a region between the N+ layers 8*cc* and 31*c* in the Si pillar 6*c*.

These SGTs (corresponding to the SGTs Pc1, Pc2, Nc1, Nc2, SN1, and SN2 in FIG. 1B) are connected together via wires to thereby provide an SRAM cell circuit constituted by, as in the schematic structural view in FIG. 1B, a circuit area (corresponding to the circuit area C1 in FIG. 1B) including, in upper portions of the Si pillars 6*a*, 6*b*, and 6*c*, a P-channel SGT (corresponding to the P-channel SGT Pc1 in FIG. 1B) and N-channel SGTs (corresponding to the N-channel SGTs Nc1 and SN1 in FIG. 1B), and a circuit area (corresponding to the circuit area C2 in FIG. 1B) including, in lower portions of the Si pillars 6*a*, 6*b*, and 6*c*, a P-channel SGT (corresponding to the P-channel SGT Pc2 in FIG. 1B) and N-channel SGTs (corresponding to the N-channel SGTs Nc2 and SN2 in FIG. 1B).

The production method according to the first embodiment provides the following advantages.

1. As illustrated in FIGS. 2WA to 2WE, the P− layer 38*a* and the N+ layers 38*b* and 38*c* are surrounded, on the whole side surfaces and upper surfaces, by low-resistance metal layers that are the W layers 52*c*, 52*d*, and 52*e* and low-resistance silicide layers that are the NiSi layers 66*a*, 66*b*, and 66*e*. The W layers 52*c*, 52*d*, and 52*e* are formed so as to have bottom portions positioned at a level close to that of the lower ends of the P+ layer 38*a* and the N+ layers 38*b* and 38*c*. This enables a decrease in the resistance of diode junctions using the P− layer 38*a* and the N+ layers 38*b* and 38*c*, and formation of uniform electric fields in diode junctions using the P+ layer 38*a* and the N+ layers 38*b* and 38*c*. This contributes to a lower-voltage and higher-speed operation of the SGT circuit.

2. A structure obtained by etching the SiO2 layers 46*a*, 46*b*, 46*c*, 46*d*, and 46*e* being ring-shaped in plan view so as to surround the W layers 43*a* and 43*b* and the P+ layer 38*a* and the N+ layers 38*b* and 38*c* in the top portions of the Si pillars 6*a*, 6*b*, and 6*c* is used to form the W layers 52*a*, 52*b*, 52*c*, 52*d*, and 52*e* being ring-shaped in plan view so as to surround the W layers 43*a* and 43*b* and the P+ layer 38*a* and the N+ layers 38*b* and 38*c* in the top portions of the Si pillars 6*a*, 6*b*, and 6*c*. The SiO2 layers 46*a*, 46*b*, 46*c*, 46*d*, and 46*e* are formed by self-alignment not requiring a mask alignment step in a lithographic process in terms of the positional relations with respect to the W layers 43*a* and 43*b* and the Si pillars 6*a*, 6*b*, and 6*c*. Thus, the W layers 52*a*, 52*b*, 52*c*, 52*d*, and 52*e* are formed by self-alignment with respect to the W layers 43*a* and 43*b* and the Si pillars 6*a*, 6*b*, and 6*c*. This enables formation of a high-density SGT circuit.

3. As illustrated in FIGS. 2RA to 2RE, initially, the contact holes 50*a*, 50*b*, 50*c*, 50*d*, and 50*e* having the same depth in the perpendicular direction are formed; subsequently, as illustrated in FIGS. 2SA to 2SE, an RIE process is carried out through a resist layer (not shown) covering the contact holes 50*b*, 50*c*, 50*d*, and 50*e* and the AlO layer 51 serving as masks, to form the contact hole 50*aa* and the contact hole 50*bb*. This provides differences among the depth of the contact holes 50*c*, 50*d*, and 50*e*, the depth of the contact hole 50*aa*, and the depth of the contact hole 50*bb*. This enables easy formation of W layers having different depths among the depth of the W layers 52*c*, 52*d*, and 52*e*, the depth of the W layer 52*a*, and the depth of the W layer 52*b*. This facilitates production of the SGT circuit.

4. The SiO2 layer 41*a* is formed on a side surface (facing the W layer 43*a*) of the NiSi layer 28*bb*. As a result, although the NiSi layers 28*aa*, 28*bb*, and 36*a* overlap in plan view, while insulation between the W layer 43*a* extending through these layers and the NiSi layer 28*bb* is achieved, the W layer 43*a* enables a connection between the NiSi layer 28*aa* and the NiSi layer 36*a*. This enables a reduction in the SRAM cell area.

Similarly, the SiO2 layer 41*b* is formed on a side surface (facing the W layer 43*b*) of the NiSi layer 28*aa*. As a result, although the TiN layer 18*a* and the NiSi layers 28*aa* and 28*bb* overlap in plan view, while insulation between the W layer 43*b* extending through these layers and the NiSi layer 28*aa* is achieved, the W layer 43*b* enables connection between the TiN layer 18*a* and the NiSi layer 28*bb*. This enables a reduction in the SRAM cell area.

5. In the structure including layers overlapping in plan view that are the NiSi layer 28*aa* as a lower wiring conductor layer, a NiSi layer 28*bb* as an intermediate wiring conductor layer, and the NiSi layer 36*a* as an upper wiring conductor layer, the W layer 43*a* is formed on the NiSi layer 28*aa* so as to extend through the NiSi layers 28*bb* and 36*a*, and have a top portion positioned above the NiSi layer 36*a*. The W layer 52*a*, which is formed so as to surround the outer periphery of the W layer 43*a* by self-alignment, without a special lithographic process, is connected to the upper surface of the NiSi layer 36*a*. Thus, a connection between the NiSi layers 36*a* and 28*aa* is established.

Similarly, in the structure including layers overlapping in plan view that are the TiN layer 18*a* as a lower wiring conductor layer, the NiSi layer 28*aa* as an intermediate wiring conductor layer, and the NiSi layer 28*bb* as an upper wiring conductor layer, the W layer 43*b* is formed on the TiN layer 18*a* so as to extend through the NiSi layers 28*aa* and 28*bb*, and have a top portion positioned above the NiSi layer 28*bb*. The W layer 52*b*, which is formed so as to surround the outer periphery of the W layer 43*b* by self-alignment without a special lithographic process, is connected to the upper surface of the NiSi layer 28*bb*. Thus, a connection between the NiSi layer 28*bb* and the TiN layer 18*a* is established.

In this way, the W layer 43*a* and the W layer 52*a* are formed by self-alignment; and the W layer 43*b* and the W layer 52*b* are formed by self-alignment. This enables a high-density wiring of the SRAM cell.

6. The W layers 52*c*, 52*d*, and 52*e* contributing to a lower-voltage and higher-speed operation of the SGT circuit, and being ring-shaped so as to surround the whole side surfaces of the P+ layer 38*a* and the N+ layers 38*b* and 38*c*, and the W layers 52*a* and 52*b* contributing to an increase in the density of the SGT circuit, and being ring-shaped so as to surround the whole side surfaces of the top portions of the W layers 43*a* and 43*b* are each formed by a self-aligned process and by the same step. This facilitates formation a high-density SGT circuit.

7. As illustrated in FIG. 2PA to FIG. 2QE, a SiO2 layer (not shown) is deposited so as to cover the top portions of the W layers 43*a* and 43*b*, and the P+ layer 38*a* and the N+ layers 38*b* and 38*c* in the top portions of the Si pillars 6*a*, 6*b*, and 6*c*; subsequently, an RIE process is carried out to etch the SiO2 layer, to form the SiO2 layers 46*a*, 46*b*, 46*c*, 46*d*, and 46e so as to surround the top portions of the W layers 43a and 43b, and the P+ layer 38a and the N+ layers 38b and 38c in the top portions of the Si pillars 6a, 6b, and 6c. The SiO$_2$ layers 46a, 46b, 46c, 46d, and 46e can be formed so as to have smaller widths in plan view than in the case of being formed by a lithographic process because it is not necessary to ensure the mask alignment tolerance in the lithographic process. In addition, in plan view, the positional relations among the W layers 43a and 43b, the P+ layer 38a, the N− layers 38b and 38c, and the SiO$_2$ layers 46a, 46b, 46c, 46d, and 46e are provided by self-alignment. This enables high-density connections among the W layers 43a and 43b, the P+ layer 38a, the N+ layers 38b and 38c, and the W layers 52a, 52b, 52c, 52d, and 52e.

Second Embodiment

Hereinafter, with reference to FIG. 3AA to FIG. 3BE, a method for producing an SGT-including pillar-shaped semiconductor device according to a second embodiment of the present invention will be described. Among FIG. 3AA to FIG. 3BE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the second embodiment is the same as in the steps according to the first embodiment in FIGS. 2AA to 2WE except for the following differences.

Figure 3A:
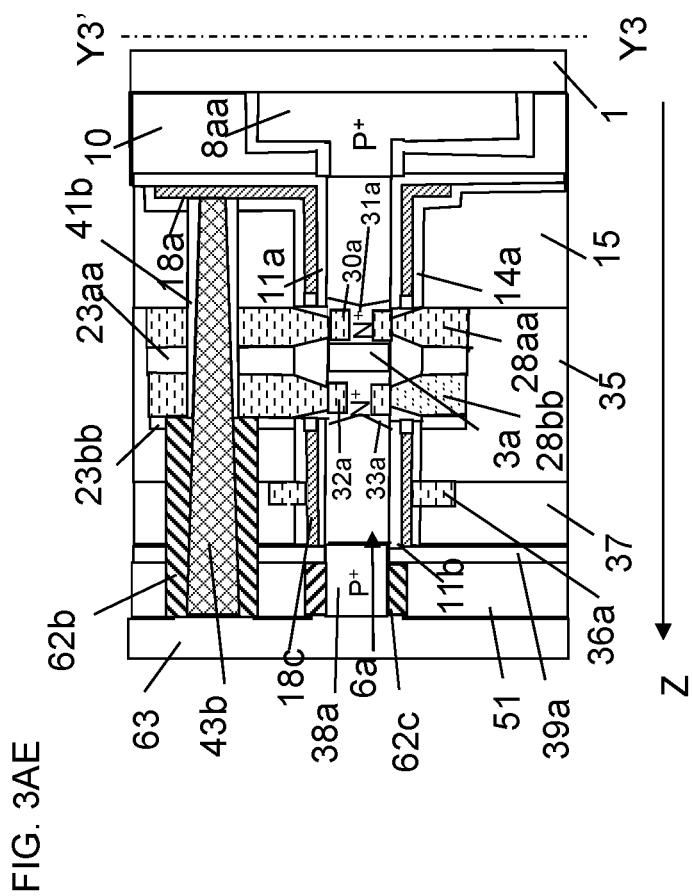
FIGS. 3AA to 3AE are a plan view and sectional structural views that illustrate a method for producing an SGT-including pillar-shaped semiconductor device according to a second embodiment of the present invention.

Prior to the step illustrated in FIGS. 3AA to 3AE, the same steps as in FIGS. 2AA to 2SE are carried out. Subsequently, an ALD process is carried out to deposit, for example, a silicide layer, NiSi layer (not shown) into the contact holes 50c, 50d, 50e, 50aa, and 50bb. Subsequently, a CMP process is carried out to polish the NiSi layer to the upper surfaces of the W layers 43a and 43b and the Si pillars 6a, 6b, and 6c, to form NiSi layers 62a, 62b, 62c, 62d, and 62e. Subsequently, a SiO$_2$ layer 63 (corresponding to the SiO$_2$ layer 54 in FIGS. 2UA to 2UE) is formed over the whole structure.

Figure 3B:
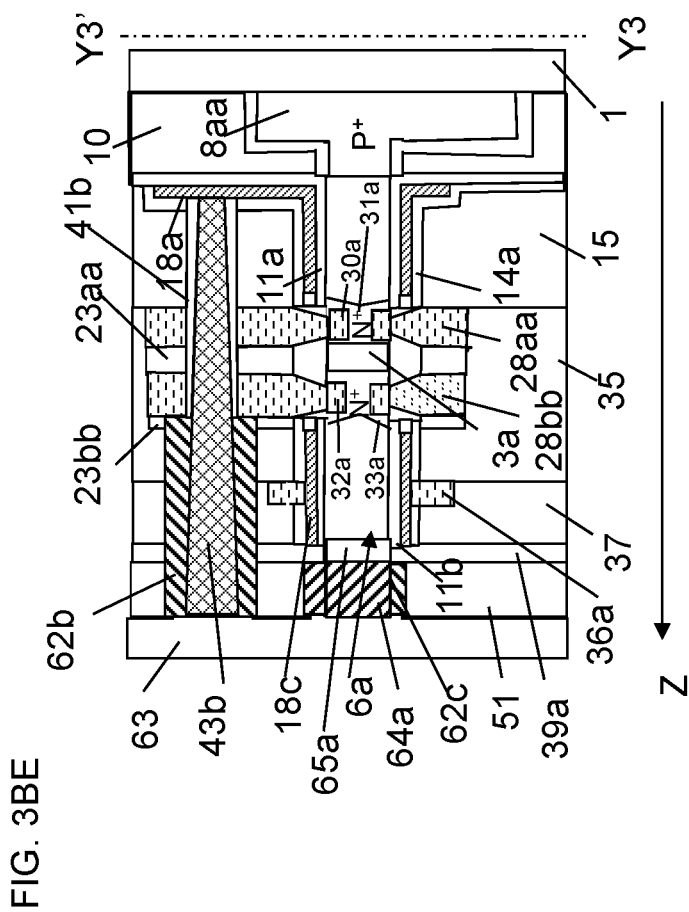
FIGS. 3BA to 3BE are a plan view and sectional structural views that illustrate a method for producing an SGT-including pillar-shaped semiconductor device according to a second embodiment.

Subsequently, as illustrated in FIGS. 3BA to 3BE, heat treatment is carried out to form NiSi layers 64a, 64b, and 64c in the top portions of the Si pillars 6a, 6b, and 6c in contact with the NiSi layers 62c, 62d, and 62e. The acceptor and donor impurities in the P+ layer 38a and the N+ layers 38b and 38c are pushed, due to the push-out effect exerted by the NiSi layers 64a, 64b, and 64c, downward in the Si pillars 6a, 6b, and 6c, to form a P+ layer 65a and N+ layers 65b and 65c having high impurity concentrations (regarding the impurity push-out effect, refer to T. Morimoto, T. Ohguro, H. Sasaki, M. S. Momose, T. Iinuma, I. Kunishima, K. Suguro, I. Katakabe, H. Nakajima, M. Tsuchiaki, M. Ono, Y. Katsumata, and H. Iwai: "Self-Aligned Nickel-Mono-Silicide Technology for High-Speed Deep Submicrometer Logic CMOS ULSI" IEEE Transaction on Electron Devices, Vol. 42, No. 5, pp. 915-922 (1995)). Subsequently, the same steps as in FIG. 2UA to FIG. 2WE are carried out to thereby form the same SRAM cell as in the first embodiment.

The method for producing an SGT-including pillar-shaped semiconductor device according to this embodiment provides the following advantages.

This embodiment provides a structure in which large portions of the P+ layer 38a and the N+ layers 38b and 38c in the first embodiment are replaced by silicide layers that are the NiSi layers 64a, 64b, and 64c. In addition, the donor or acceptor impurity push-out effect exerted by the NiSi layers 64a, 64b, and 64c forms the P+ layer 65a and the N+ layers 65b and 65c having high impurity concentrations. This enables a further decrease in the diode junction resistance, compared with the first embodiment. This leads to the lower-voltage and higher-speed operation of the SGT circuit.

Third Embodiment

Hereinafter, with reference to FIG. 4AA to FIG. 4BE, a method for producing an SGT-including pillar-shaped semiconductor device according to a third embodiment of the present invention will be described. Among FIG. 4AA to FIG. 4BE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the third embodiment is the same as in the steps according to the first embodiment in FIGS. 2AA to 2WE except for the following differences.

Figure 4A:
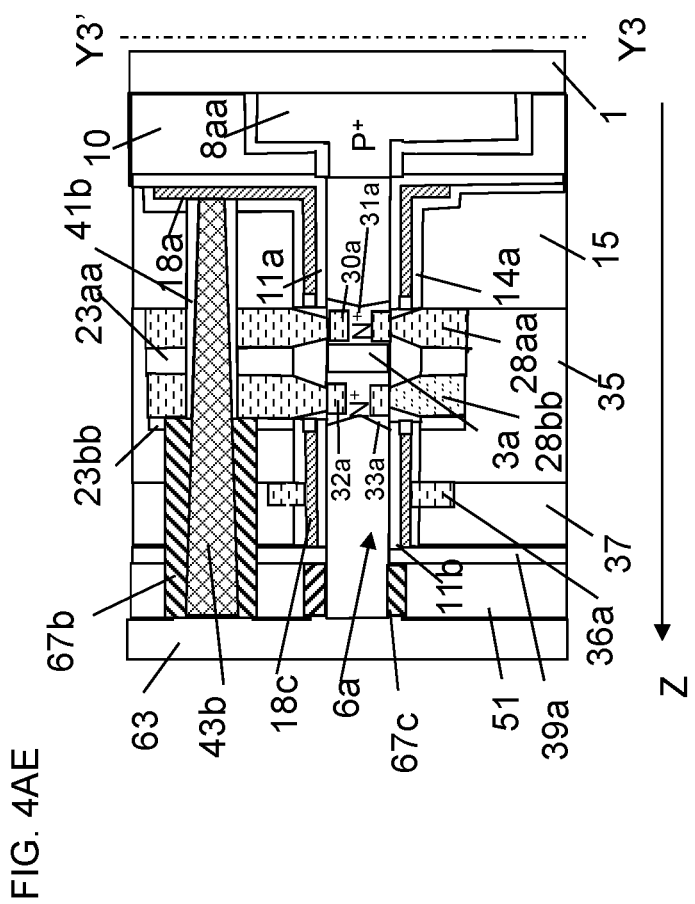
FIGS. 4AA to 4AE are a plan view and sectional structural views that illustrate a method for producing an SGT-including pillar-shaped semiconductor device according to a third embodiment of the present invention.

Prior to the step illustrated in FIGS. 4AA to 4AE, the same steps as in FIGS. 2AA to 2QE are carried out except that, in the step illustrated in FIGS. 2MA to 2ME, the P+ layer 38a and the N+ layers 38b and 38c are not formed. Subsequently, the SiO$_2$ layers 46a, 46b, and 46c are etched through a resist layer (not shown) serving as a mask to form contact holes 50a, 50b, and 50c. Subsequently, a Si layer (not shown) containing an acceptor impurity is formed so as to cover the whole structure. Subsequently, a CMP process is carried out to polish the Si layer to the upper surfaces of the Si pillars 6a, 6b, and 6c and the W layers 43a and 43b, to form, as illustrated in FIGS. 4AA to 4AE, Si layers 67a, 67b, and 67c so as to surround the top portions of the Si pillar 6a and the W layers 43a and 43b. Subsequently, as with the formation of the Si layers 67a, 67b, and 67c, Si layers 67d and 67e containing a donor impurity are formed so as to surround the top portions of the Si pillars 6b and 6c. Specifically, the SiO$_2$ layers 46d and 46e are first etched through a resist layer serving as a mask to form contact holes 50d and 50e. Subsequently, a Si layer (not shown) containing a donor impurity is formed so as to cover the whole structure. Subsequently, a CMP process is carried out to etch the Si layer to the upper surfaces of the Si pillars 6a, 6b, and 6c and the W layers 43a and 43b, to form, as illustrated in FIGS. 4AA to 4AE, the Si layers 67d and 67e so as to surround the top portions of the Si pillars 6b and 6c. This forms the Si layers 67a, 67b, and 67c containing an acceptor impurity within the contact holes 50a, 50b, and 50c, and the Si layers 67d and 67e containing a donor impurity within the contact holes 50d and 50e. Finally, a SiO$_2$ layer 63 (corresponding to the SiO$_2$ layer 54 in FIGS. 2UA to 2UE) is formed over the whole structure. Incidentally, instead of forming the Si layers 67a and 67b together with the Si layer 67c as described above, the Si layers 67a and 67b may be formed together with the Si layers 67d and 67e. In this case, the Si layers 67a and 67b contain a donor impurity. When the Si layers 67a and 67b are formed so as to contain a donor impurity or an acceptor impurity, low-resistance connections are established among the Si layers 67a and 67b, the W layers 43a and 43b, and the NiSi layer 36a. The Si layers 67a and 67b may be formed independently from the Si layers 67c, 67d, and 67e. In this case, the Si layers 67a and 67b may be formed so as not to contain a donor impurity or acceptor impurity. When the Si layers 67a and 67b do not contain a donor impurity or acceptor impurity, heat treatment carried out later forms tungsten silicide (WSi$_2$) layers within the Si layers 67a and 67b, which establishes low-resistance connections among the Si layers 67a and 67b, the W layers 43a and 43b, and the NiSi layer 36a.

Figure 4B:
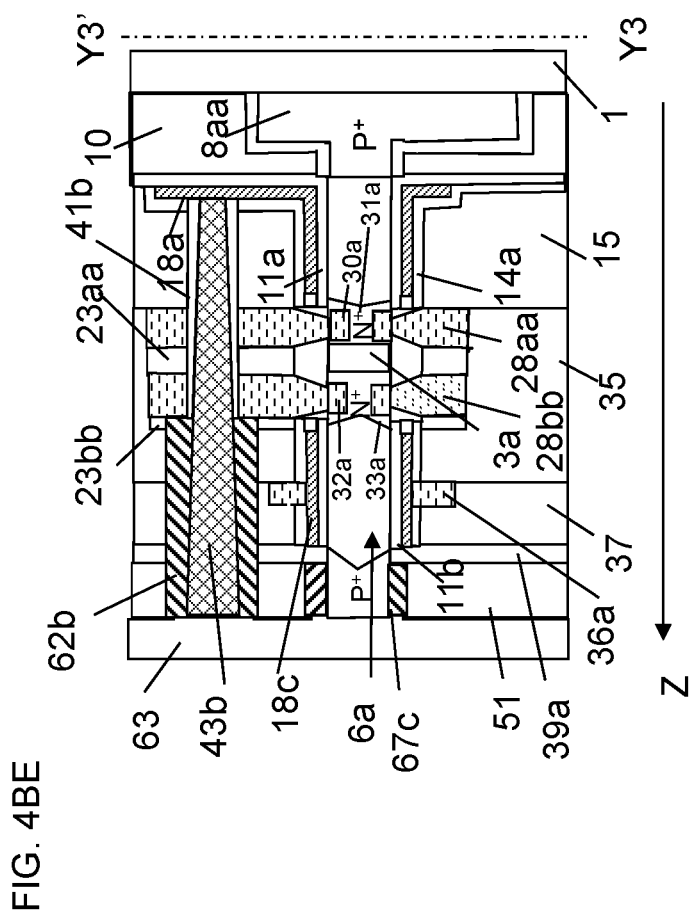
FIGS. 4BA to 4BE are a plan view and sectional structural views that illustrate a method for producing an SGT-including pillar-shaped semiconductor device according to a third embodiment.
Figure 5E:
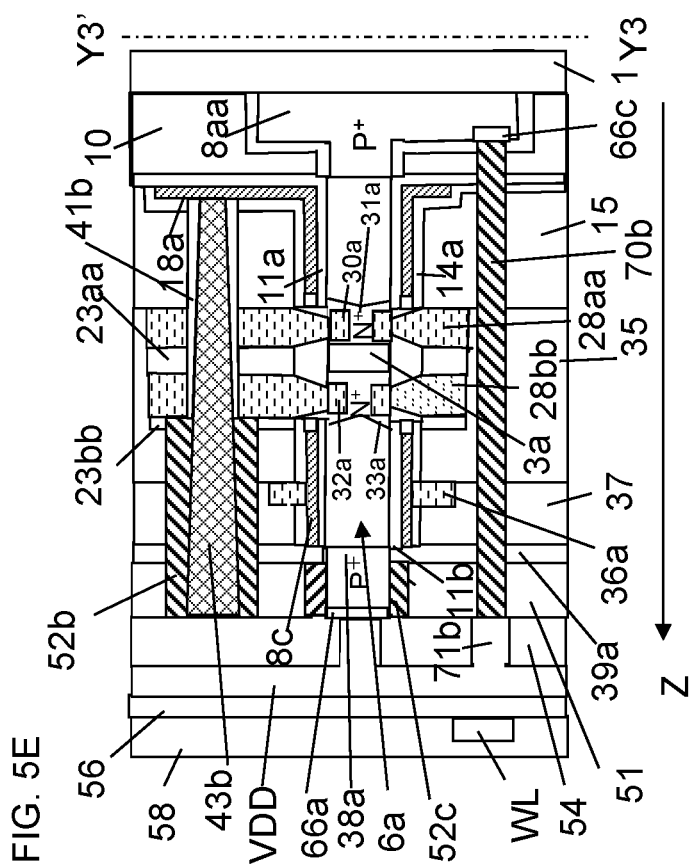
Figure 6E:
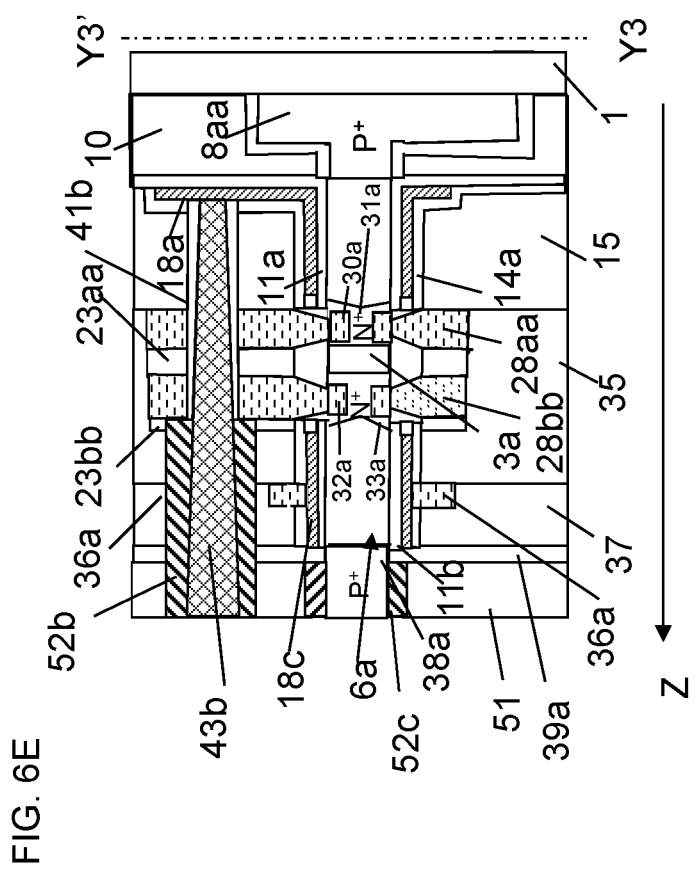

Subsequently, as illustrated in FIGS. 4BA to 4BE, heat treatment is carried out to diffuse the acceptor impurity from the Si layer 67c to the top portion of the Si pillar 6a to form a P$^+$ layer 68a, and to diffuse the donor impurity from the Si layers 67d and 67e to form N$^+$ layers 68b and 68c. Subsequently, as in the second embodiment, the same steps as in FIG. 2UA to FIG. 2WE are carried out to thereby form the same SRAM cell as in the first embodiment.

Incidentally, the Si layers 67c, 67d, and 67e containing an acceptor or donor may be replaced by silicide layers containing an acceptor or donor. In this case, silicide as in the second embodiment is formed in the top portions of the Si pillars 6a, 6b, and 6c.

The method for producing an SGT-including pillar-shaped semiconductor device according to this embodiment provides the following advantages.

1. In this embodiment, in order to form the Si layers, for example, a Si epitaxial process may be carried out to form the Si layers 67c, 67d, and 67e containing donor or acceptor impurities at high concentrations. This enables formation of low-resistance P$^+$ layer 38a and N$^+$ layers 38b and 38c in the top portions of the Si pillars 6a, 6b, and 6c. This enables production of a high-speed SGT circuit.

2. In the case of replacing the Si layers 67c, 67d, and 67e containing an acceptor or donor by silicide layers containing an acceptor or donor, silicide layers as in the second embodiment are formed in the top portions of the Si pillars 6a, 6b, and 6c. This leads to the lower-voltage and higher-speed operation of the SGT circuit.

Fourth Embodiment

Hereinafter, with reference to FIG. 5A to FIG. 5E, a method for producing an SGT-including pillar-shaped semiconductor device according to a fourth embodiment of the present invention will be described. Among FIG. 5A to FIG. 5E, the figure suffixed with A is a plan view; the figure suffixed with B is a sectional structural view taken along line X-X' in the figure suffixed with A; the figure suffixed with C is a sectional structural view taken along line Y1-Y1' in the figure suffixed with A; the figure suffixed with D is a sectional structural view taken along line Y2-Y2' in the figure suffixed with A; and the figure suffixed with E is a sectional structural view taken along line Y3-Y3' in the figure suffixed with A.

After the steps in FIGS. 2AA to 2SE in the first embodiment are carried out, in plan view, a resist layer (not shown) is formed on the AlO layer 51 and at the same position as in the formation of the contact holes 57, 55c, 55d, and 55e in the first embodiment; and a lithographic process is carried out through this resist layer serving as a mask, to form contact holes (not shown) above the P$^-$ layer 8aa, the N$^-$ layers 8bb and 8cc, and the TiN layer 18b.

Subsequently, an ALD process is carried out to deposit a W layer (not shown) into the contact holes 50c, 50d, 50e, 50aa, and 50bb and on the AlO layer 51. Subsequently, a CMP process is carried out to polish the W layer such that the upper surface of the W layer is positioned at the level of the top portions of the P$^+$ layer 38a and the N$^+$ layers 38b and 38c and the W layers 43a and 43b. This forms W layers 52a, 52b, 52c, 52d, and 52e around the side surfaces of the W layers 43a and 43b, the side surface of the P$^+$ layer 38a, and the side surfaces of the N$^+$ layers 38b and 38c, and within the contact holes 50aa, 50bb, 50c, 50d, and 50e, and forms W layers 70a, 70b, 70c, and 70d disposed within the contact holes above the N$^+$ layer 8cc, the P$^+$ layer 8aa, the N$^+$ layer 8bb, and the TiN layer 18b. Thus, the upper surfaces of the W layers 43a, 43b, 52a, 52b, 52c, 52d, 52e, 70a, 70b, 70c, and 70d are positioned at the same level.

Subsequently, a SiO$_2$ layer 54 is formed over the whole structure. Subsequently, contact holes 55a and 55b are formed above the P$^+$ layer 38a and the N$^-$ layer 38b so as to extend through the SiO$_2$ layer 54; a contact hole 71b is formed above the W layer 70b so as to extend through the SiO$_2$ layer 54; and a contact hole 71c is formed above the W layer 70c so as to extend through the SiO$_2$ layer 54. Subsequently, on the surface layers of the P$^+$ layer 8aa and the N$^+$ layer 8bb and 8cc at the bottom portions of the contact holes 70a, 70b, and 70c, NiSi layers 66c, 66d, and 66f are formed. The NiSi layers 66a and 66b are desirably formed to, in plan view, the outer peripheries of the Si pillars 6a and 6b. Subsequently, a power supply wiring metal layer VDD is formed so as to connect, via the contact holes 55a and 71b, to the P$^+$ layers 38a and 8aa; and a ground wiring metal layer VSS is formed so as to connect, via the contact holes 55b and 71c, to the N$^+$ layers 38b and 8bb.

Subsequently, a CVD process and a CMP process are carried out to form a SiO$_2$ layer 56 over the whole structure. Subsequently, a contact hole 71d is formed above the W layer 70d so as to extend through the SiO$_2$ layers 56 and 54. Subsequently, a word line wiring metal layer WL is formed so as to connect, via the contact hole 71d, to the TiN layer 18b.

Subsequently, a CVD process and a CMP process are carried out to form a SiO$_2$ layer 58 over the whole structure. Subsequently, a contact hole 60a is formed above the N$^+$ layer 38c of the top portion of the Si pillar 6c so as to extend through the SiO$_2$ layers 58, 56, and 54; and a contact hole 71a is formed above the W layer 70a so as to extend through the SiO$_2$ layers 58, 56, and 54. Subsequently, a bit line wiring metal layer BL is formed so as to connect via the contact hole 60a to the N$^+$ layer 38c and so as to extend along line Y2-Y2' in plan view; and an inverted bit line wiring metal layer BLR is formed so as to connect via the contact hole 71a to the N$^+$ layer 8cc and so as to extend along the bit line wiring metal layer BL in plan view. Thus, an SRAM cell circuit is formed.

The method for producing an SGT-including pillar-shaped semiconductor device according to this embodiment provides the following advantages.

In the first embodiment, the bottoms of the contact holes 55a, 55b, 55c, 55d, 57, 60a, and 60b are at different levels. By contrast, in this embodiment, the bottoms of the contact holes 55a, 55b, 60a, 71a, 71b, 71c, and 71d are at the level of the surfaces of the top portions of the W layers 43a, 43b, 52a, 52b, 52c, 52d, 52e, 70a, and 70b. This facilitates formation of the wiring metal layers VDD, VSS, BL, BLR, and WL in the contact holes 55a, 55b, 60a, 71a, 71b, 71c, and 71d. For example, as in CPU chips, when a logical circuit is formed on a chip having the SRAM cell region, the wiring metal layers formed are, in total, several tens of layers. For this reason, also in the formation of logical circuit portions, the contact holes connecting to the wiring metal layers can be formed such that the bottoms of the contact holes are at the same level, which leads to high-density formation of the wiring metal layers.

Fifth Embodiment

Hereinafter, with reference to FIG. 6A to FIG. 6E, a method for producing an SGT-including pillar-shaped semiconductor device according to a fifth embodiment of the present invention will be described. Among FIG. 6A to FIG. 6E, the figure suffixed with A is a plan view; the figure suffixed with B is a sectional structural view taken along line X-X' in the figure suffixed with A; the figure suffixed with C is a sectional structural view taken along line Y1-Y1' in the figure suffixed with A; the figure suffixed with D is a sectional structural view taken along line Y2-Y2' in the figure suffixed with A; and the figure suffixed with E is a sectional structural view taken along line Y3-Y3' in the figure suffixed with A.

After the steps in FIG. 2AA to FIG. 2SE in the first embodiment are carried out, a W layer (not shown) is deposited over the whole structure. Subsequently, the whole structure is polished by a CMP process such that the upper surface of the W layer is positioned at a level above the AlO layer 51. Subsequently, as illustrated in FIG. 6A to FIG. 6E, a lithographic process and etching are carried out to form a W layer 72a connecting to the W layers 43a and 52a, and to form a W layer 72b connecting to the N$^+$ layer 38c and the W layer 52e. Subsequently, the steps in FIG. 2UA to FIG. 2WE are carried out.

The method for producing an SGT-including pillar-shaped semiconductor device according to this embodiment provides the following advantages.

1. In this embodiment, the W layer 72a connecting to the W layers 43a and 52a, and the W layer 72b connecting to the N$^+$ layer 38c and the W layer 52e are formed. This means that, depending on the design, a W wiring layer can be formed on the AlO layer 51 so as to connect to any or all of the W layers 52a, 52b, 52c, 52d, and 52e. Thus, this embodiment may be applied not only to SRAM circuits, but also to other circuit designs, to thereby provide higher-performance circuits.

2. Alternatively, after the steps in FIG. 2AA to FIG. 2TE in the first embodiment are carried out, a wiring material layer not composed of tungsten may be formed on the W layers 43a, 43b, 52a, and 52b and the AlO layer 51, to thereby similarly form a metal wiring layer on the AlO layer 51 so as to connect to any or all of the W layers 52a, 52b, 52c, 52d, and 52e. Thus, this embodiment may be applied not only to SRAM circuits, but also to other circuit designs, to thereby provide higher-performance circuits. In this case, after the lithography step, the wiring material layer is desirably etched faster than the W layers. In this case, among the W layers 52a, 52b, 52c, 52d, and 52e, W layers not covered by resist are not etched and the wiring material layer is patterned, which is advantageous.

Sixth Embodiment

Figure 7A:
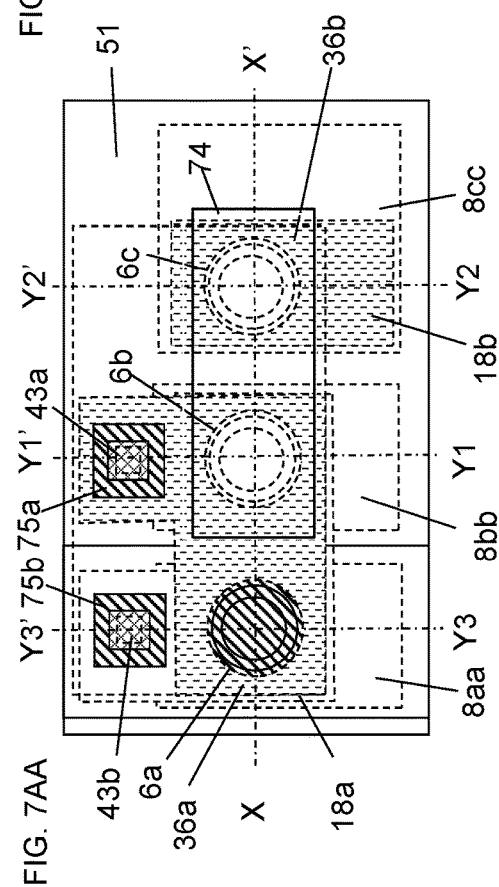
FIGS. 7AA to 7AE are a plan view and sectional structural views that illustrate a method for producing an SGT-including pillar-shaped semiconductor device according to a sixth embodiment of the present invention.
Figure 7A:
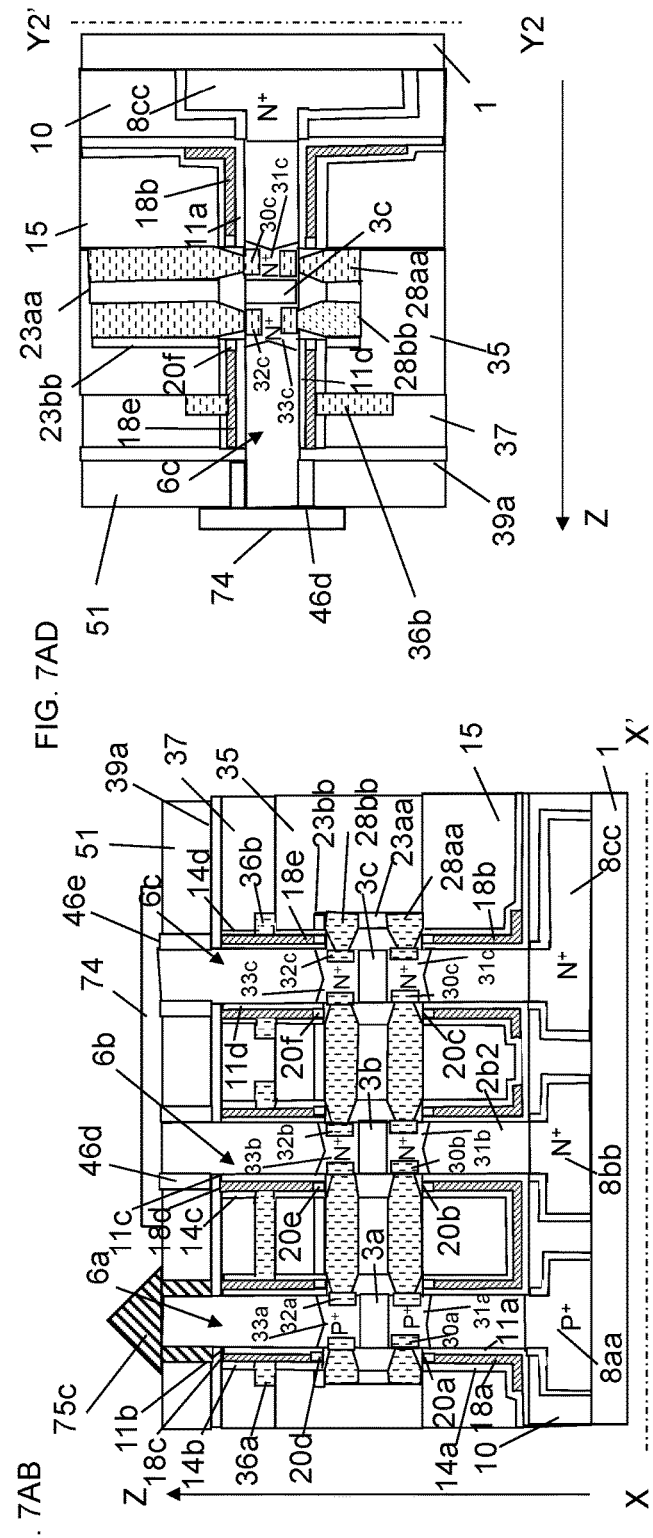
Figure 7A:
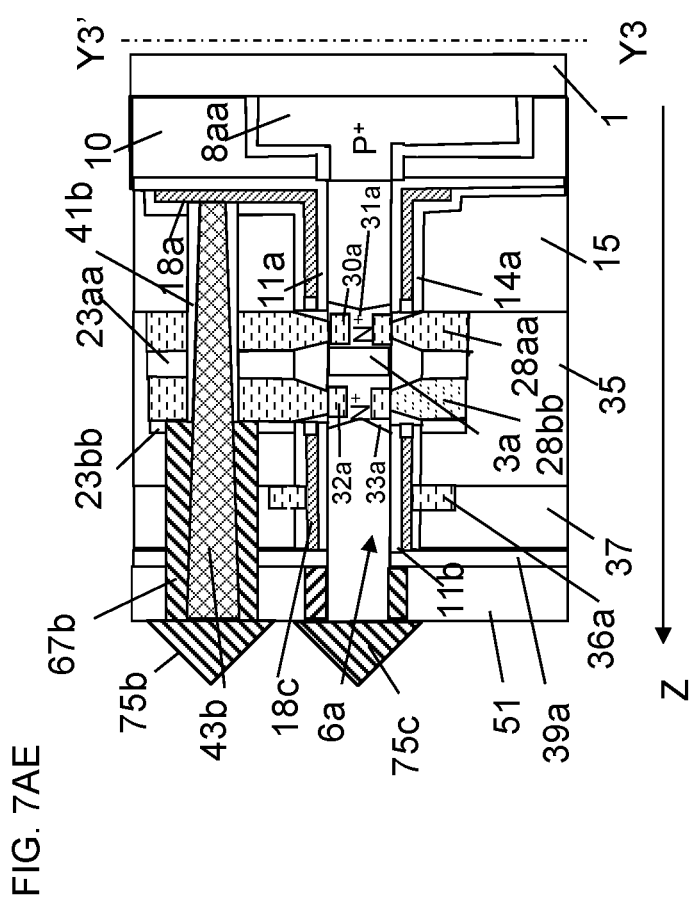
Figure 7B:
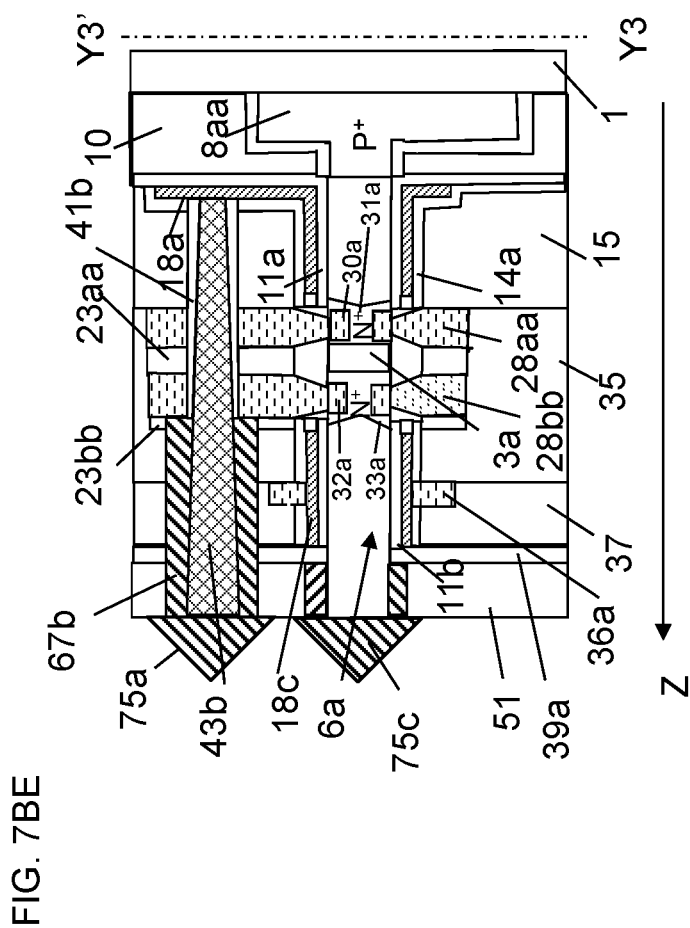
FIGS. 7BA to 7BE are a plan view and sectional structural views that illustrate a method for producing an SGT-including pillar-shaped semiconductor device according to a sixth embodiment of the present invention.
Figure 8:
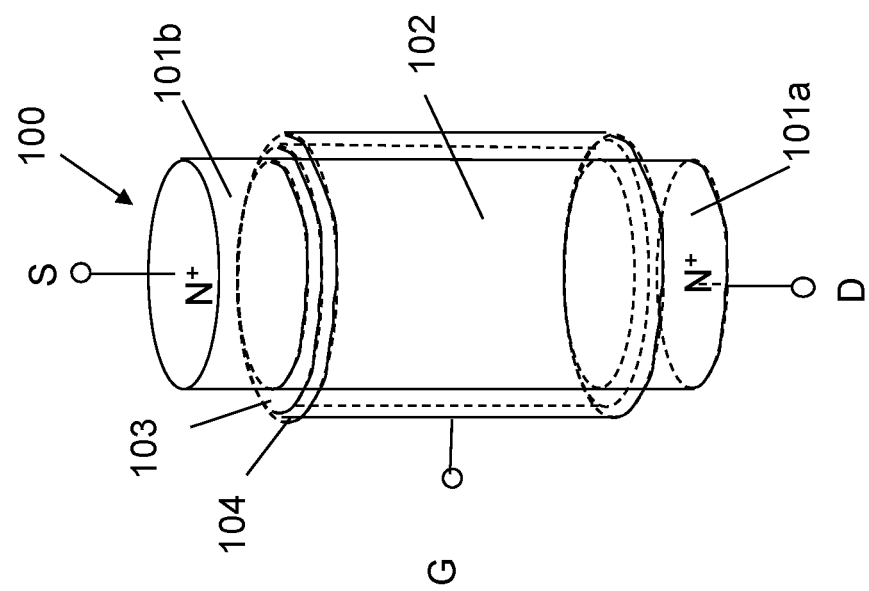
FIG. 8 is a schematic structural view of an existing SGT.

Hereinafter, with reference to FIG. 7AA to FIG. 7BE, a method for producing an SGT-including pillar-shaped semiconductor device according to a sixth embodiment of the present invention will be described. Among FIG. 7AA to FIG. 7BE, figures suffixed with A are plan views; figures suffixed with B are sectional structural views taken along lines X-X' in the corresponding figures suffixed with A; figures suffixed with C are sectional structural views taken along lines Y1-Y1' in the corresponding figures suffixed with A; figures suffixed with D are sectional structural views taken along lines Y2-Y2' in the corresponding figures suffixed with A; and figures suffixed with E are sectional structural views taken along lines Y3-Y3' in the corresponding figures suffixed with A. The production method according to the sixth embodiment is the same as in the steps according to the first embodiment in FIG. 2AA to FIG. 2WE except for the following differences.

The same steps as in FIG. 2AA to FIG. 2SE are carried out except for formation of the P$^+$ layer 38a and the N$^+$ layers 38b and 38c. In addition, as illustrated in FIGS. 7AA to 7AE, a SiN layer 74 is formed so as to cover, in plan view, the Si pillars 6b and 6c. Subsequently, the SiO$_2$ layers 46a, 46b, and 46c are etched to form contact holes 50a, 50b, and 50c. Subsequently, P$^+$ layers 75a, 75b, and 75c containing an acceptor impurity are formed by being grown by a selective epitaxial crystal growth method so as to fill the contact holes 50a, 50b, and 50c, and so as to have top portions positioned at a level above the Si pillar 6a and the AlO layer 51. In this crystal growth, the P$^+$ layer 75c in contact with the top portion of the Si pillar 6a is formed to be a single-crystalline layer. By contrast, the P$^+$ layers 75a and 75b in contact with the W layers 43a and 43b are formed to be polycrystalline layers.

Subsequently, the SiN layer 74 is removed. Subsequently, a SiN layer (not shown) is formed so as to cover the P$^-$ layers 75a, 75b, and 75c. Subsequently, the SiO$_2$ layers 46d and 46e are removed, to form contact holes 50d and 50e. Subsequently, as illustrated in FIGS. 7BA to 7BE, N$^+$ layers 75d and 75e containing a donor impurity are formed by being grown by a selective epitaxial crystal growth method so as to fill the contact holes 50d and 50e, and so as to have top portions positioned above the AlO layer 51. Subsequently, the SiN layer covering the P$^+$ layers 75a, 75b, and 75c is removed. In this selective epitaxial crystal growth, the N$^+$ layers 75d and 75e in contact with the top portions of the Si pillars 6b and 6c are formed to be single-crystalline layers. Subsequently, the steps in FIG. 2UA to FIG. 2WE are carried out, to form an SRAM circuit on the SiO$_2$ layer substrate 1.

The method for producing an SGT-including pillar-shaped semiconductor device according to this embodiment provides the following advantages.

1. In this embodiment, since the P$^+$ layer 75c and the N$^+$ layers 75d and 75e are single-crystalline layers, the P$^+$ layer 75c and the N$^+$ layers 75d and 75e each serve as the source or drain of an SGT. Thus, unlike the first embodiment, it is not necessary to form, in the top portions of the Si pillars 6a, 6b, and 6c, the P$^+$ layer 38a and the N$^+$ layers 38b and 38c.

2. During formation of the P$^+$ layer 75c and the N$^+$ layers 75d and 75e or a heating step carried out later, the acceptor or donor impurity diffuses from the P$^+$ layer 75c and the N$^+$ layers 75d and 75e into the P$^+$ layer 75c and the N$^+$ layers 75d and 75e. This forms a source or drain in the surface layers or inside of the top portions of the Si pillars 6a, 6b, and 6c.

Incidentally, the first embodiment describes the SGT-including SRAM cell circuit as an example. However, the present invention is also applicable to formation of other SGT-including circuits. The same applies to other embodiments according to the present invention.

In the above-described embodiments according to the present invention, two SGTs are formed in each of the Si pillars 6a, 6b, and 6c. However, the present invention is also applicable to formation of a circuit in which one or three or more SGTs are formed.

In the first embodiment, the AlO layer 51 is used as an etching mask, to form the contact holes 50a, 50b, 50c, 50d, and 50e while the top portions of the Si pillars 6a, 6b, and 6c and the top portions of the W layers 43a and 43b are left. However, the following are freely selected in accordance with the purpose: the material of the etching mask (the first embodiment uses the AlO layer 51), the material of the semiconductor pillars (the first embodiment uses the Si pillars 6a, 6b, and 6c), the material of the layers removed to form the contact holes (the first embodiment uses the $SiO_2$ layers 46a, 46b, 46c, 46d, 46e, and 37, and SiN layers 39a and 35), and the etching method. The same applies to other embodiments according to the present invention.

In the first embodiment, as illustrated in FIGS. 2NA to 2NE, the SiN layer 39a is formed on the $SiO_2$ layer 37 in the outer peripheral portions of the $P^+$ layer 38a and the $N^+$ layers 38b and 38c. The SiN layer 39a may be replaced by another material layer as long as this material layer serves as an etching stopper layer in the case of etching the $SiO_2$ layers 46a, 46b, 46c, 46d, and 46e through, as masks, the AlO layer 51, the Si pillars 6a, 6b, and 6c, and the W layers 43a and 43b. Alternatively, instead of using the SiN layer 39a, the upper ends of the TiN layers 18c, 18d, and 18e may be oxidized to form insulating layers there; or, the upper ends of the TiN layers 18c, 18d, and 18e may be partially etched off, and the resultant recesses may be filled with an insulating layer. The SiN layer 39a may be omitted when at least a material layer is disposed under the $SiO_2$ layers 46c, 46d, and 46e so as to serve as an etching stopper against etching for the $SiO_2$ layers 46c, 46d, and 46e. The materials of the SiN layer 39a, the $SiO_2$ layers 46a, 46b, 46c, 46d, and 46e, and the AlO layer 51 may be freely selected in accordance with the purpose. The same applies to other embodiments according to the present invention.

In the first embodiment, on the Si pillars 6a, 6b, and 6c, the $SiO_2$ layers 5a, 5b, and 5c are formed. Alternatively, these layers may be replaced by other material layers that are monolayers or multilayers. Alternatively, these layers may be material layers that are combinations including another multilayer or monolayer such as a SiN layer. The same applies to other embodiments according to the present invention.

In the first embodiment, the $SiO_2$ layers 5a, 5b, and 5c on the Si pillars 6a, 6b, and 6c are removed in the step illustrated in FIGS. 2MA to 2ME. Alternatively, the $SiO_2$ layers 5a, 5b, and 5c may be left until any of the subsequent steps as long as the object of the embodiment is achieved. The same applies to other embodiments according to the present invention.

In the first embodiment, the source impurity regions in the bottom portions of the Si pillars 6a, 6b, and 6c, which constitute the $P^+$ layer 8aa and the $N^+$ layers 8bb and 8cc serving as the sources of the lower SGTs, and wiring conductor layer portions each extending horizontally, are formed as the layers of the same material. Alternatively, for example, the wiring conductor layer portions may be formed of other material layers that are monolayers or multilayers of silicide or metal. The same applies to other embodiments according to the present invention.

In the first embodiment, the contact holes 40a and 40b are formed in a region where, in plan view, the NiSi layer 28aa as a lower wiring conductor layer, the NiSi layer 28bb as an intermediate wiring conductor layer, and the NiSi layer 36a as an upper wiring conductor layer are formed so as to overlap. In this case, the NiSi layer 28aa connects to the drain $N^+$ layer 31b of a lower SGT; the NiSi layer 28bb is connected to the drain $N^+$ layer 33b of an upper SGT; and the NiSi layer 36a is connected to the gate TiN layer 18d of an upper SGT. Thus, depending on the design of an SGT-including circuit, the combination of the source impurity regions, the drain impurity regions, and the gate conductor layers of SGTs that connect to the upper wiring conductor layer, the intermediate wiring conductor layer, and the lower wiring conductor layer can be appropriately changed. The same applies to other embodiments according to the present invention.

In the first embodiment, an example is described in which the W layers 52a to 52e are formed so as to be in contact with the top portions of the Si pillars 6a, 6b, and 6c, and the connection wiring W layers 43a and 43b. The present invention is applicable to the Si pillars 6a, 6b, and 6c, or the connection wiring W layers 43a and 43b. Alternatively, depending on the circuit formed, the present invention is applicable to Si pillars and/or connection wirings.

In the first embodiment, the W layers 52a, 52b, 52c, 52d, and 52e may be replaced by material layers having conductivity such as layers of other metals or alloys, or semiconductor layers having high contents of donor or acceptor impurities. The same applies to other embodiments according to the present invention.

In the first embodiment, the NiSi layer 28bb in which a side surface is insulated with the $SiO_2$ layer 41a has a side surface positioned, in plan view, at the outer periphery of the contact hole 40a. Alternatively, the NiSi layer 28bb may have a side surface extending outside of the contact hole 40a. This configuration enables a decrease in the capacitance between the NiSi layers 28aa and 28bb. Similarly, the NiSi layer 28aa in which a side surface is insulated with the $SiO_2$ layer 41b has a side surface positioned, in plan view, at the outer periphery of the contact hole 40b. Alternatively, the NiSi layer 28aa may have a side surface extending outside of the contact hole 40b. This configuration enables a decrease in the capacitance between the NiSi layer 28aa and the TiN layer 18a. This configuration is also effective in the formation of circuits other than SRAM cell circuits. The same applies to other embodiments according to the present invention.

In the first embodiment, the contact holes 40a and 40b are formed so as to extend from the $SiO_2$ layer 39b as the uppermost layer to the upper surfaces of the NiSi layer 28aa and the TiN layer 18a. However, over etching for the contact holes 40a and 40b may be obviously carried out such that the contact holes 40a and 40b have bottoms within the NiSi layer 28aa and the TiN layer 18a. The same applies to other embodiments according to the present invention.

In the first embodiment, silicide is formed in the P-type poly-Si layers 22a and 22b and $N^+$-type poly-Si layers 26a and 26b due to Ni atoms in the Ni layers 21a and 21b, to thereby make the NiSi layers 28a and 28b protrude into the spaces 25a, 25b, and 25c. Instead of the Ni layers 21a and 21b, layers of another metal such as titanium (Ti) or cobalt (Co) may be employed to form silicide layers, and the silicide layers may be made to protrude into the spaces 25a, 25b, and 25c. Alternatively, silicide layers having a high content of metal atoms may be formed by, for example, sputtering deposition, and subsequently the silicide layers may be made to protrude into the spaces 25a, 25b, and 25c. Alternatively, another method may be employed to form connections between the $N^+$ layers 31b, 31c, 33b, and 33c and the $P^+$ layers 31a and 33a, and the NiSi layers 28aa, 28bb, 36a, and 36b, which are wiring conductor layers horizontally disposed and connect to the gate TiN layers 18c, 18d, and 18e surrounding the outer peripheries of the Si pillars 6a, 6b, and 6c. Similarly, this is also applicable to other embodiments according to the present invention.

In the first embodiment, the SiO$_2$ layers 41a and 41b are formed on the side surfaces (facing the side surfaces of the contact holes 40a and 40b) of the NiSi layers 36a and 28bb, which are upper wiring conductor layers. Alternatively, over etching may be carried out by RIE etching to thereby remove the SiO$_2$ layers 41a and 41b from the side surfaces of the NiSi layers 36a and 28bb. Similarly, this is also applicable to other embodiments according to the present invention.

The first embodiment describes a configuration in which the Si pillars 6a, 6b, and 6c are formed on the SiO$_2$ layer substrate 1 to form the SRAM cell circuit. Alternatively, instead of the SiO$_2$ layer substrate 1, another substrate such as an SOI (Silicon on Insulator) substrate or a Si substrate may be employed. In the case of employing a Si substrate, well structures may be formed in the surface layer of the Si substrate, the well structures corresponding to the N$^+$ layers or P$^+$ layers functioning as the sources or drains in the bottom portions of the Si pillars 6a, 6b, and 6c. Similarly, this is also applicable to other embodiments according to the present invention.

In the first embodiment, the P$^+$ layers 8aa, 31a, and 33a, and the N$^+$ layers 8bb, 8cc, 31b, 31c, 33b, and 33c may be formed in the outer peripheral portions or the entire inner portions of the Si pillars 6a, 6b, and 6c by another method. Similarly, this is also applicable to other embodiments according to the present invention.

In the first embodiment, the W layers 43a and 43b are used; alternatively, other conductor layers may be used. The W layers 43a and 43b and other conductor layers may be constituted by plural conductor layers including barrier layers, for example. The materials for the plural conductor layers may be the same or different as long as the materials satisfy properties for this embodiment. Similarly, this is also applicable to other embodiments according to the present invention.

In the second embodiment, the NiSi layers 62a, 62b, 62c, 62d, and 62e are formed so as to surround the P$^+$ layer 38a, the N$^+$ layers 38b and 38c, and the W layers 43a and 43b. One or more of these layers may be formed of, instead of NiSi, another silicide material or another alloy of a semiconductor atom and a metal atom. Such a silicide material or alloy is a material that achieves formation of alloy, in the impurity regions in the top portions of the semiconductor pillars, to the outer peripheral portions or centers in plan view.

In the third embodiment, the Si layers 67a, 67b, 67c, 67d, and 67e containing an acceptor or donor impurity are formed so as to surround the top portions of the Si pillars 6a, 6b, and 6c and the W layers 43a and 43b. Alternatively, instead of these Si layers, silicide layers and/or other material layers containing an acceptor or donor impurity may be formed. Alternatively, instead of formation of the Si layers 67a and 67b, silicide layers and/or other material layers not containing an acceptor or donor impurity may be formed.

In the sixth embodiment, the P$^+$ layer 75c and the N$^+$ layers 75d and 75e are single-crystalline layers, and the P$^+$ layer 75c and the N$^+$ layers 75d and 75e each serve as the source or drain of an SGT. For this reason, unlike the first embodiment, the P$^+$ layer 38a and the N$^+$ layers 38b and 38c are not formed in the top portions of the Si pillars 6a, 6b, and 6c. However, prior to formation of the P$^+$ layer 75c and the N$^+$ layers 75d and 75e, the P$^+$ layer 38a and the N$^+$ layers 38b and 38c may be formed in the top portions of the Si pillars 6a, 6b, and 6c, which does not inhibit operations of the SGTs at all. Thus, the P$^+$ layer 38a and the N$^+$ layers 38b and 38c in the top portions of the Si pillars 6a, 6b, and 6c prior to formation of the P$^+$ layers 75c and the N$^+$ layers 75d and 75e may or may not be formed. Whether or not the P$^+$ layer 38a and the N$^+$ layers 38b and 38c are formed depends on, for example, the target junction resistance values of the P$^+$ layer 38a and the N$^+$ layers 38b and 38c.

In the sixth embodiment, the P$^+$ layer 75a and N$^+$ layers 75b and 75c are formed by a selective epitaxial crystal growth method. This selective epitaxial crystal growth method is described as a method in which, during the epitaxial crystal growth, Si atoms having reached the AlO layer 51 [sic=AlO?? See others below] move along the surface of the AlO layer to reach the contact holes 50c, 50d, and 50e, and to cause crystal growth, which results in formation of single-crystalline P$^+$ layer 75a and N$^+$ layers 75b and 75c within the contact holes 50c, 50d, and 50e and on the top portions of the Si pillars 6a, 6b, and 6c. Alternatively, another method may be employed. For example, a Si layer containing an impurity is first formed by an ordinary epitaxial crystal growth method within the contact holes 50c, 50d, and 50e and on the AlO layer 51. In this case, the inner side surfaces of the contact holes 50c, 50d, and 50e are in contact with the top portions of the single-crystalline Si pillars 6a, 6b, and 6c, and hence the layer is formed as a single-crystalline layer. On the other hand, on the AlO layer 51, the layer is formed as an amorphous layer. Subsequently, the Si layer is etched by CDE (Chemical Dry Etching), for example. In this case, since the amorphous layer is etched at a higher etching rate than the single-crystalline layer, the Si layer on the AlO layer 51 is removed while the Si layer within the contact holes 50c, 50d, and 50e is left. This step may be repeated plural times to thereby selectively form the P$^+$ layer 75a and the N$^+$ layers 75b and 75c.

In the first embodiment, as illustrated in FIGS. 2QA to 2QE, the SiO$_2$ layer (not shown) deposited by a CVD process over the whole structure is etched by an RIE process uniformly to the upper surface of the SiN layer 39a such that the ring-shaped SiO$_2$ layers 46a and 46b are left on the side surfaces of the W layers 43a and 43b, and the ring-shaped SiO$_2$ layers 46c, 46d, and 46e are left on the side surfaces of the P$^+$ layer 38a and the N$^+$ layers 38b and 38c. The SiO$_2$ layers 46a, 46b, 46c, 46d, and 46e may be replaced by other material layers as long as these layers are left by self-alignment on the side surfaces of the P$^+$ layer 38a, the N$^-$ layers 38b and 38c, and the W layers 43a and 43b. The RIE process may be replaced by another process. The same applies to other embodiments according to the present invention.

The SiO$_2$ layers 46a, 46b, 46c, 46d, and 46e, and the W layers 52a, 52b, 52c, 52d, and 52e in the first and fourth embodiments, the NiSi layers 62a, 62b, 62c, 62d, and 62e in the second embodiment, and the Si layers 67a, 67b, 67c, 67d, and 67e in the third embodiment are each formed as being ring-shaped in plan view so as to surround any of the Si pillars 6a, 6b, and 6c and the W layers 43a and 43b. However, the shapes of the layers are not limited to the ring shape. The layers may have outer sectional shapes in plan view that depend on the sectional shapes of the corresponding Si pillars 6a, 6b, and 6c and W layers 43a and 43b, for example, similar shapes. For example, when the Si pillars 6a, 6b, and 6c and the W layers 43a and 43b have square sectional shapes, the layers may have square or rectangular sectional shapes; or, when the Si pillars 6a, 6b, and 6c and the W layers 43a and 43b have elliptical sectional shapes, the layers may have elliptical, circular, or oval sectional shapes. The sectional shapes of the layers may be freely selected from shapes so as to surround, in plan view, the Si pillars 6a, 6b, and 6c and the W layers 43a and 43b. In particular, such sectional shapes of the layers are preferably constituted by strips having constant widths, which eliminates the necessity of formation of extra masks.

In the first embodiment, connections between the side surfaces of the Si pillars 6a, 6b, and 6c and the NiSi layers 28aa and 28bb, formation of the NiSi layers 30a, 30b, 30c, 32a, 32b, and 32c within the Si pillars 6a, 6b, and 6c, and formation of the P$^+$ layers 31a and 33a and the N$^+$ layers 31b, 31c, 33b, and 33c are achieved by heat treatment illustrated in FIGS. 2KA to 2KD. Formation of these structures by heat treatment may be carried out later than the timing described in the first embodiment and carried out by the final step of producing the SGTs. The same applies to other embodiments according to the present invention.

The first embodiment describes a configuration employing the SiN layers 15 and 35, which are layers formed of a single material. Alternatively, composite material layers may be employed, for example, a composite material layer including a lower portion that is a $SiO_2$ layer and an upper portion that is a SiN layer. Alternatively, instead of the SiN layers 15 and 35, insulating material layers having a low diffusion coefficient of HF ions may be employed. This is also applicable to other embodiments according to the present invention.

In the fifth embodiment, the W layer 72a connecting to the W layers 43a and 52a, and the W layer 72b connecting to the N$^+$ layer 38c and the W layer 52e are formed. The W layer 43a and the W layer 52a, which are low-resistance material layers, are themselves connected to each other, not via the W layer 72a. Thus, the W layer 72a should connect to at least the W layer 52a. Similarly, the N$^+$ layer 38c and the W layer 52e, which are low-resistance material layers, are themselves connected to each other, not via the W layer 72b. Thus, the W layer 72b should connect to at least the W layer 52e. This is also applicable to other embodiments according to the present invention.

The above embodiments describe examples in which semiconductor regions such as channels, sources, and drains in the semiconductor pillars are formed of Si (silicon). However, this does not limit the present invention. The technical idea of the present invention is also applicable to SGT-including semiconductor devices that employ Si-containing semiconductor materials such as SiGe, or semiconductor materials other than Si.

The first embodiment relates to a configuration in which the gate conductor layers are the TiN layers 18a, 18b, 18c, and 18d. However, the gate conductor layers are not limited to this example and may be formed of another metal material. Alternatively, the gate conductor layers may have a multilayer structure including a metal layer and, for example, a poly-Si layer. Similarly, this is also applicable to other embodiments according to the present invention.

The vertical NAND-type flash memory circuit includes plural memory cells stacked in the vertical direction, the memory cells each including a semiconductor pillar as the channel and including, around the semiconductor pillar, a tunnel oxide layer, a charge storage layer, an interlayer insulating layer, and a control conductor layer. Semiconductor pillars at both ends of these memory cells include a source line impurity layer corresponding to a source, and a bit line impurity layer corresponding to a drain. In addition, when one of memory cells on both sides of a memory cell functions as a source, the other functions as a drain. Thus, the vertical NAND-type flash memory circuit is one of SGT circuits. Therefore, the present invention is also applicable to NAND-type flash memory circuits.

In the first embodiment, for example, in an SGT including the N$^+$ layers 8bb and 31b serving as the source and the drain, these layers are formed of impurity regions containing the same donor impurity. Alternatively, this SGT may be formed as a tunnel effect SGT including impurity regions of different conductivity types. The same applies to the other SGTs. Similarly, this is also applicable to other embodiments according to the present invention.

The present invention encompasses various embodiments and various modifications without departing from the broad spirit and scope of the present invention. The above-described embodiments are provided for understanding of examples of the present invention and do not limit the scope of the present invention. Features of the above-described examples and modifications can be appropriately combined. The above-described embodiments from which some optional features have been eliminated depending on the need still fall within the spirit and scope of the present invention.

Methods for producing a pillar-shaped semiconductor device according to the present invention provide high-performance, highly integrated semiconductor devices.

What is claimed is:

1. A method for producing a pillar-shaped semiconductor device, the method comprising:
   a step of providing a semiconductor structure including a substrate,
      a semiconductor pillar disposed on the substrate and extending in a perpendicular direction with respect to the substrate, a gate insulating layer surrounding an outer periphery of the semiconductor pillar,
      a gate conductor layer surrounding the gate insulating layer, and
      an interlayer insulating layer having an upper surface positioned at a level, in the perpendicular direction, that is equal to or higher than an upper end of the gate conductor layer and that is equal to or lower than a top portion of the semiconductor pillar;
   a step of forming a first material layer so as to surround and contact a side surface of an exposed upper portion of the semiconductor pillar;
   a step of forming a second material layer so as to surround the first material layer;
   a step of etching the first material layer through the second material layer serving as an etching mask, to form a first contact hole within the second material layer and surrounding the upper portion of the semiconductor pillar; and
   a step of forming a first conductive material layer having conductivity in the first contact hole.

2. The method for producing a pillar-shaped semiconductor device according to claim 1, further comprising:
   a step of forming a second impurity region containing an acceptor or donor impurity and positioned within the semiconductor pillar and below the upper portion of the semiconductor pillar; and
   a step of forming, in an outer peripheral portion or an entire inner portion of the upper portion of the semiconductor pillar, a first impurity region containing the acceptor or donor impurity and connecting to a side inner surface of the first conductive material layer.

3. The method for producing a pillar-shaped semiconductor device according to claim 2, further comprising:
a step of providing a stack structure including
at least one other semiconductor structure that is different from the semiconductor structure, and that includes another semiconductor pillar being different from the semiconductor pillar and extending in the perpendicular direction with respect to the substrate, another gate insulating layer being different from the gate insulating layer and surrounding an outer periphery of the other semiconductor pillar, another gate conductor layer being different from the gate conductor layer and surrounding the other gate insulating layer, and a third impurity region and a fourth impurity region formed within the other semiconductor pillar so as to be separated from each other,
a first wiring conductor layer, a second wiring conductor layer, and a third wiring conductor layer that are individually connected to different regions selected from the gate conductor layer, the other gate conductor layer, the first impurity region, the second impurity region, the third impurity region, and the fourth impurity region, that extend in a horizontal direction along the substrate, that at least partially overlap in plan view, and that are disposed in ascending order;
a step of forming a second contact hole extending from an upper surface of the second material layer to an upper surface or inside of the first wiring conductor layer, and extending through the third wiring conductor layer and the second wiring conductor layer;
a step of forming a first tubular insulating layer on a side surface of the second wiring conductor layer exposed at the second contact hole;
a step of filling the second contact hole to form a second conductive material layer having conductivity; and
a step of exposing a side surface of an upper portion of the second conductive material layer,
wherein the step of forming the first material layer includes a step of forming a third material layer so as to surround the side surface of the upper portion of the second conductive material layer,
the step of forming the second material layer includes a step of forming a fourth material layer so as to surround the third material layer, and further includes a step of etching the third material layer through the fourth material layer serving as an etching mask to form a third contact hole within the fourth material layer, and a step of forming a third conductive material layer having conductivity within the third contact hole.

4. The method for producing a pillar-shaped semiconductor device according to claim 3, further comprising a step of processing the first conductive material layer, the second conductive material layer, and the third conductive material layer so as to have top portions having surfaces flush with one another.

5. The method for producing a pillar-shaped semiconductor device according to claim 4, further comprising:
a step of depositing a wiring material layer on the second material layer, the step being carried out after the step of processing the first conductive material layer, the second conductive material layer, and the third conductive material layer so as to have top portions having surfaces flush with one another, and
a step of carrying out a lithographic process and etching to form, on the second material layer, one or both of a fourth wiring conductor layer connecting from the wiring material layer to the first conductive material layer, and a fifth wiring conductor layer connecting from the wiring material layer to the third conductive material layer,
wherein, in the etching, the fourth wiring conductor layer and the fifth wiring conductor layer are etched faster than the first conductive material layer, the second conductive material layer, and the third conductive material layer.

6. The method for producing a pillar-shaped semiconductor device according to claim 3, wherein the step of forming the first conductive material layer and the step of forming the third conductive material layer are carried out such that a conductor material is filled into the first contact hole and the third contact hole and deposited on the second material layer, and, subsequently, a lithographic process and etching are carried out to form, on the second material layer, one or both of a first wiring conductor layer connecting from the conductor material to the first conductive material layer, and a second wiring conductor layer connecting from the conductor material to the third conductive material layer.

7. The method for producing a pillar-shaped semiconductor device according to claim 2, further comprising:
a step of forming a fourth contact hole that is positioned, in plan view, not at the first contact hole, that reaches a wiring conductor layer connected to the gate conductor layer, or the first impurity region, or the second impurity region and extending in a horizontal direction, and that extends downward beyond a surface of the second material layer;
a step of filling a fourth conductive material layer into the fourth contact hole; and
a step of processing the first conductive material layer and the fourth conductive material layer so as to have top portions having surfaces flush with each other.

8. The method for producing a pillar-shaped semiconductor device according to claim 1, wherein the first conductive material layer at least includes a metal atom and a semiconductor atom, and
the method further comprises a step of carrying out heat treatment to diffuse the metal atom of the first conductive material layer into the upper portion of the semiconductor pillar, to form an alloy layer within the upper portion of the semiconductor pillar.

9. The method for producing a pillar-shaped semiconductor device according to claim 1, wherein the first conductive material layer contains the acceptor or donor impurity, and
in the step of forming the first impurity region, heat treatment is carried out to diffuse the acceptor or donor impurity into the outer peripheral portion or the entire inner portion of the upper portion of the semiconductor pillar, to form the first impurity region.

10. The method for producing a pillar-shaped semiconductor device according to claim 1, wherein the first material layer is formed so as to surround, with a constant width in plan view, the upper portion of the semiconductor pillar.

11. The method for producing a pillar-shaped semiconductor device according to claim 1, wherein the first conductive material layer is formed by a semiconductor layer containing a donor or acceptor impurity.

12. The method for producing a pillar-shaped semiconductor device according to claim 11, wherein the semiconductor layer is formed by a selective epitaxial crystal growth method so as to fill the first contact hole, and have a top portion positioned above an upper surface of the semiconductor pillar.

* * * * *